United States Patent
Yamazaki et al.

(10) Patent No.: US 6,960,787 B2
(45) Date of Patent: Nov. 1, 2005

(54) SEMICONDUCTOR DEVICE AND METHOD FOR MANUFACTURING THE SAME

(75) Inventors: Shunpei Yamazaki, Setagaya (JP); Jun Koyama, Sagamihara (JP); Setsuo Nakajima, Atsugi (JP); Naoya Sakamoto, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 76 days.

(21) Appl. No.: 10/631,762

(22) Filed: Aug. 1, 2003

(65) Prior Publication Data

US 2004/0080481 A1 Apr. 29, 2004

Related U.S. Application Data

(62) Division of application No. 10/229,089, filed on Aug. 28, 2002, now Pat. No. 6,603,453, which is a division of application No. 09/330,024, filed on Jun. 11, 1999, now Pat. No. 6,462,723.

(30) Foreign Application Priority Data

| Jun. 12, 1998 | (JP) | 10-181457 |
| Oct. 23, 1998 | (JP) | 10-303065 |
| Mar. 23, 1999 | (JP) | 11-077791 |
| Apr. 13, 1999 | (JP) | 11-104759 |

(51) Int. Cl.[7] .............................................. H01L 29/04
(52) U.S. Cl. ..................... 257/59; 257/347; 257/348; 438/149; 438/479; 438/517; 345/92; 345/93; 345/94; 345/95; 345/96; 345/97; 345/98
(58) Field of Search ......................... 257/59, 347, 348; 438/149, 479, 517; 345/92–98

(56) References Cited

U.S. PATENT DOCUMENTS

| 4,591,848 | A | * | 5/1986 | Morozumi et al. ........... 345/3.1 |
| 5,132,819 | A | * | 7/1992 | Noriyama et al. ............ 349/55 |
| 5,457,474 | A | * | 10/1995 | Ikeda .......................... 345/92 |
| 5,644,147 | A | | 7/1997 | Yamazaki et al. |
| 5,807,772 | A | | 9/1998 | Takemura |
| 5,818,070 | A | | 10/1998 | Yamazaki et al. |
| 5,834,797 | A | * | 11/1998 | Yamanaka .................. 257/57 |
| 5,917,221 | A | | 6/1999 | Takemura |
| 5,956,011 | A | | 9/1999 | Koyama et al. |
| 6,037,924 | A | | 3/2000 | Koyama et al. |
| 6,081,131 | A | | 6/2000 | Ishii |
| 6,150,283 | A | | 11/2000 | Ishiguro |
| 6,197,624 | B1 | | 3/2001 | Yamazaki |
| 6,198,133 | B1 | | 3/2001 | Yamazaki et al. |
| 6,392,628 | B1 | | 5/2002 | Yamazaki et al. |
| 6,462,723 | B1 | | 10/2002 | Yamazaki et al. |
| 6,512,271 | B1 | | 1/2003 | Yamazaki et al. |
| 6,603,453 | B2 | * | 8/2003 | Yamazaki et al. ............ 345/92 |
| 6,608,613 | B2 | * | 8/2003 | Koyama et al. ............. 345/98 |

* cited by examiner

*Primary Examiner*—Allan R. Wilson
*Assistant Examiner*—Edgardo Ortiz
(74) *Attorney, Agent, or Firm*—Eric J. Robinson; Robinson Intellectual Property Law Office, P.C.

(57) ABSTRACT

There is provided a semiconductor device having TFTs whose thresholds can be controlled.

There is provided a semiconductor device including a plurality of TFTs having a back gate electrode, a first gate insulation film, a semiconductor active layer a second gate insulation film and a gate electrode, which are formed on a substrate, wherein an arbitrary voltage is applied to the back gate electrode.

42 Claims, 44 Drawing Sheets

FIRST LAYER INSULATION FILM 346
347, 348, 349, 350, 351

SECOND LAYER INSULATION FILM 352
PIXEL ELECTRODE 353

SUBSTRATE 355
ALIGNMENT FILM 354
COUNTER ELECTRODE 356
ALIGNMENT FILM 357
LIQUID CRYSTAL 358

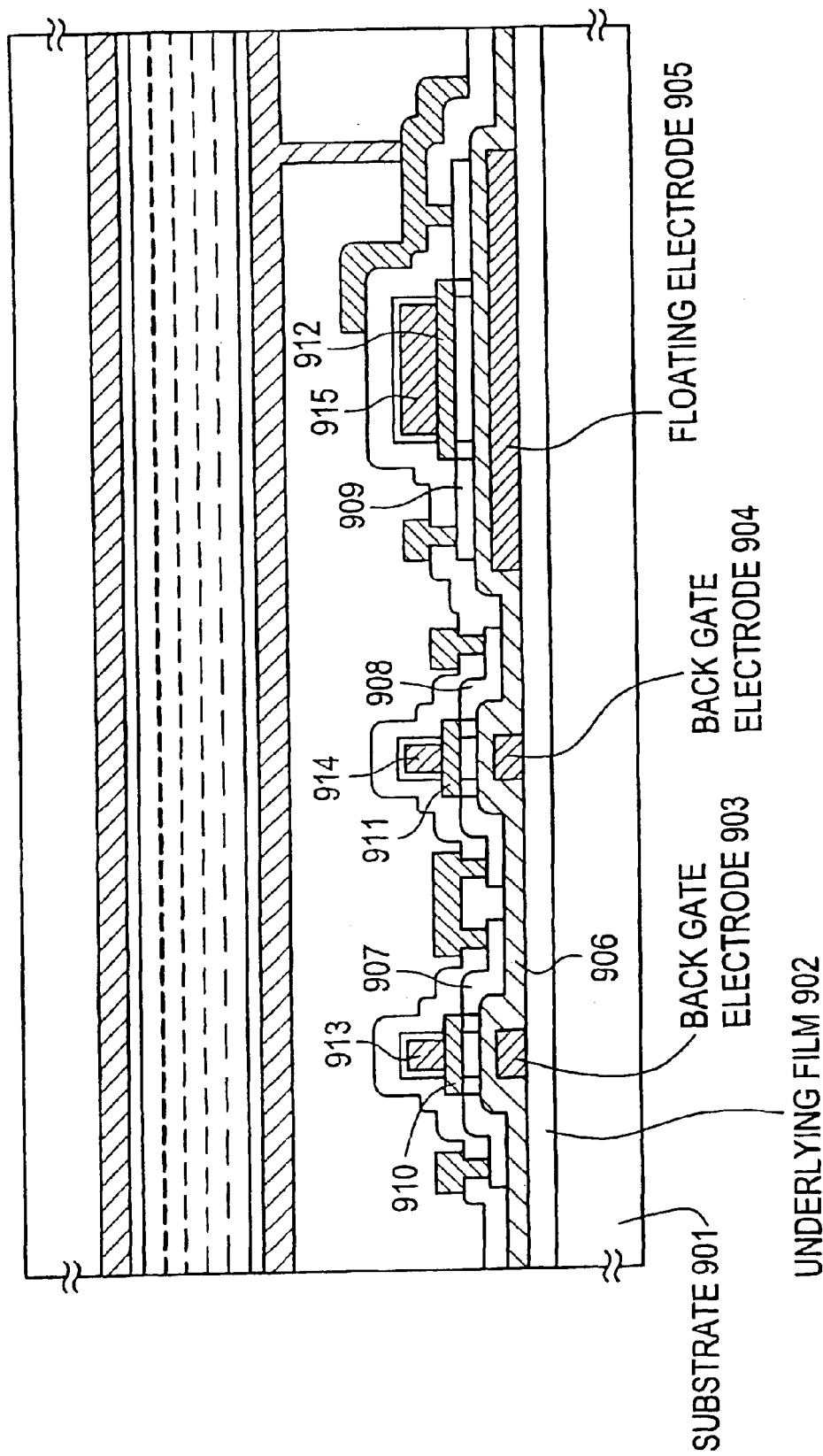

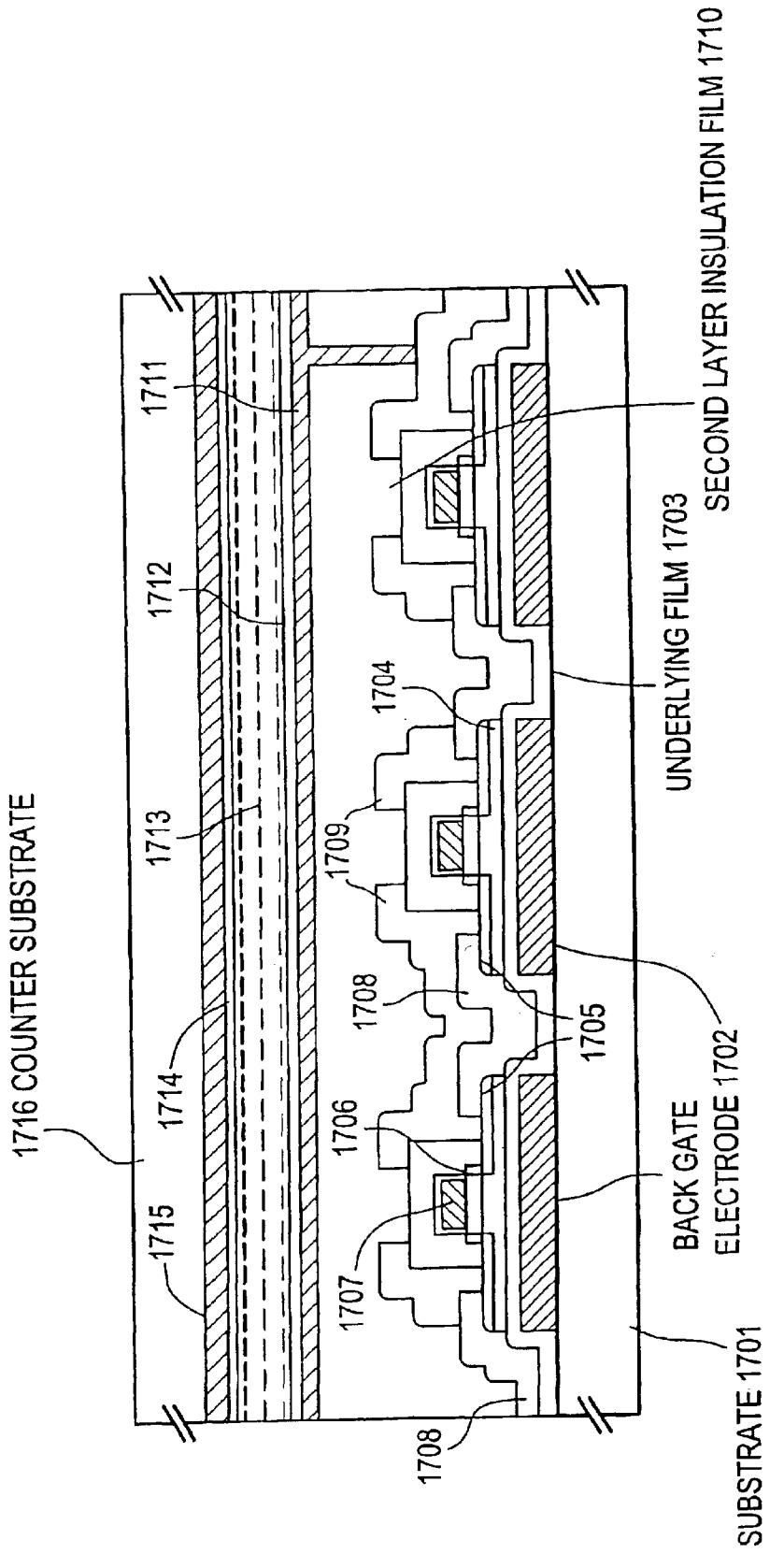

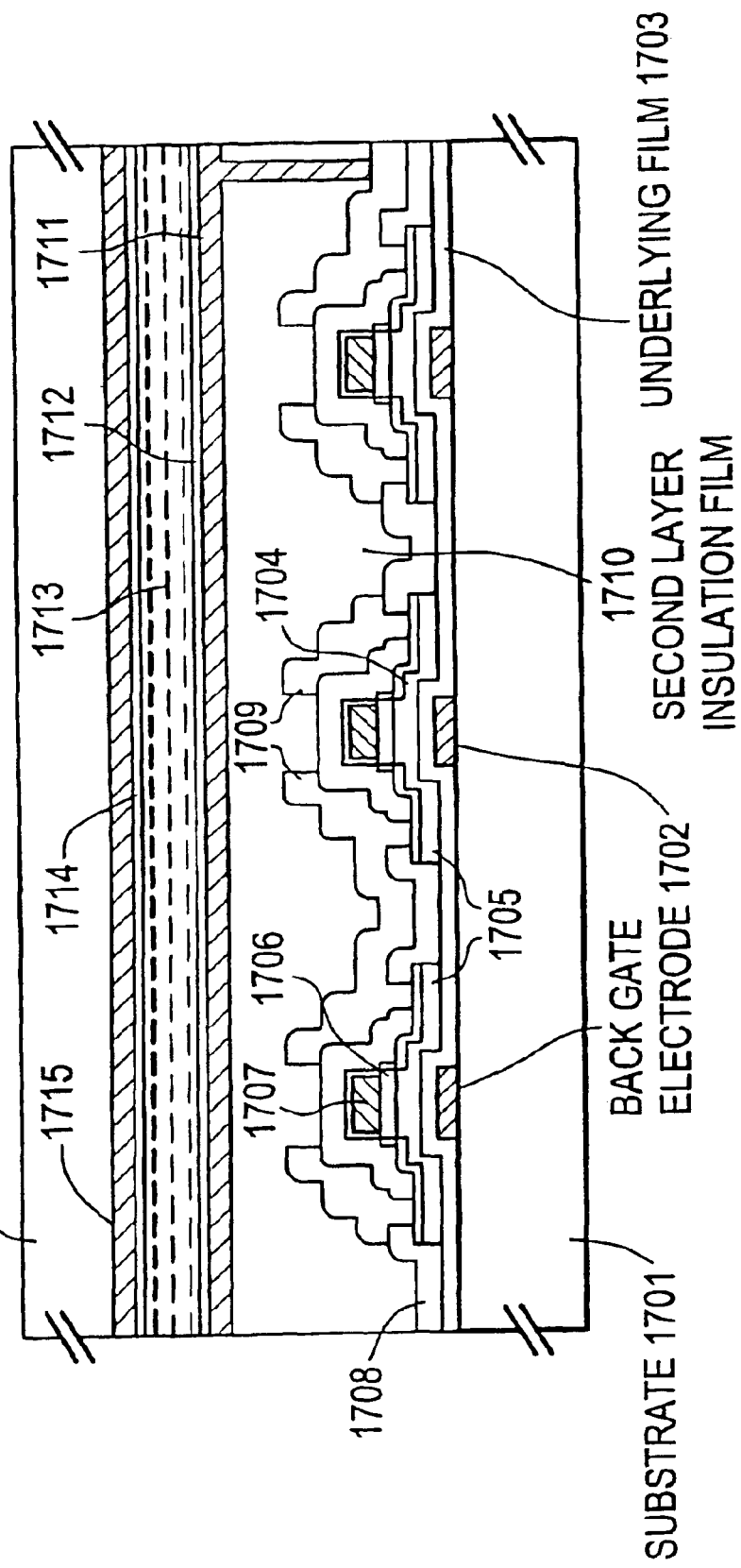

FIG. 19
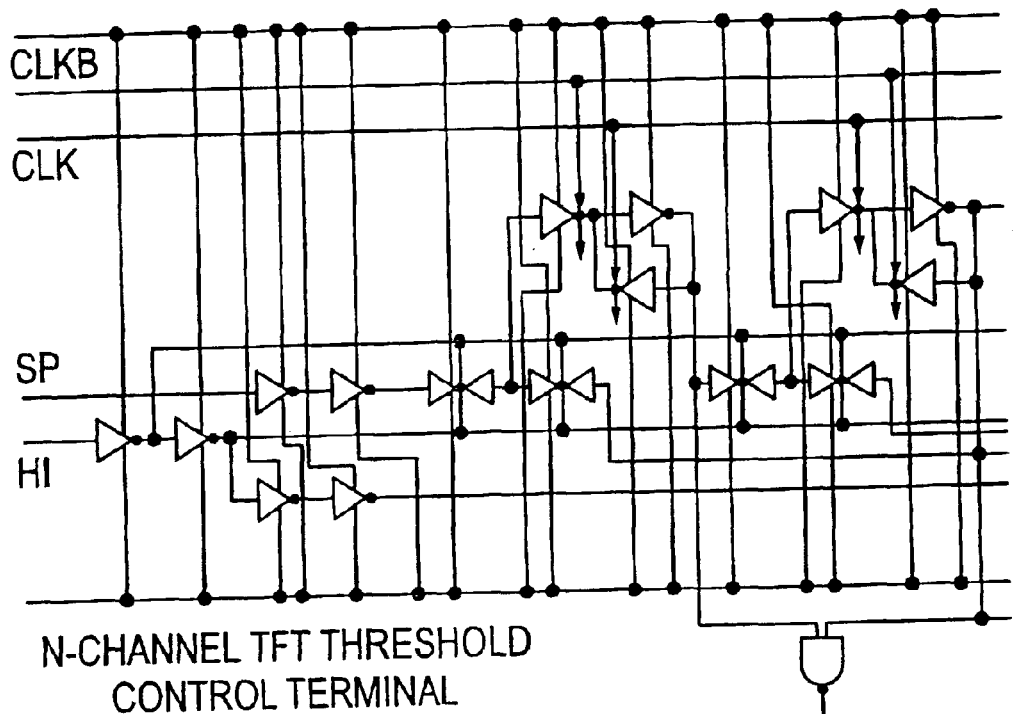
CLK   CLOCK SIGNAL
CLKB  INVERSION CLOCK SIGNAL
SP    START PULSE
HI    HI SIGNAL
 INVERTER
 CLOCKED INVERTER
 ANALOG SWITCH
 NAND CIRCUIT
ACTIVE MATRIX CIRCUIT

CLK CLOCK SIGNAL
CLKB INVERSION CLOCK SIGNAL
SP START PULSE
HI HI SIGNAL

—▷— INVERTER

—▷|— CLOCKED INVERTER

▷◁ ANALOG SWITCH

=D— NAND CIRCUIT

↓ ACTIVE MATRIX CIRCUIT

2101 P-CHANNEL TFT THRESHOLD CONTROL TERMINAL
2102 N-CHANNEL TFT THRESHOLD CONTROL TERMINAL

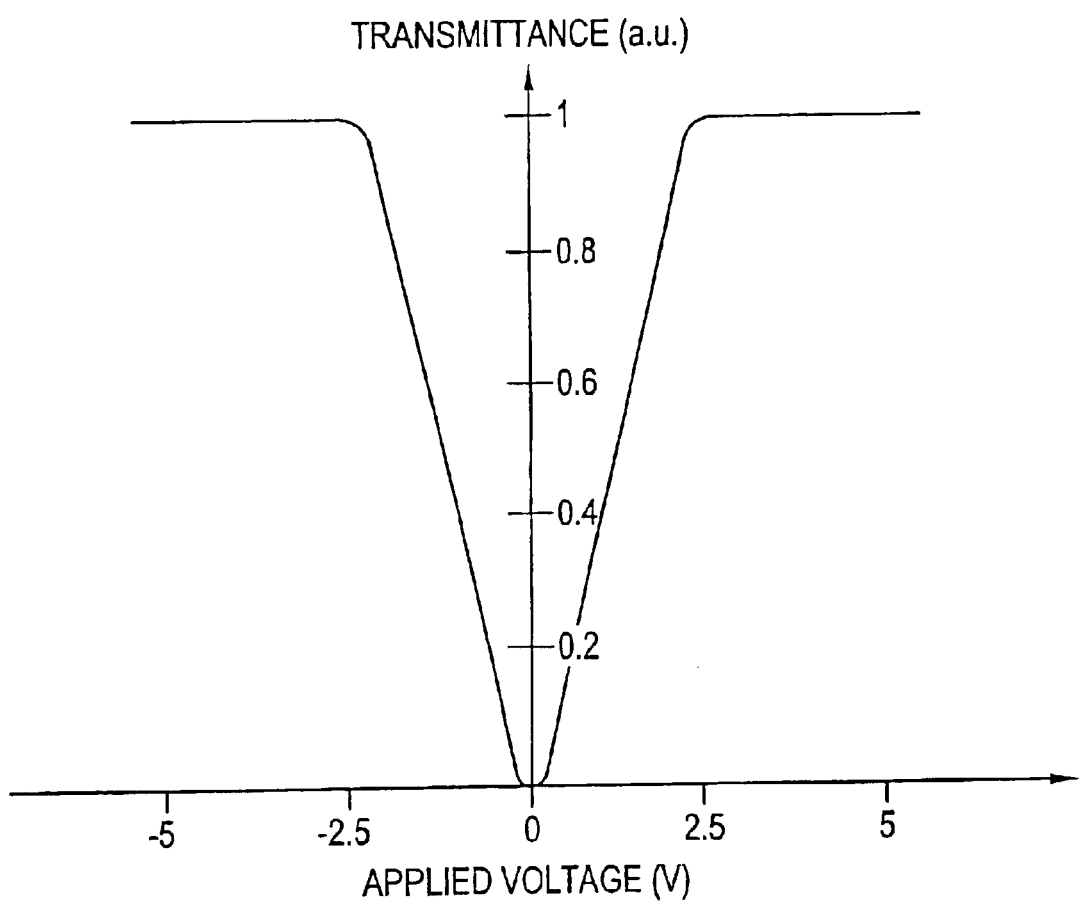

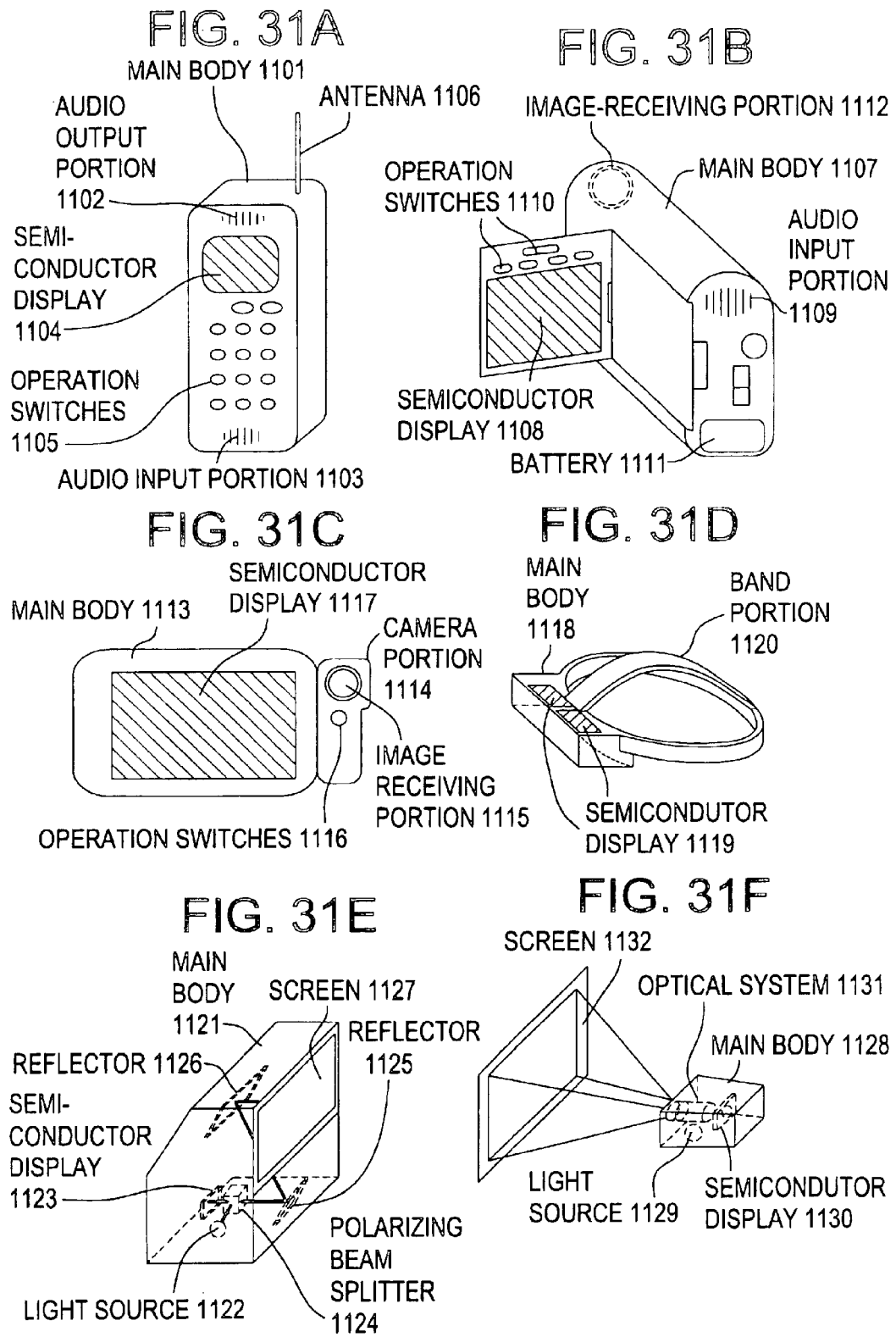

MAIN BODY 1133
ARM PORTION 1135
DISPLAY 1134

STORAGE MEDIUM 1139
ANTENNA 1141
DISPLAY 1137
DISPLAY 1138
OPERATION SWITCHES 1140
MAIN BODY 1136

MAIN BODY 1142
IMAGE INPUT PORTION 1143
DISPLAY 1144
KEYBOARD 1145

DISPLAY 1147
MAIN BODY 1146
SPEAKER PORTION 1148
RECORDING MEDIUM 1149
OPERATION SWITCHES 1150

MAIN BODY 1151
EYE-PIECE 1153
OPERATION SWITCHES 1154
DISPLAY 1152

(a)

(b)

5nm

5nm

20nm

20nm

2μm

2μm

<Point 1>

50 nm

<Point 1>

5 nm

<Point 1>

<Point 2>

50 nm

<Point 2>

5 nm

<Point 2>

<Point 3>

50 nm

<Point 3>

5 nm

<Point 3>

SEMICONDUCTOR DEVICE AND METHOD FOR MANUFACTURING THE SAME

This application is a DIV of Ser. No. 10/229,089 Aug. 28, 2002 U.S. Pat. No. 6,603,453 which is a DIV of Ser. No. 09/330,024 Jun. 11, 1999 U.S. Pat. No. 6,462,723

BACKGROUND OF THE INVENTION

1. Field of the Invention

The present invention relates to a semiconductor device having thin film transistors (TFTS) fabricated on an insulated substrate. It also relates to a semiconductor device having thin film transistors. Particularly, the present invention relates to an active matrix type semiconductor display. It also relates to a driving circuit of an active matrix semiconductor display.

2. Description of the Related Art

Techniques for fabricating thin film transistors (TFTs) by forming a semiconductor thin film on an inexpensive glass substrate have recently been under rapid development. The reason is increasing demands for active matrix liquid crystal displays (liquid crystal panels).

On an active matrix liquid crystal panel, a pixel TFT is provided in each of pixel regions in a large quantity in the range from several hundreds of thousands to several millions provided in the form of a matrix as shown in FIG. 33 (such a circuit is referred to as "active matrix circuit"). A switching element is provided for each pixel, and pixel information is controlled by turning the switching elements on and off. Liquid crystal is of used as a display medium of such a display. Particularly, elements having three terminals, i.e., thin film transistors (TFTs) having a gate, a source and a drain are used as the switching elements.

An active matrix circuit comprises thin film transistors made of amorphous silicon or polysilicon formed on a glass substrate.

Active matrix liquid crystal displays have recently been provided in which a quartz substrate is used and thin film transistors are formed by a polycrystalline silicon film. In this case, peripheral driving circuits for driving pixel TFTs can be also formed on the same substrate on which the active matrix circuit is formed.

A technique is also known which utilize processes such as laser annealing to fabricate thin film transistors on a glass substrate using a polycrystalline silicon film. The use of this technique allows the integration of an active matrix circuit and peripheral driving circuits on a glass substrate.

In the context of the present invention, a row of a matrix is associated with a thin film transistor whose gate electrode is connected to a scan line (gate line) provided in parallel with the row, and a column is associated with a thin film transistor whose source (or drain) electrode is connected to a signal line (source line) provided in parallel with the column. A circuit for driving scan lines is referred to as "scan line driving circuit", and a circuit for driving signal lines is referred to as "scan line driving circuit". A thin film transistor is referred to as "TFT".

A back gate electrode is a pair of electrodes which are formed on a bottom side of a thin film transistor having a top gate type structure, i.e., formed toward the substrate and which are alternatively formed on a top side in case of a thin film transistor having a bottom gate type structure.

FIGS. 34A and 34B show a first example of conventional active matrix liquid crystal displays. In the active matrix liquid crystal display in this example, the thin film transistors made of amorphous silicon are used; the scan line driving circuit and signal line driving circuit are formed by integrated circuits 501 and 503 made of single crystal; and 502 represents an active matrix circuit which is mounted to the periphery of a glass substrate using tabs. (FIG. 34A) or mounted using the COG (chip on glass) technique (FIG. 34B).

Such a liquid crystal display has had problems as described below. One problem has been the fact that problems with reliability can occur because the signal lines and scan lines of the active matrix are connected via tabs or bonding wires. For example, in the case VGA (video graphics array) type liquid crystal displays, there are 1920 signal lines and 480 scan lines, and those numbers of lines tend to increase as resolution is improved.

To fabricate a view finer used in a video camera or a projector utilizing liquid crystal, the display must be made compact, and a liquid crystal display with tabs has been disadvantageous from the viewpoint of space.

In order to solve those problems, active matrix liquid crystal displays have been developed in which the thin film transistors are formed from polysilicon. An example is shown in FIGS. 35A and 35B. As shown in FIG. 35A, a signal line driving circuit 401 and a scan line driving circuit 402 are formed on a glass substrate using polysilicon thin film transistors along with pixel thin film transistors to form an active matrix circuit. The formation of the polysilicon thin film transistors involves a high temperature polysilicon process in which processing is performed at 1000° C. or more on a quartz substrate to form the elements thereon or a low temperature polysilicon process in which processing is performed at 600° C. or less on a glass substrate to form the elements thereon.

The mobility of a polysilicon thin film transistor can be 30 $cm^2$/Vsec. or more which enables an operation on a signal on the order of a few MHz, whereas the mobility of an amorphous thin film transistor is on the order of 0.5 $cm^2$/Vsec.

There are digital type and analog type driving circuits for driving active matrix liquid crystal displays. The analog type is commonly used in a driving circuit utilizing polysilicon because the digital type includes a significantly greater number of circuit elements than those in the analog type. Circuit configurations utilizing a shift register are commonly used for scan line driving circuits and signal line driving circuits (See FIG. 35B). In FIG. 35B, DFF represents a delay flip-flop which operates in synchronism with a pulse applied to a clock terminal. When a start pulse HI is input to the DFF at the first stage, it outputs HI in synchronism with the clock, and the output is transferred to the second, third, - - - , N-th stages, which results in an operation of a shift register having N stages.

Recently, active matrix liquid crystal displays are widely used in notebook type personal computers. A personal computer requires a multiple tone liquid crystal display when a plurality of programs are activated simultaneously and when images from a digital camera are imported and processed therein.

Further, the recent spread of personal digital assistants, mobile computers, car navigation systems and the like has resulted in a need for compact active matrix liquid crystal displays with high fineness, resolution and image quality.

Compact projectors with high fineness, resolution and image quality utilizing an active matrix liquid crystal display are also attracting attention.

Obviously, TFTs forming a part of an active matrix liquid crystal display used for applications as described above must have high performance. When a TFT is discussed from the aspect of performance, reference is made to the mobility, threshold voltage and the like. Especially, there are considerably severe performance requirements on a threshold voltage. That is, a shift of a threshold voltage can result in malfunction of a driving circuit and pixel electrodes, which often makes it impossible to obtain a preferable image.

A conventional liquid crystal display as described above has had the following problems. It has been generally difficult to control the threshold voltage of a thin film transistor utilizing polysilicon when compared to a single crystal transistor, and this has sometimes put a transistor intended for the enhancement mode in the depression mode in which a current flows to the drain even when the gate-source voltage is 0. The reasons for this include the fact that it is less uniform compared to single crystal, the fact that a thermal oxide film can not be used as a gate oxide film in the case of low temperature polysilicon utilizing an inexpensive glass substrate because of the low heat-resisting properties of the glass substrate, and contamination with impurities from a glass substrate and fixed charges of an underlying film or the like formed to prevent contamination.

FIGS. 36A and 36B show gate voltage-drain current characteristics (Vg-Id curve) of a TFT. Let us assume that the thin film transistor which must have the characteristics shown in FIG. 36A actually has the characteristics shown in FIG. 36B because of a shift of the threshold. Then, no current flows in the inverter circuit shown in FIG. 37 when the input at the first stage is in a high state, whereas a current flows from the power supply to GND when the input is in a low state. At the next stage, a current conversely flows when the input is in the high state. When driving circuits of an active matrix liquid crystal display are provided as thin film transistors incorporated in a substrate, the stages at the signal side and scan side total at 2400 in the case of a VGA. This results in a high total current, although the current of each individual thin film is low. A significant problem has thus arisen from the viewpoint of reduction of power consumption of a display.

When the thin film transistors have an excessively great threshold voltage, the on current of the same becomes small, which has resulted in a problem in that the operating frequency of the driving circuits is decreased. Since load capacitance is driven by the on current of the thin film transistors, the operating frequency of the driving circuits is determined by the magnitude of the on current when the load capacitance and the power supply voltage are constant. Therefore, an excessively great threshold has resulted in a reduction of the operating frequency. Further, the trend toward more compact displays has resulted in a need for reduction of the size of driving circuits (reduction of the size of thin film transistors).

The present invention has been conceived taking the above-described problems with the prior art, and it is an object of the invention to control the threshold of thin film transistors by applying a voltage to the back gate electrodes, thereby reducing the power consumption of driving circuits and improving the operating frequency of the driving circuits. It is another object to reduce the size of thin film transistors by extracting a high current.

SUMMARY OF THE INVENTION

In one aspect of the present invention, there is provided an active matrix semiconductor display characterized in that it comprises:

an active matrix circuit constituted by a plurality of pixel thin film transistors provided in the form of a matrix;

a signal line driving circuit constituted by a plurality of thin film transistors;

a scan line driving circuit constituted by a plurality of thin film transistors; and a threshold control circuit for controlling thresholds of the plurality of thin film transistors provided on the same substrate.

In another aspect of the invention, there is provided an active matrix semiconductor display characterized in that it comprises:

an active matrix circuit constituted by a plurality of pixel thin film transistors provided in the form of a matrix;

a signal line driving circuit constituted by a plurality of thin film transistors;

a scan line driving circuit constituted by a plurality of thin film transistors; and a threshold control circuit for controlling thresholds of the plurality of thin film transistors and in that the plurality of thin film transistors comprise a control terminal for controlling the threshold, and the threshold control circuit applies an arbitrary voltage to the control terminal.

There is provided an active matrix semiconductor display as described above characterized in that the threshold control circuit comprises a variable resistor which is adjusted to apply the arbitrary voltage to the control terminal.

There is provided an active matrix semiconductor display as described above characterized in that the threshold control circuit comprises the thin film transistors, a load for converting a current through the thin film transistors into a voltage and an amplifier for amplifying the voltage generated at the load and in that the output of the amplifier is negatively fed back to the thin film transistors and is output to the threshold control terminal.

There is provided an active matrix semiconductor display as described above characterized in that the plurality of pixel thin film transistors and the plurality of thin film transistors comprise an n-channel thin film transistor and in that a voltage higher than a ground potential is applied to the threshold control terminal of the n-channel thin film transistor.

There is provided an active matrix semiconductor display as described above characterized in that the plurality of pixel thin film transistors and the plurality of thin film transistors comprise an n-channel thin film transistor and in that a voltage lower than the ground potential is applied to the threshold control terminal of the n-channel thin film transistor.

There is provided an active matrix semiconductor display as described above characterized in that the plurality of pixel thin film transistors and the plurality of thin film transistors comprise a p-channel thin film transistor and in that a voltage higher than a power supply potential is applied to the threshold control terminal of the p-channel thin film transistor.

There is provided an active matrix semiconductor display as described above characterized in that the plurality of pixel thin film transistors and the plurality of thin film transistors comprise a p-channel thin film transistor and in that a voltage lower than the power supply potential is applied to the threshold control terminal of the p-channel thin film transistor.

In another aspect of the present invention, there is provided an active matrix semiconductor display characterized in that it comprises:

an active matrix circuit constituted by a plurality of pixel thin film transistors provided in the form of a matrix;

a signal line driving circuit constituted by a plurality of first thin film transistors;

a scan line, driving circuit constituted by a plurality of second thin film transistors; and a threshold control circuit for controlling thresholds of the plurality of pixel thin film transistors, the plurality of first thin film transistors and the plurality of second thin film transistors provided on the same substrate.

In another aspect of the invention, there is provided an active matrix semiconductor display characterized in that it comprises:

an active matrix circuit constituted by a plurality of pixel thin film transistors provided in the form of a matrix;

a signal line driving circuit constituted by a plurality of first thin film transistors;

a scan line driving circuit constituted by a plurality of second thin film transistors; and a threshold control circuit for controlling thresholds of the plurality of pixel thin film transistors, the plurality of first thin film transistors and the plurality of second thin film transistors and in that each of the plurality of first thin film transistors and the plurality of second thin film transistors comprises a control terminal for controlling the threshold, and the threshold control circuit applies an arbitrary voltage to the control terminal.

There is provided an active matrix semiconductor display as described above characterized in that the threshold control circuit controls each of the plurality of first thin film transistors and the plurality of second thin film transistors independently.

There is provided an active matrix semiconductor display as described above characterized in that the threshold control circuit controls the plurality of first thin film transistors and the plurality of second thin film transistors commonly.

There is provided an active matrix semiconductor display as described above characterized in that the plurality of thin film transistors comprise a back gate electrode as the threshold control terminal opposite to the gate electrode thereof and in that an arbitrary voltage is applied to the back gate electrode.

There is provided an active matrix semiconductor display as described above characterized in that the plurality of first thin film transistors and the plurality of second thin film transistors comprise a back gate electrode as the threshold control terminal opposite to the gate electrode thereof and in that an arbitrary voltage is applied to the back gate electrode.

In another aspect of the invention, there is provided an inverter circuit comprising:

a first p-channel thin film transistor having a back gate electrode;

a second p-channel thin film transistor having a back gate electrode; and a first n-channel thin film transistor having a back gate electrode, wherein a relationship expressed by $V_{thP1} > V_{thP2}$ exists between a threshold voltage $V_{thP1}$ at the time of application of a back gate voltage to the back gate electrode of the first p-channel thin film transistor and a threshold voltage $V_{thP2}$ at the time of application of a back gate voltage to the back gate electrode of the second p-channel thin film transistor.

In another aspect of the invention, there is provided an inverter circuit comprising:

a first p-channel thin film transistor having a back gate electrode;

a second p-channel thin film transistor having a back gate electrode;

a first n-channel thin film transistor having a back gate electrode; and a second n-channel thin film transistor having a back gate electrode, wherein relationships expressed by $|V_{thP1} > V_{thP2}|$ and $|V_{thN1} < V_{thN2}|$ exist between a threshold voltage $V_{thP1}$ at the time of application of a back gate voltage to the back gate electrode of the first p-channel thin film transistor, a threshold voltage $V_{thP2}$ at the time of application of a back gate voltage to the back gate electrode of the second p-channel thin film transistor, a threshold voltage $V_{thN1}$ at the time of application of a back gate voltage to the back gate electrode of the first n-channel thin film transistor and a threshold voltage $V_{thN2}$ at the time of application of a back gate voltage to the back gate electrode of the second n-channel thin film transistor.

In another aspect of the invention, there is provided an inverter circuit as described above characterized in that the first p-channel thin film transistor, the second p-channel thin film transistor and the first n-channel thin film transistor form complementary transistors; the first n-channel thin film transistor comprises a first control terminal; each of the first p-channel thin film transistor and the second p-channel thin film transistor comprises a second control terminal; and the threshold control circuit applies an arbitrary voltage to each of the first control terminal and the second control terminal.

In another aspect of the invention, there is provided an inverter circuit as described above characterized in that the first p-channel thin film transistor, the second p-channel thin film transistor, the first n-channel thin film transistor and the second n-channel thin film transistor form complementary transistors; each of the first n-channel thin film transistor and the second n-channel transistor comprises a first control terminal; each of the first p-channel thin film transistor and the second p-channel thin film transistor comprises a second control terminal; and the threshold control circuit applies an arbitrary voltage to each of the first control terminal and the second control terminal.

In another aspect of the invention, there is provided an active matrix semiconductor display characterized in that it comprises:

an active matrix circuit constituted by a plurality of pixel thin film transistors provided in the form of a matrix;

a signal line driving circuit constituted by a plurality of thin film transistors;

a scan line driving circuit constituted by a plurality of thin film transistors; and a threshold control circuit for controlling thresholds of the plurality of thin film transistors and in that each of the plurality of pixel thin film transistors comprises a gate electrode and a back gate electrode; the gate electrode and the back gate electrode are connected to each other; the plurality of thin film transistors comprises a gate electrode and a back gate electrode; and the gate electrode and the back gate electrode are connected to each other.

There is provided an active matrix semiconductor display as described above characterized in that the same scan line signal is applied to the gate electrode and the back gate electrode of each of the plurality of pixel thin film transistors.

There is provided an active matrix semiconductor display as described above characterized in that a scan line signal having the same polarity and a different amplitude is applied to the gate electrode and the back gate electrode of each of the plurality of pixel thin film transistors.

There is provided an active matrix semiconductor display as described above characterized in that the signal line driving circuit comprises an analog switch formed by a part of the plurality of thin film transistors and in that the same signal is applied to the gate electrode and the back gate electrode of each of the thin film transistors forming the analog switch.

There is provided an active matrix semiconductor display as described above characterized in that the signal line driving circuit comprises an analog switch formed by a part of the plurality of thin film transistors and in that a signal having the same polarity and a different amplitude is applied to the gate electrode and the back gate electrode of each of the thin film transistors forming the analog switch.

In another aspect of the invention, there is provided a driving circuit for an active matrix semiconductor display, characterized in that it comprises:

a signal line driving circuit constituted by a plurality of thin film transistors;

a scan line driving circuit constituted by a plurality of thin film transistors; and a threshold control circuit for controlling thresholds of the plurality of thin film transistors provided on the same substrate.

In another aspect of the invention, there is provided a driving circuit for an active matrix semiconductor display, characterized in that it comprises:

a signal line driving circuit constituted by a plurality of thin film transistors;

a scan line driving circuit constituted by a plurality of thin film transistors; and a threshold control circuit for controlling thresholds of the plurality of thin film transistors provided on the same substrate and in that the plurality of thin film transistors comprise a control terminal for controlling the threshold, and the threshold control circuit applies an arbitrary voltage to the control terminal.

There is provided a driving circuit for an active matrix semiconductor display as described above, characterized in that the plurality of thin film transistors comprise an n-channel thin film transistor and in that a voltage higher than a ground potential is applied to the threshold control terminal of the n-channel thin film transistor.

There is provided a driving circuit for an active matrix semiconductor display as described above, characterized in that the plurality of thin film transistors comprise an n-channel thin film transistor and in that a voltage lower than the ground potential is applied to the threshold control terminal of the n-channel thin film transistor.

There is provided a driving circuit for an active matrix semiconductor display as described above, characterized in that the plurality of thin film transistors comprise a p-channel thin film transistor and in that a voltage higher than a power supply potential is applied to the threshold control terminal of the p-channel thin film transistor.

There is provided a driving circuit for an active matrix semiconductor display as described above, characterized in that the plurality of thin film transistors comprise a p-channel thin film transistor and in that a voltage lower than the power supply potential is applied to the threshold control terminal of the p-channel thin film transistor.

There is provided a driving circuit for an active matrix semiconductor display as described above, characterized in that the threshold control circuit comprises the thin film transistors, a load for converting a current through the thin film transistors into a voltage and an amplifier for amplifying the voltage generated at the load and in that the output of the amplifier is negatively fed back to the thin film transistors and is output to the threshold control terminal.

There is provided a driving circuit for an active matrix semiconductor display as described above, characterized in that the threshold control circuit comprises the thin film transistors, a load for converting a current through the thin film transistors into a voltage and an amplifier for amplifying the voltage generated at the load to apply it to the driving circuit and to negatively feed back it to the control terminal of the thin film transistors.

In another aspect of the present invention, there is provided a driving circuit for an active matrix semiconductor display, characterized in that it comprises:

a signal line driving circuit constituted by a plurality of first thin film transistors;

a scan line driving circuit constituted by a plurality of second thin film transistors; and a threshold control circuit for controlling thresholds of the plurality of first thin film transistors and the plurality of second thin film transistors provided on the same substrate.

In another aspect of the invention, there is provided a driving circuit for an active matrix semiconductor display, characterized in that it comprises:

a signal line driving circuit constituted by a plurality of first thin film transistors;

a scan line driving circuit constituted by a plurality of second thin film transistors; and a threshold control circuit for controlling thresholds of the plurality of first thin film transistors and the plurality of second thin film transistors and in that the plurality of thin film transistors comprise a control terminal for controlling the threshold, and the threshold control circuit applies an arbitrary voltage to the control terminal.

There is provided a driving circuit for an active matrix semiconductor display as described above, characterized in that the threshold control circuit controls each of the plurality of first thin film transistors and the plurality of second thin film transistors independently.

There is provided a driving circuit for an active matrix semiconductor display as described above characterized in that the threshold control circuit controls the plurality of first thin film transistors and the plurality of second thin film transistors commonly.

There is provided a driving circuit for an active matrix semiconductor display as described above, characterized in that the plurality of thin film transistors comprise a back gate electrode as the threshold control terminal opposite to the gate electrode thereof and in that an arbitrary voltage is applied to the back gate electrode.

There is provided a driving circuit for an active matrix semiconductor display as described above, characterized in that the plurality of first thin film transistors and the plurality of second thin film transistors comprise a back gate electrode as the threshold control circuit opposite to the gate electrode thereof and in that an arbitrary voltage is applied to the back gate electrode.

In another aspect of the invention, there is provided a driving circuit for an active matrix semiconductor display characterized in that it comprises:

a signal line driving circuit constituted by a plurality of thin film transistors;

a scan line driving circuit constituted by a plurality of thin film transistors; and a threshold control circuit for controlling thresholds of the plurality of thin film transistors and in that each of the plurality of pixel thin film transistors comprises a gate electrode and a back gate electrode; the gate electrode and the back gate electrode are connected to each other; the plurality of thin film transistors comprises a gate electrode and a back gate electrode; and the gate electrode and the back gate electrode are connected to each other.

There is provided a driving circuit for an active matrix semiconductor display as described above, characterized in that the signal line driving circuit comprises an analog switch formed by a part of the plurality of thin film transistors and in that the same signal is applied to the gate electrode and the back gate electrode of each of the thin film transistors forming the analog switch.

There is provided a driving circuit for an active matrix semiconductor display as described above, characterized in that the signal line driving circuit comprises an analog switch formed by a part of the plurality of thin film transistors and in that a signal having the same polarity and a different amplitude is applied to the gate electrode and the back gate electrode of each of the thin film transistors forming the analog switch.

In another aspect of the invention, there is provided a semiconductor device comprising a plurality of TFTs having a back gate electrode, a first gate insulation film, a semiconductor active layer (a semiconductor channel formation region), a second gate insulation film and a gate electrode formed on an insulated substrate, wherein an arbitrary voltage is applied to the back gate electrode.

There is provided a semiconductor device as described above wherein:

the plurality of TFTs include a first p-channel TFT and a second p-channel TFT and wherein a relationship expressed by $V_{thP1} > V_{thP2}$ exists between a threshold voltage $V_{thP1}$ at the time of application of a back gate voltage to the back gate electrode of the first p-channel TFT and a threshold voltage $V_{thP2}$ at the time of application of a back gate voltage to the back gate electrode of the second p-channel TFT.

There is provided a semiconductor device as described above wherein the plurality of TFTs include a first p-channel TFT, a second p-channel TFT, a first n-channel TFT and a second n-channel TFT and wherein relationships expressed by $|V_{thP1} > V_{thP2}|$ and $|V_{thN1} < V_{thN2}|$ exist between a threshold voltage $V_{thP1}$ at the time of application of a back gate voltage to the back gate electrode of the first p-channel TFT, a threshold voltage $V_{thP2}$ at the time of application of a back gate voltage to the back gate electrode of the second p-channel TFT, a threshold voltage $V_{thN1}$ at the time of application of a back gate voltage to the back gate electrode of the first n-channel TFT and a threshold voltage $V_{thN2}$ at the time of application of a back gate voltage to the back gate electrode of the second n-channel TFT.

In another aspect of the invention, there is provided a semiconductor device characterized in that it comprises:

a plurality of pixel TFTs provided in the form of a matrix; and a peripheral circuit constituted by a plurality of TFTs for driving the plurality of pixel TFTs and in that each of the plurality of pixel TFTs comprises a gate electrode and a back gate electrode;

each of the plurality of TFTs comprises a gate electrode and a back gate electrode; and an arbitrary voltage is applied to the back gate electrode.

BRIEF DESCRIPTION OF THE DRAWINGS

FIG. 17 illustrates an embodiment of a semiconductor display according to the invention.

FIGS. 18A and 18B show a first embodiment of the invention which is examples of the application of the same to active matrix liquid crystal displays.

FIG. 19 shows a second embodiment of the invention which is a signal line driving circuit (source driver) constituted by an inverter and a NAND circuit.

FIG. 30 is a graph showing applied voltage-transmittance characteristics of thresholdless antiferroelectric mixed liquid crystals.

FIGS. 31A through 31F are views showing examples of semiconductor apparatuses utilizing semiconductor devices and semiconductor displays according to the invention.

DETAILED DESCRIPTION OF THE PREFERRED EMBODIMENT

A mode for carrying out the invention will now be described.

Figure 1:
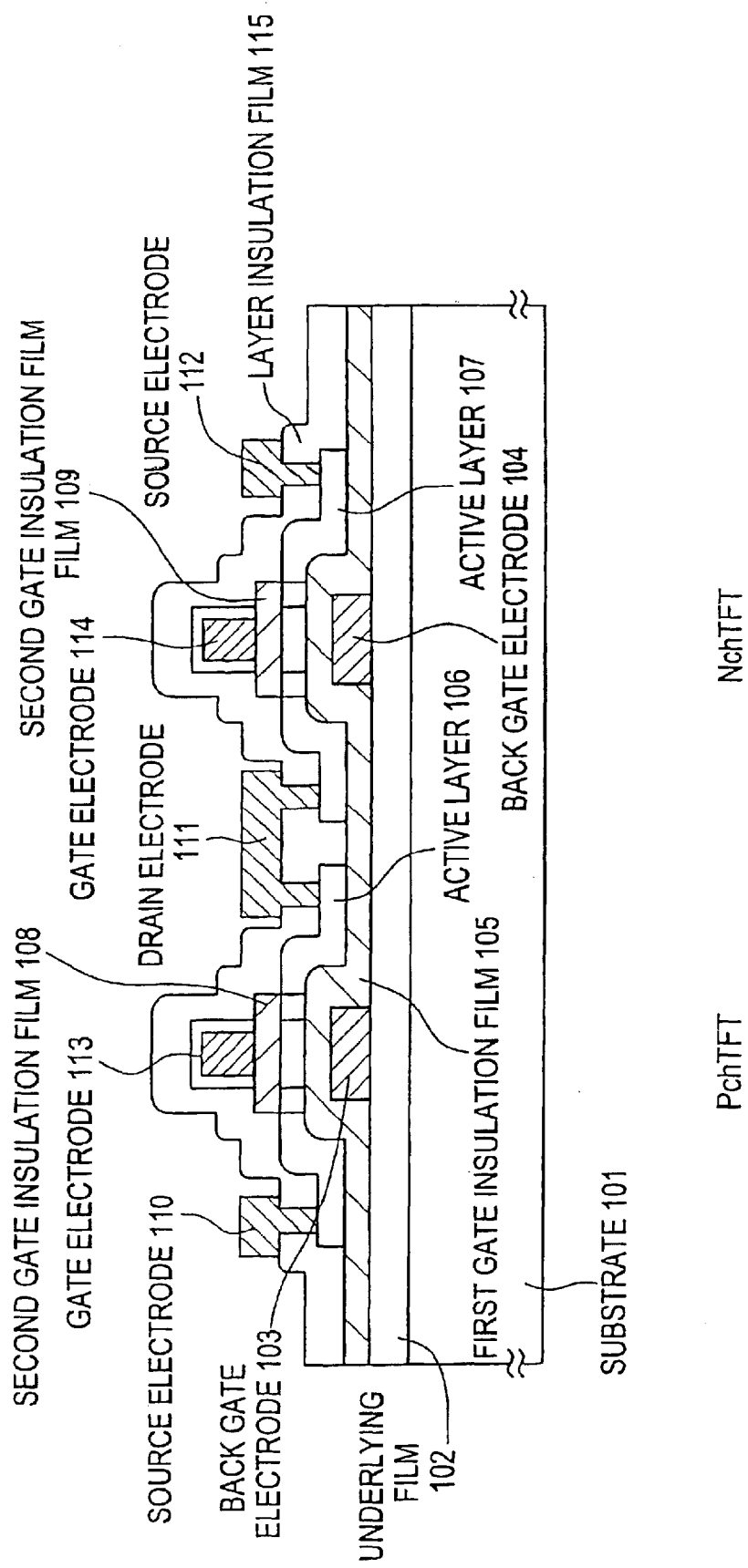
FIG. 1 illustrates an embodiment of a semiconductor device according to the invention.

FIG. 1 shows a structure of a semiconductor device according to the invention. FIG. 1 shows a CMOS circuit having a p-channel TFT and an n-channel TFT as a typical example of a semiconductor device according to the invention.

In FIG. 1, 101 represents a substrate which is an insulated substrate such as a glass substrate or quartz substrate; 102 represents an underlying film; 103 and 104 represent back gate electrodes; 105 represents a first gate insulation film; 106 and 107 represent semiconductor active layers comprising a source region, a drain region, a low concentration impurity region and a channel formation region; 108 and 109 represent second gate insulation films; 110 and 112 represent source electrodes; 111 represents a drain electrode; 113 and 114 represent gate electrodes; and 115 represents a layer insulation film. The design allows an arbitrary voltage to be applied to the back gate electrodes 103 and 104.

Figure 2:
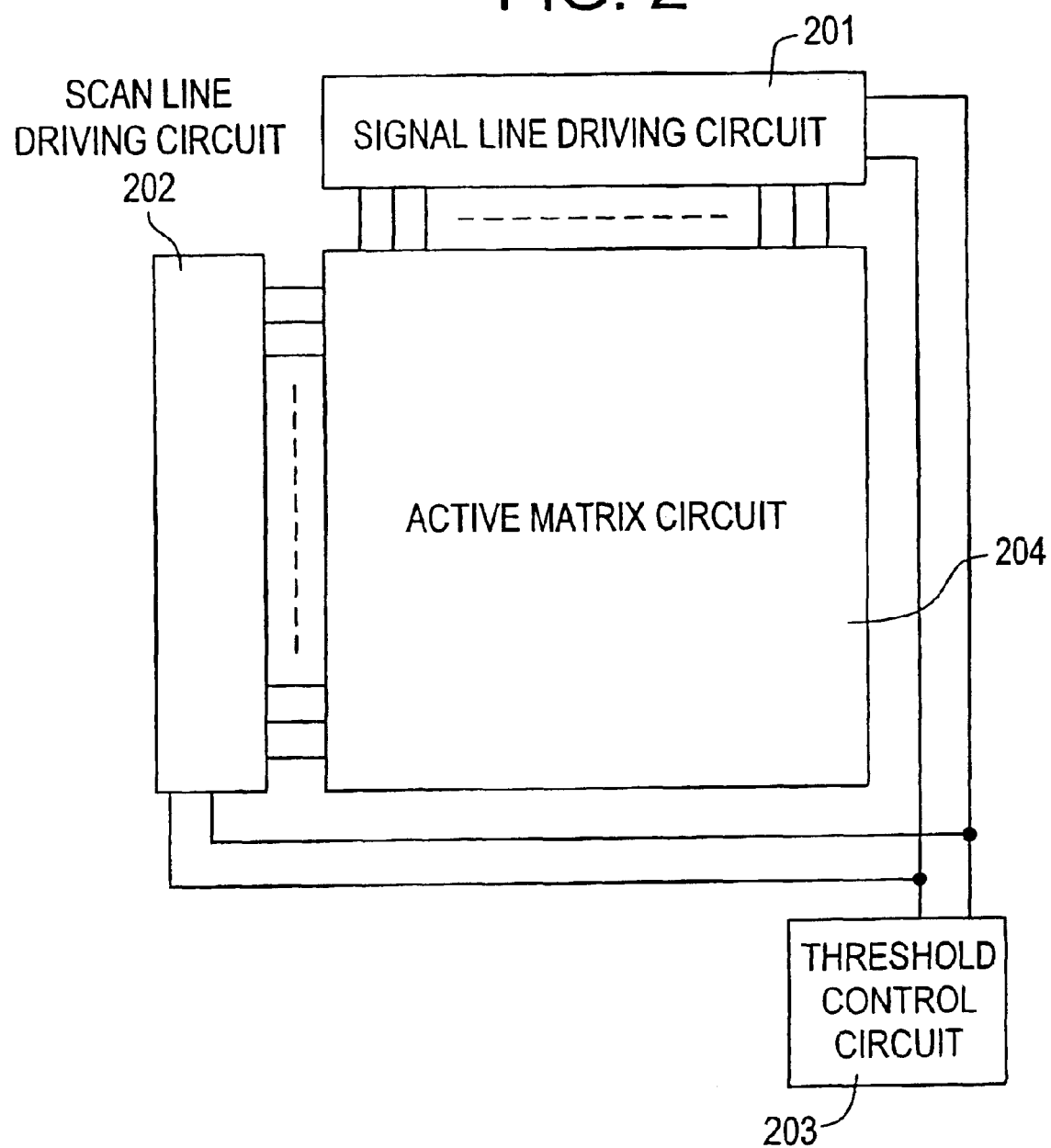
FIG. 2 illustrates a first embodiment of the invention.

The invention is an example of the use of an active matrix display as the semiconductor device. An active matrix liquid crystal display will be particularly described as an example. FIG. 2 illustrates the active matrix liquid crystal display. In the active matrix liquid crystal display in FIG. 2, a pixel portion is provided in the form of a matrix, and there is provided a signal line driving circuit 201 for driving signal lines to supply a display signal to the pixel portion and a scan line driving circuit 202 for driving scan lines to supply a scan signal. The signal line driving circuit is constituted by a plurality of first thin film transistors. The scan line driving circuit is constituted by a plurality of second thin film transistors. A threshold control circuit 203 for controlling the thresholds of the thin film transistors is connected to the signal line driving circuit and scan line driving circuit. The threshold control circuit in FIG. 2 commonly controls the plurality of first transistors forming the signal line driving circuit and the plurality of second thin film transistors forming the scan line driving circuit. According to the invention, the threshold control circuit controls the thresholds of the plurality of first thin film transistors and the plurality of second thin 1 film transistors to reduce power consumption of the signal line driving circuit and scan line driving circuit or to improve the operating frequency thereof.

A thin film transistor is equipped with a control terminal for controlling the threshold. The threshold control circuit applies a desired voltage to the control terminal. Specifically, the control terminal is formed as a so-called back gate electrode opposite to the gate electrode of the thin film transistor to serve as a terminal for controlling the threshold. By applying the desired voltage to this control terminal from the threshold control circuit, the channel is varied to change the threshold. "Back gate electrode" is a generic term representing any electrode formed opposite to the gate electrodes (top gate electrodes and bottom gate electrodes) of thin film transistors. It is formed at the bottom side or substrate side of a thin film transistor having a top gate structure or formed at the top side of a thin film transistor having a bottom gate structure. When a voltage is applied to the control terminal by the threshold control circuit in such a configuration, it affects the channel of the thin film transistor. This makes it possible to control the threshold of the thin film transistor.

In this case, different voltages are to be applied to when the power consumption of a dc is to be reduced and when the operating frequency of the same is to be improved. Further, the applied voltage varies depending on the polarity of the thin film transistor. Specifically, in the case of an n-type thin film transistor, a voltage lower than a ground potential is applied to reduce power consumption and a voltage higher than the ground potential is applied to improve the operating frequency. In the case of a p-type thin film transistor, a voltage higher than a power supply potential is applied to reduce power consumption and a voltage lower than the power supply potential is applied to improve the operating frequency.

Thresholds may be controlled by monitoring the current through the dc or the current through individual thin film transistor. Alternatively, it may be automatically carried out by performing negative feedback. In the former case, a variable resistor is provided in the threshold control circuit, and a desired voltage is applied by adjusting the variable resistor. In the latter case, the threshold control circuit may be formed by a monitoring thin film transistor for setting a reference value, a load for converting a current through the monitoring thin film transistor into a voltage and an amplifier for amplifying the voltage generated at the load to apply it to the driving circuit and to negatively feed back it to a threshold control terminal of the monitoring thin film transistor. In the latter case, the threshold control circuit is preferably formed using a thin film transistor on the same substrate on which the driving circuit is provided.

When a thin film transistor is constituted by a complementary transistor (CMOS), first and second control terminals may be respectively provided on the n-type transistor and p-type transistor, and a desired voltage may be applied by the threshold control circuit to each of the first and second control terminals.

The driving circuit includes a signal line driving circuit for driving signal lines and a scan line driving circuit for driving scan lines. In this case, a single threshold control circuit may be connected to those driving circuits to control the threshold of each thin film transistor commonly. A separate threshold control circuit may be connected to each driving circuit to control the threshold of each thin film transistor independently. Especially, in the latter case, it is possible to control the signal line driving circuit for reduced power consumption with a first threshold control circuit and to control the scan line driving circuit to improve the operating frequency with a second threshold control circuit. The reason for such independent control is the fact that the signal line driving circuit and scan line driving circuit have different operating frequencies. That is, the operating frequency is more important in the signal line driving circuit, and power consumption is more important for the scan line driving circuit.

Figure 3:
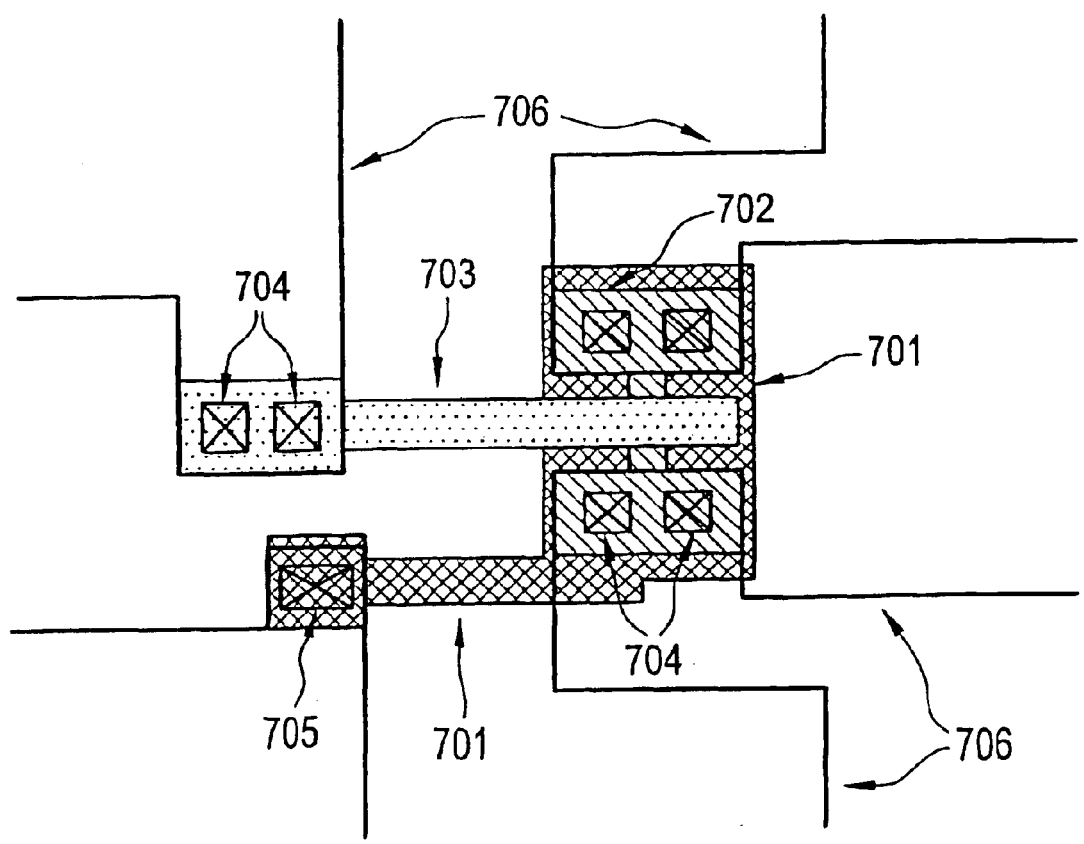
FIG. 3 is a plan view of a thin film transistor used in the invention.

FIG. 3 illustrates a thin film transistor having a back gate electrode according to the invention in the form of a plan view. 701 in FIG. 3 represents the back gate electrode. 702 represents an island-shaped region of polysilicon (active layer); 703 represents a gate electrode; 704 and 705 represent contact holes; and 706 represents a wiring electrode. The threshold of the thin film transistor is controlled by applying a voltage to the back gate electrode 701 formed opposite to the gate electrode 703.

Figure 26A:
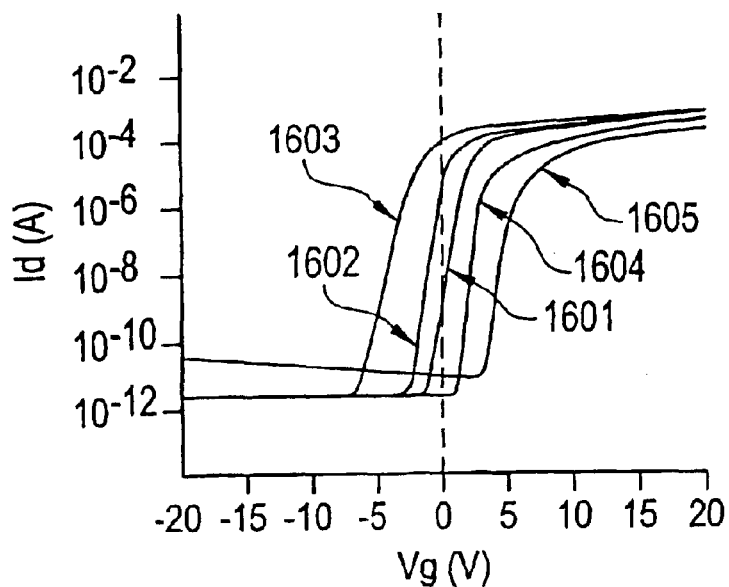
FIGS. 26A and 26B show the drain current-gate voltage characteristics of a thin film transistor for describing the invention.
Figure 26B:
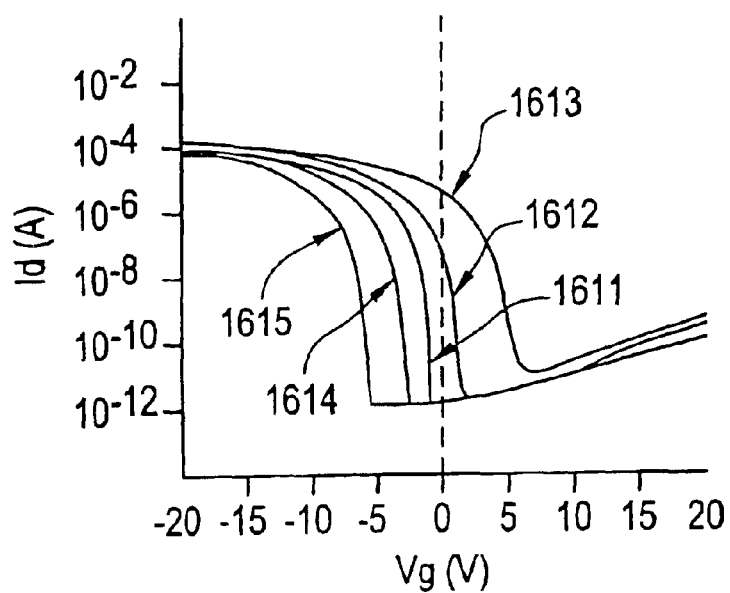

The electrical characteristics of the thin film transistor having such a configuration will be described with reference to an example. FIGS. 26A and 26B show examples of gate voltage-drain current characteristics (Vg-Id curves) of an n-channel thin film transistor and a p-channel thin film transistor. In FIG. 26A, 1601 represents the characteristics of the n-channel thin film transistor observed when no voltage is applied to the back gate electrode. The n-channel thin film transistor in this example is normally on. 1602 and 1603 represent the characteristics of the n-channel thin film transistor, when positive voltage of +2 V and +5 V are respectively applied to the back gate electrode, and 1604 and 1605 represent those when negative voltages of −2 V and −5 V are respectively applied to the back gate electrode. Specifically, the threshold of the n-channel thin film transistor is shifted to the left (in the negative direction) when a positive voltage is applied to the back gate electrode and is shifted to the right (in the positive direction) when a negative voltage is applied. Those curves indicate that the threshold voltage of an n-channel TFT can be changed by applying a positive or negative voltage to the back gate electrode.

FIG. 26B shows the characteristics of a p-channel thin film transistor. In FIG. 26B, 1611 represents the characteristics of the p-channel thin film transistor observed when no voltage is applied to the back gate electrode. 1614 and 1615 represent the characteristics of the p-channel thin film transistor observed respectively when positive voltages of +2 V and +5 V are applied to the back gate electrode, and 1612 and 1613 represent the characteristics of the p-channel thin film transistor observed when negative voltages −2 V and −5 V are applied to the back gate electrode. Specifically, the threshold of the p-channel thin film transistor is shifted to the left (in the negative direction) when a positive voltage is applied to the back gate electrode and is shifted to the right (in the positive direction) when a negative voltage is applied. Those curves indicate that the threshold voltage of a p-channel thin film transistor can be changed by applying a positive or negative voltage to the back gate electrode similarly to the case of an n-channel TFT as described above.

Figure 27A:
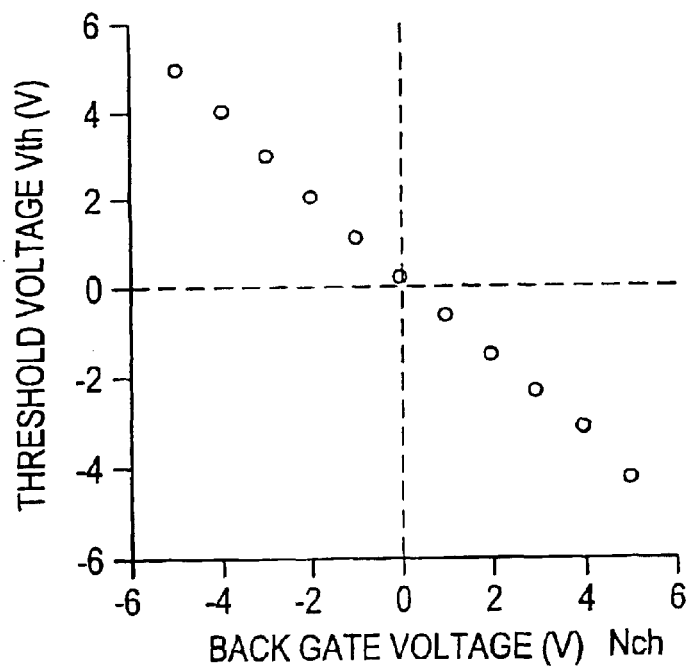
FIGS. 27A and 27B show changes in a threshold voltage that occur as a back gate voltage is changed according to the invention.
Figure 27B:
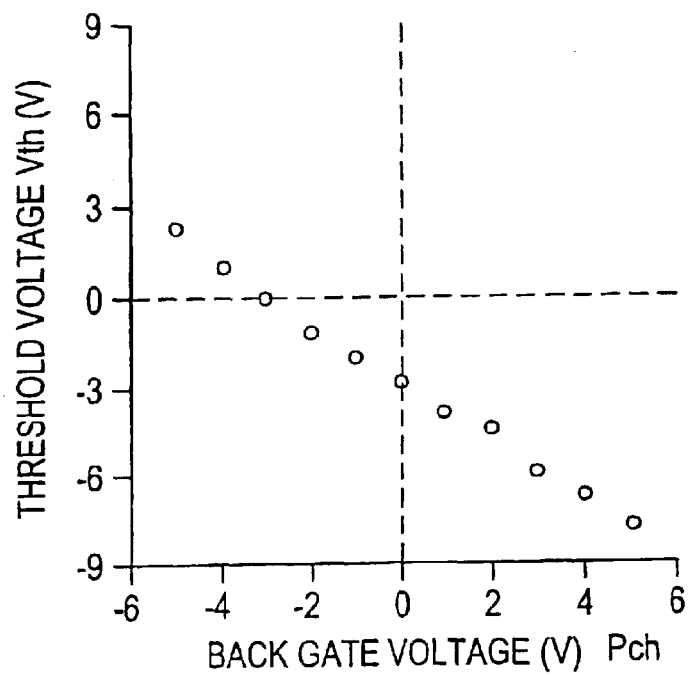

FIGS. 26A and 26B show only characteristics observed when the back gate voltage is at positive voltages of +2 V and +5 V and negative voltages of −2 V and −5 V. The inventor measured similar characteristics (Vg-Id curves) of thin film transistors with the back gate voltages varied more minutely and found that the threshold Vth of each of a n-channel thin film transistor and a p-channel thin film transistor changed as plotted in FIGS. 27A and 27B as the back gate voltage was changed. FIGS. 27A and 27B show the characteristics of the n-channel thin film transistor and p-channel thin film transistor, respectively. The threshold of either of the n-channel and p-channel thin film transistors is shifted in the negative direction when a positive voltage is applied to the back gate voltage and is shifted in the positive direction when a negative voltage is applied.

This has revealed that the threshold voltage of each of the n-channel and p-channel thin film transistor can be changed by applying a voltage to the back gate electrode. The invention takes advantage of this phenomenon to control the threshold voltage Vth of a thin film transistor.

Figure 4:
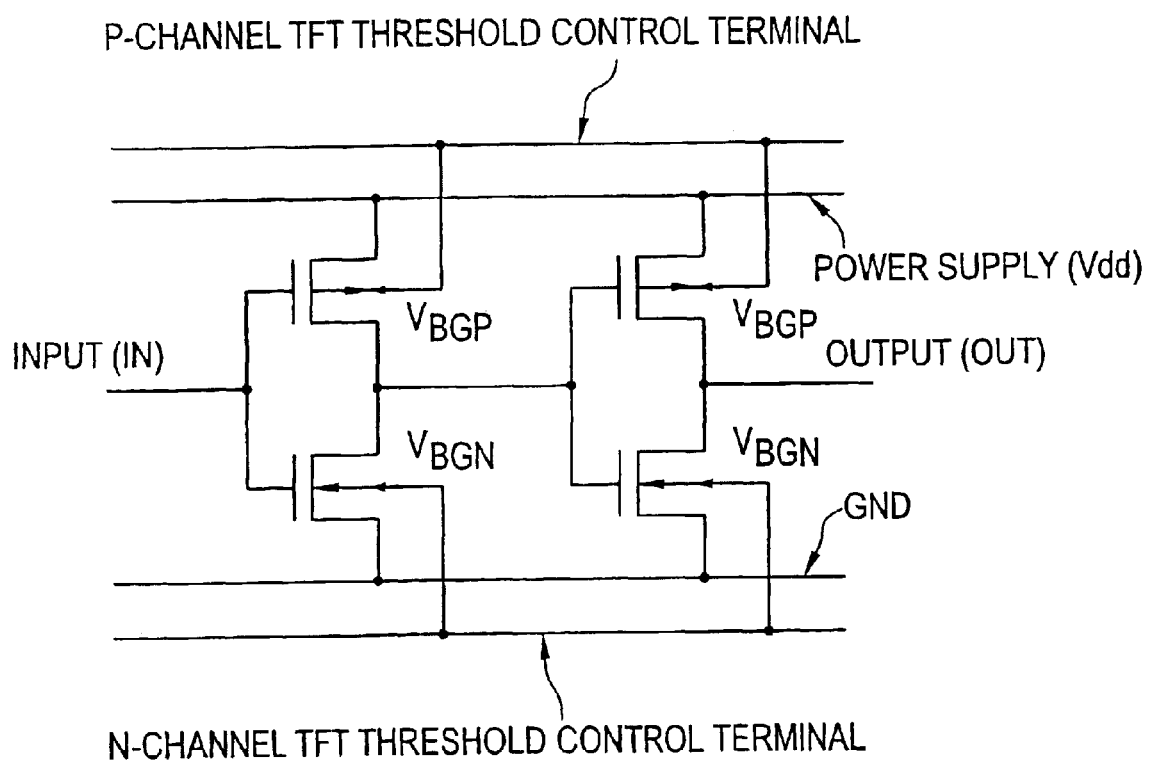
FIG. 4 illustrates an example of an inverter circuit to which the invention is applied.

A description will be made further based on characteristics of thin film transistors as described above on the application of the invention to several basic circuits and the operation of the same. FIG. 4 illustrates an inverter array as an example of a basic circuit that constitutes a driving circuit. Although an inverter is described as an example, the description applies not only to inverters but also to shift registers, decoders and the like. While a CMOS inverter circuit normally comprises four terminals, i.e., input (IN), output (OUT), power supply (Vdd) and ground terminals, a threshold control terminal for, an n-channel thin film transistor and a threshold control terminal for a p-channel thin film transistor are added to provide six terminals according to the invention. A back gate voltage $V_{BGP}$ is applied from the p-channel TFT threshold control terminal to the p-channel thin film transistor, and a back gate voltage $V_{BGN}$ is applied from the n-channel TFT threshold control terminal to the n-channel thin film transistor. The thresholds of the thin film transistors forming the circuit are controlled by controlling the threshold control terminals.

Figure 15A:
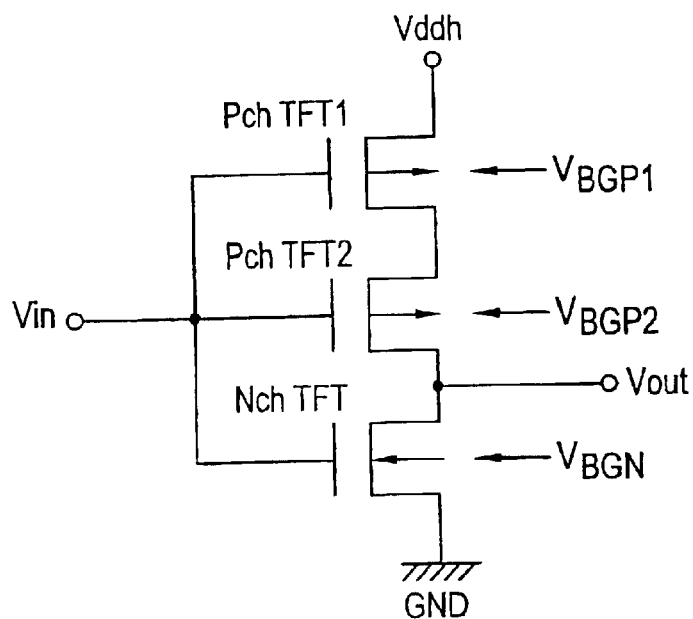
FIGS. 15A and 15B illustrate configurations of an inverter circuit as an embodiment of a semiconductor device according to the invention.
Figure 15B:
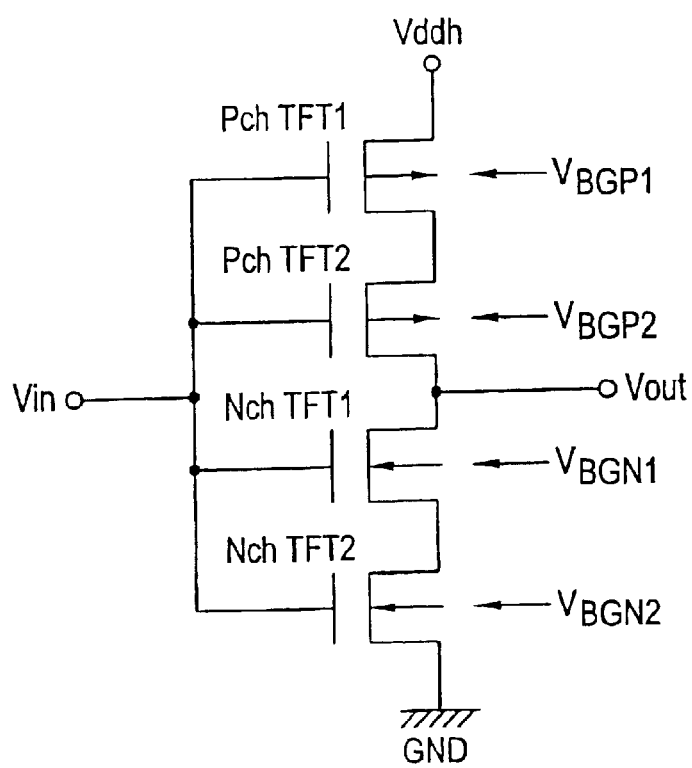

Further examples of inverter circuits will be described with reference to FIGS. 15A and 15B. FIG. 15A shows an inverter circuit formed by two p-channel thin film transistors PchTFT1 and PchTFT2 and one n-channel thin film transistor NchTFT. FIG. 15B shows an inverter circuit formed by two p-channel thin film transistors PchTFT1 and PchTFT2 and two n-channel thin film transistors NchTFT1 and NchTFT2.

In FIG. 15A, a back gate voltage $V_{BGP1}$ is applied to the p-channel thin film transistor PchTFT1. A back gate voltage $V_{BGP2}$ is applied the p-channel thin film transistor PchTFT2. Further, a back gate voltage VBGN is applied to the n-channel thin film transistor NchTFT.

Figure 10A:
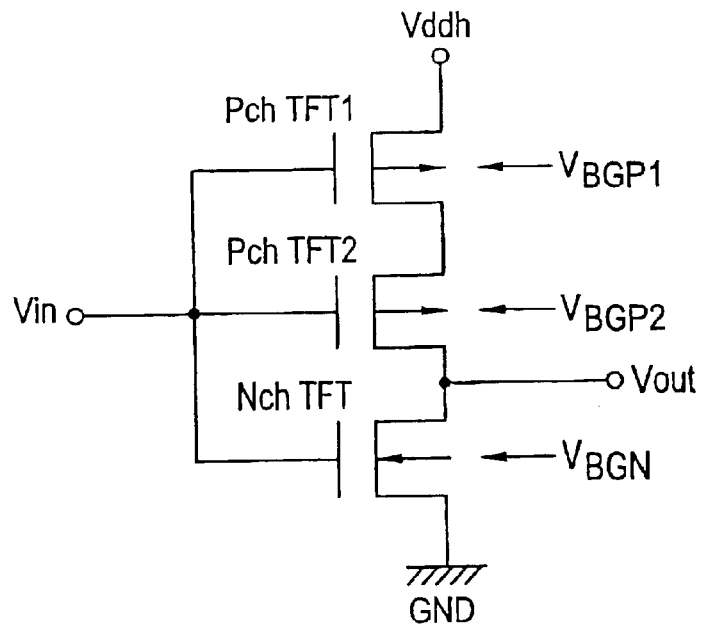
FIGS. 10A and 10B show inverter circuits employing the present invention.

In an inverter circuit according to the present embodiment shown in FIG. 10A, back gate voltages are controlled such that a relationship expressed by VthP1>Vth P2 exists between a threshold voltage VthP1 of a p-channel thin film transistor PchTFT1 and a threshold voltage VthP2 of a p-channel thin film transistor PchTFT2. This makes it possible to reduce power consumption of the inverter circuit.

Figure 10B:
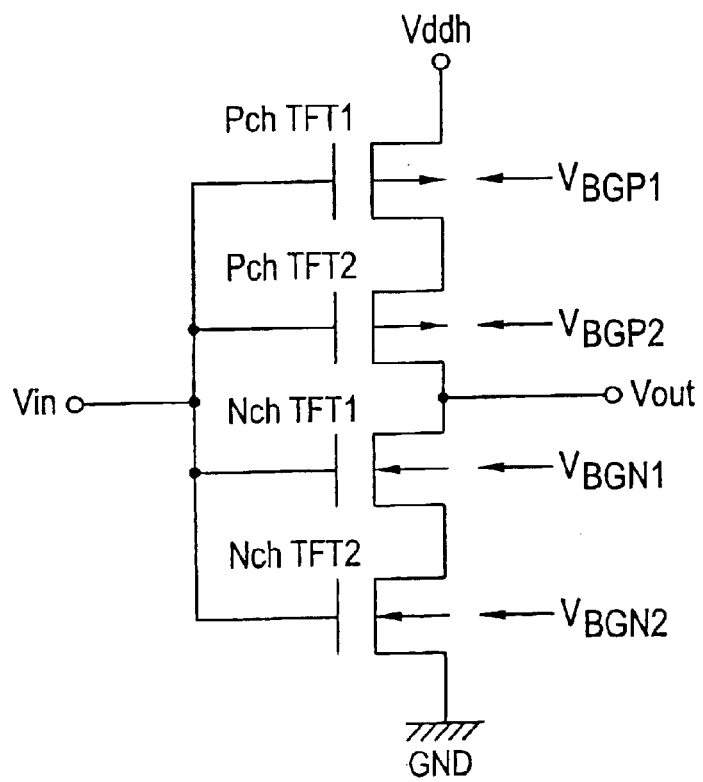

In an inverter circuit according to the present embodiment shown in FIG. 10B, a back gate voltage $V_{BGP1}$ is applied to a p-channel thin film transistor PchTFT1; a back gate voltage $V_{BGP2}$ is applied to a p-channel thin film transistor PchTFT2; a back gate voltage $V_{BGN1}$ is applied to an n-channel thin film transistor NchTFT1; a back gate voltage $V_{BGN2}$ is applied to an n-channel thin film transistor NchTFT2.

In the inverter circuit according to the present embodiment shown in FIG. 10B, back gate voltages are controlled such that relationships expressed by |VthP1>VthP 2| and |VthN1<VthN2| exist between threshold voltages VthP1, VthP2, VthN1 and VthN2 of the p-channel thin film transistor PchTFT1, p-channel thin film transistor PchTFT2, n-channel thin film transistor NchTFT1 and n-channel thin film transistor NchTFT2. This makes it possible to reduce power consumption of the inverter circuit.

Figure 5A:
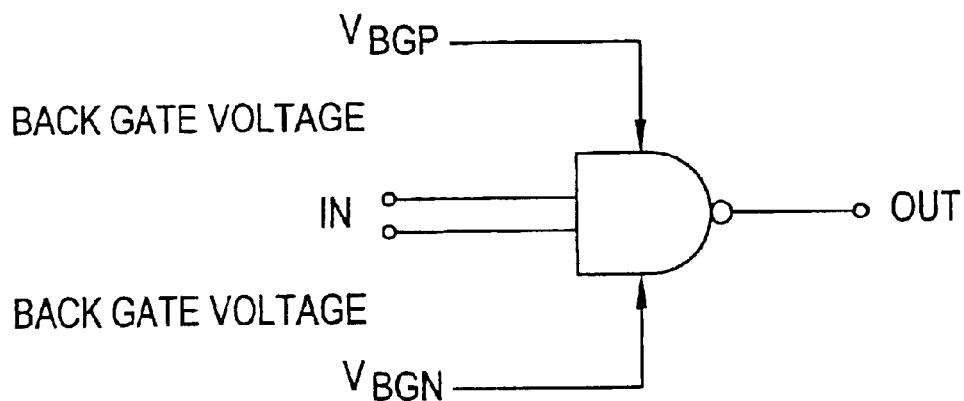
FIGS. 5A and 5B illustrate an example of a NAND circuit to which the invention is applied.
Figure 5B:
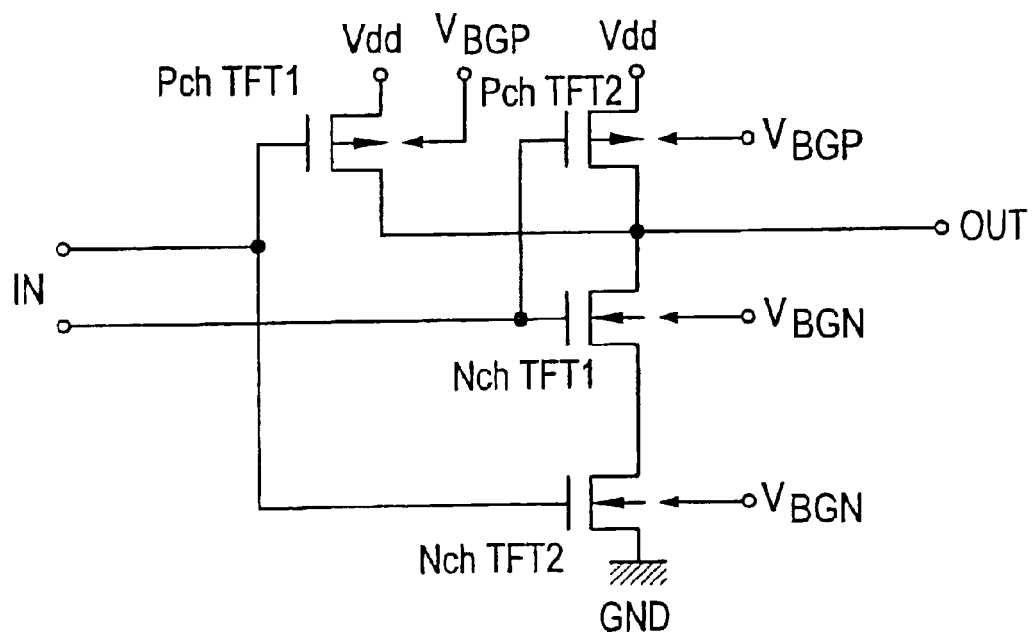

FIGS. 5A and 5B show a NAND circuit as an example of a basic circuit that constitutes a driving circuit used in the present invention. As shown in FIGS. 5A and 5B, back gate voltages $V_{BGP}$ and $V_{GBN}$ are respectively applied to p-channel thin film transistors and n-channel thin film transistors among a plurality of thin film transistors forming the NAND circuit. While different back gate voltages are applied to the p-channel and n-channel thin film transistors in the NAND circuit shown in FIGS. 5A and 5B, a design may be adopted in which the same back gate voltage is applied to the n-channel and p-channel thin film transistors.

A threshold voltage at which the NAND circuit is activated can be changed by applying the back gate voltages to those thin film transistors.

Figure 6A:
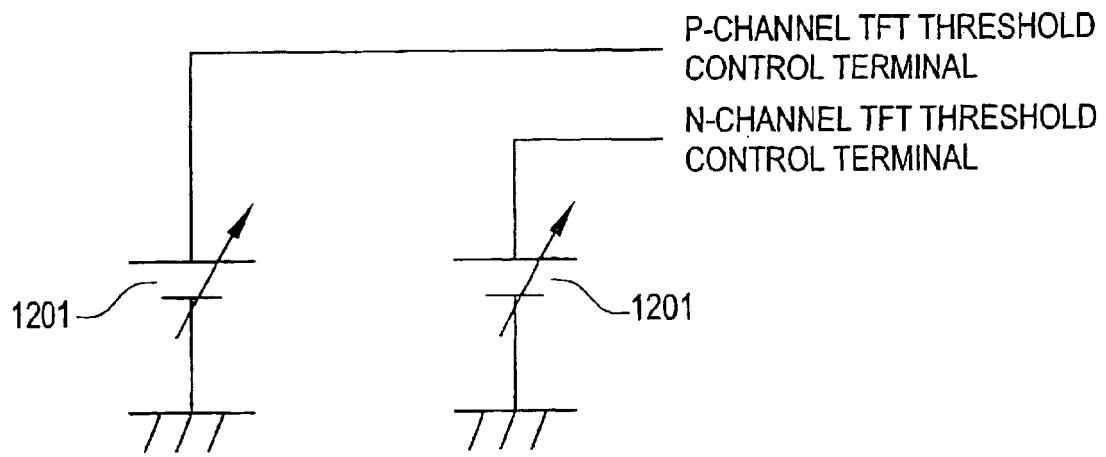
FIGS. 6A and 6B illustrate examples of a threshold control circuit utilizing a variable resistor and a variable voltage source.
Figure 6B:
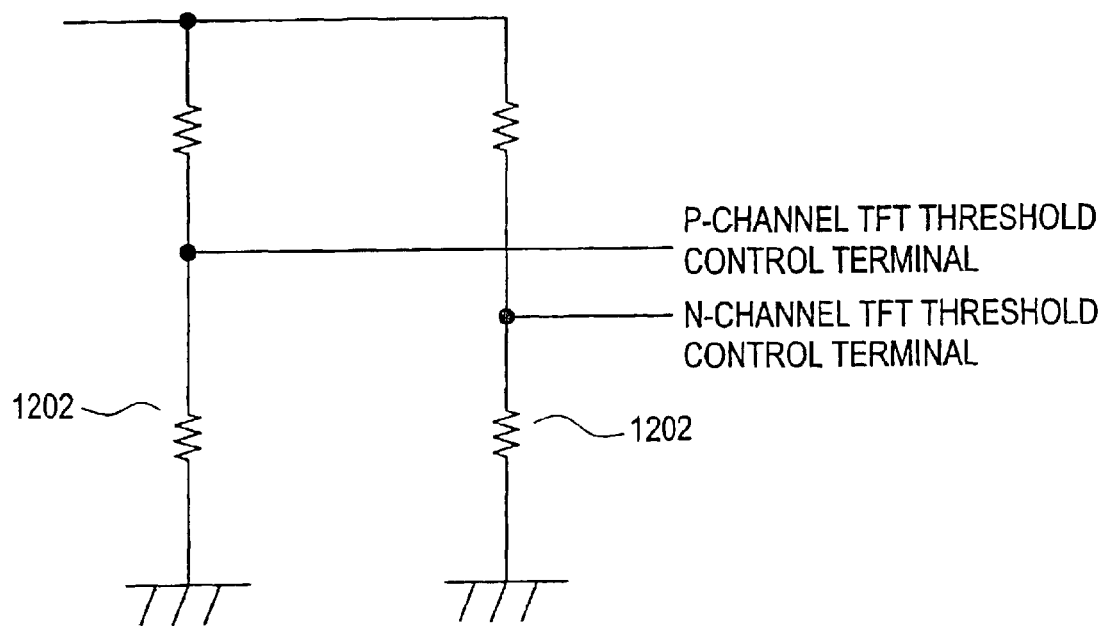

FIGS. 6A and 6B show examples of threshold control circuits. In the examples, since the control voltage does not change as time passes, a required voltage may be applied using a voltage source 1201 (FIG. 6A) or using a variable resistor 1202 (FIG. 6B). In the examples, control over a threshold is optimized by setting the voltage while monitoring a current through a driving circuit or a current through each individual thin film transistor.

Figure 7:
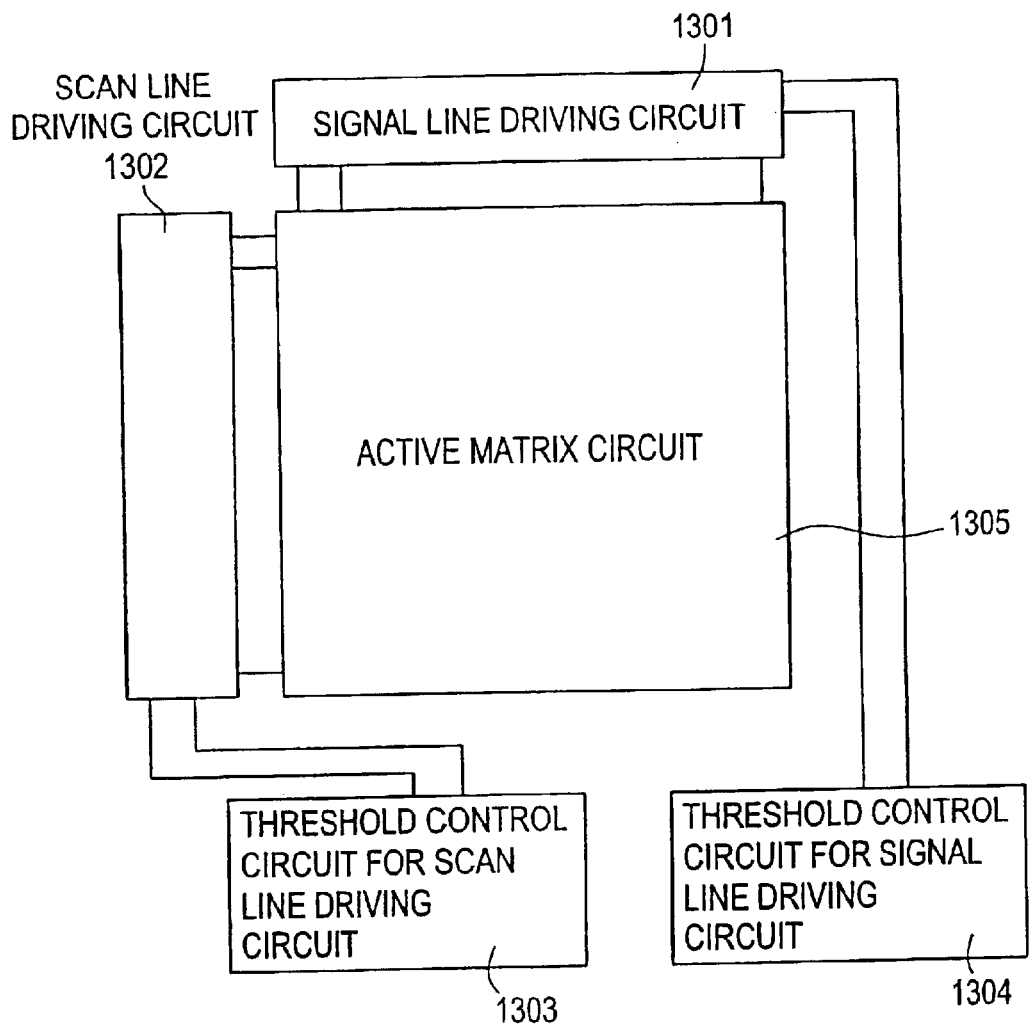
FIG. 7 shows an example of a threshold control circuit configured as a display unit.

Referring to FIG. 7, both of a signal line driving circuit and a scan line driving circuit of an active matrix liquid crystal display incorporate threshold control circuits associated therewith. In this example, the configuration shown in FIG. 3 is employed for a plurality of first thin film transistors forming a signal line driving circuit 1301 and a plurality of second thin film transistors forming a scan line driving circuit 1302. The plurality of first thin film transistors forming the signal line driving circuit 1301 and the plurality of second thin film transistors forming the scan line driving circuit 1302 are independently controlled. In FIG. 7, threshold control terminals of the plurality of first thin film transistors forming the signal line driving circuit 1301 and the plurality of second thin film transistors forming the scan line driving circuit 1302 (the back gate electrode 701 in FIG. 3) are led out, and voltages are applied to the terminals of the back gate electrodes 701 thus led out to control the thresholds of the thin film transistors. As described above, when it is desired to reduce power consumption of the signal line driving circuit. 1301 and scan line driving circuit 1302 as a measure to cope with the normally on state of the thin film transistors, the threshold voltages can be controlled by applying a voltage lower than a ground potential to the threshold control terminals of n-channel thin film transistors and a voltage higher than a power supply potential to the threshold control terminals of p-channel thin film transistors.

When it is desirable to increase the operating frequencies of the signal line driving circuit 1301 and scan line driving circuit 1302, the thresholds are controlled by applying a voltage higher than the ground potential to the threshold control terminals of n-channel thin film transistors and a voltage lower than the power supply potential to the threshold control terminals of p-channel thin film transistors.

While the threshold control voltages for the plurality of first thin film transistors forming the signal line driving circuit 1301 and the plurality of second thin film transistors forming the scan line driving circuit 1302 are independently controlled here, they may be commonly controlled depending on the area occupied by them. In general, the operating frequency of the signal line driving circuit 1301 is on the order of MHz, whereas the operating frequency of the scan line driving circuit 1302 is on the order of KHz. It is therefore required to increase the operating frequency of the signal line driving circuit 1301, but there is no such need for the scan line driving circuit 1302. In controlling the thresholds, therefore, the operating frequency is more important for the signal line driving circuit 1301 and power consumption is more important for the scan line driving circuit 1302. 1303 represents a threshold control circuit for the signal line driving circuit 1301; 1304 represents a threshold control circuit for the scan line driving circuit 1302; and 1305 represents an active matrix liquid crystal display. A display module which is an advanced version of this configuration in the form of a panel unit will be disclosed later as an eighth embodiment of the invention.

Figure 8:
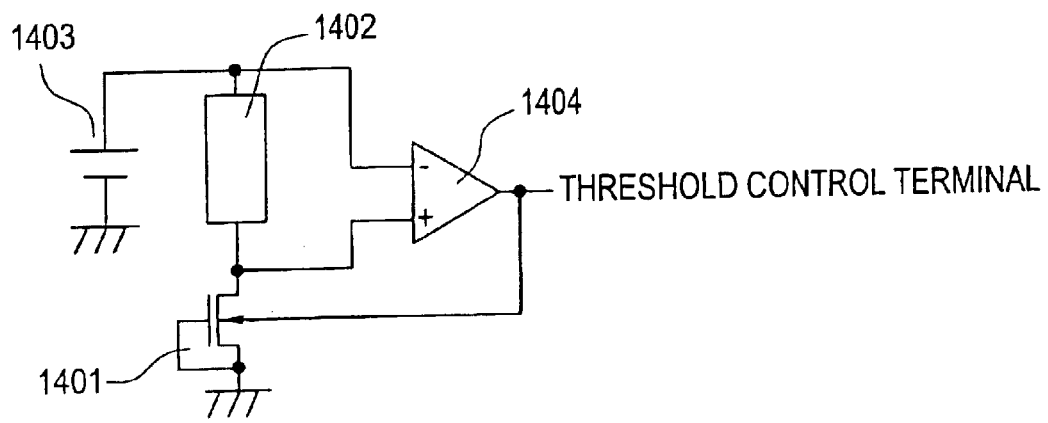
FIG. 8 shows a threshold control circuit in which thin film transistors are formed on the same substrate.

Referring to FIG. 8, a threshold control circuit is configured using a thin film transistor on the same substrate on which a driving circuit is provided instead of an external variable resistor or variable voltage source. In this case, the circuit is formed by a monitoring thin film transistor 1401 to serve as a reference for control, a load 1402 for converting a current through the monitoring thin film transistor 1401 into a voltage and an amplifier 1404 for amplifying the voltage generated at the load 1402 and for applying the voltage to the driving circuit and a threshold control terminal of the monitoring thin film transistor 1401.

The operation of the same will be described. When this thin film transistor 1401 is normally on, a drain current flows through the monitoring thin film transistor 1401 to generate a voltage at the load 1402. This voltage is input to a non-inverting input terminal of the amplifier 1404 on a differential input basis, and a differential voltage between the voltage at the load 1402 and a reference voltage 1403 is amplified and output. The amplified differential voltage output is output in a decreasing direction because of non-inverting input is adopted. The output of the amplifier 1404 is connected to the monitoring thin film transistor 1401 and a voltage control terminal of the driving circuit. Further, since the voltage is decreased, the voltage at the threshold control terminal is decreased to increase the threshold of the thin film transistor, causing the thin film transistor to operate in the direction of suppressing the drain current.

Thus, the threshold can be automatically controlled by providing negative feedback with the combination of the monitoring thin film transistor 1401 and amplifier 1404.

While a feedback circuit is configured as described above on a normally on basis, the threshold can be freely set by fixing the gate voltage of the monitoring thin film transistor 1401 at a potential other than the source potential and setting the reference voltage appropriately.

Figure 9:
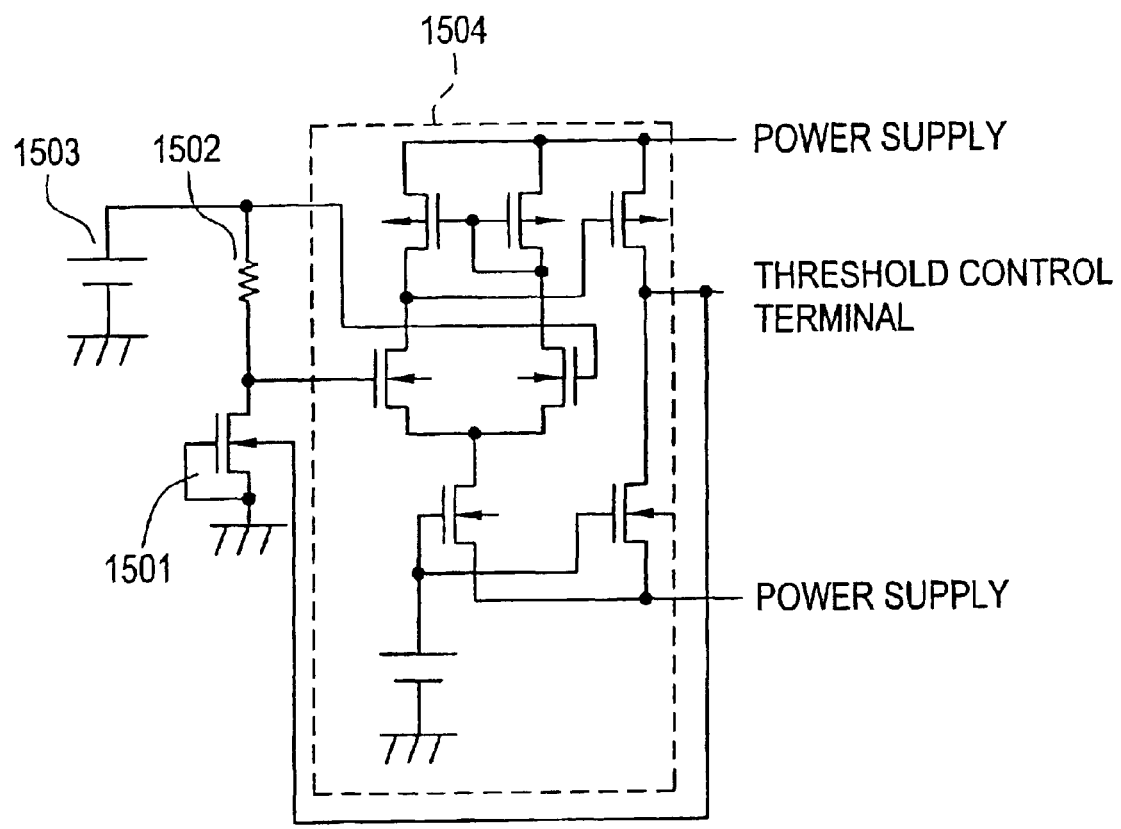
FIG. 9 shows specific implementation of the threshold control circuit shown in FIG. 14 utilizing TFTs.

FIG. 9 shows specific implementation of the threshold control circuit shown in FIG. 8 using thin film transistors. The amplifier is an operational amplifier in which a differential circuit is constituted an n-type thin film transistor and an active load is constituted by a p-type thin film transistor. 1501 represents a monitoring TFT; 1502 represents a load; 1503 represents a reference power supply; and 1504 represents the amplifier.

A specific description will now be made on semiconductor devices according to the invention with reference to the following embodiments. The following embodiments are merely limited modes of carrying out the invention, and the semiconductor device and semiconductor display according to the invention are not limited to the following embodiments.

A first embodiment of the invention will now be described.

The present embodiment will refer to an active matrix liquid crystal display as an example of a semiconductor display having a structure of a semiconductor device according to the invention.

The present embodiment is an example shown in FIGS. 11A through 11D, FIGS. 12A through 12D, FIGS. 13A through 13D, FIGS. 14A through 14C and FIGS. 15A and 15B in which a plurality of TFTs having a structure according to the invention are formed on a substrate having an insulated surface and in which a pixel matrix circuit, driving circuits, a logic circuit and the like are configured on a monolithic basis. The present embodiment describes the simultaneous formation of one pixel of the pixel matrix circuit and CMOS circuits which are basic circuits for the other circuits (the driving circuits, logic circuit and the like). While the present embodiment further refers to steps for fabricating a p-channel TFT and an n-channel TFT each having one gate electrode, it is possible to fabricate CMOS circuits utilizing TFTs having a plurality of gate electrodes such as double gate type and triple gate type TFTs in a similar manner.

Figure 11A:
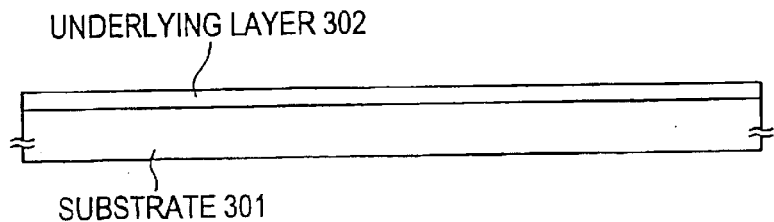
FIGS. 11A through 11D are views showing a method for fabricating a semiconductor device or semiconductor display according to the invention.

Referring to FIG. 11A, a quartz substrate 301 is first prepared as the substrate having an insulated surface. A silicon substrate having a thermal oxide film formed thereon may be used instead of the quartz substrate. Alternatively, a method may be adopted in which an amorphous silicon film is once formed on the quartz substrate and is completely thermally oxidized to provide an insulation film. Further, it is possible to use a quartz substrate, ceramic substrate or silicon substrate having a silicon nitride film formed thereon as an insulation film. Next, an underlying later 302 is formed. In the present embodiment, $SiO_2$ is used.

Figure 11B:
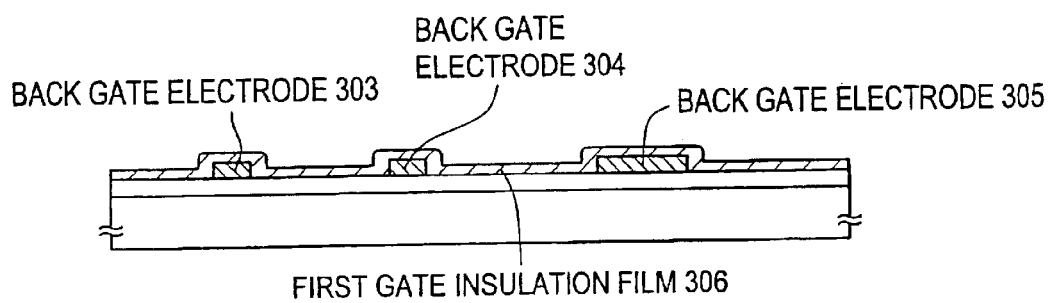

Referring to FIG. 11B, back gate electrodes 303 through 305 are formed next. In this embodiment, Ta is used for the back gate electrodes 303 through 305. Ta may be replaced by a multi-layer film of Ta and TaN or a metal having a high melting point such as Ti or a multi-layer film made of a plurality of metals. Then, a first gate insulation film 306 is formed. SiO2 of 70 nm is used as the first gate insulation film.

Figure 11C:
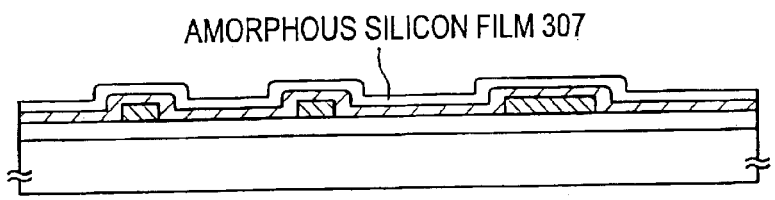

Referring to FIG. 11C, an amorphous silicon film 307 is then formed. The amorphous silicon film 307 is adjusted such that it has a final thickness (a thickness that takes a reduction attributable to thermal oxidation into account) in the range from 10 to 75 nm (preferably in the range from 15 to 45 nm).

During the formation of the amorphous silicon film 307, it is important to conduct severe control of the concentration of impurities in the film. In the present embodiment, the amorphous silicon film 307 is controlled such that both of C (carbon) and N (nitrogen) which are impurities hindering subsequent crystallization have a concentration less than $5 \times 10^{18}$ atoms/cm$^3$ (typically $5 \times 10^{17}$ atoms/cm$^3$ or less and preferably $2 \times 10^{17}$ atoms/cm$^3$ or less) and such that 0 (oxygen) has a concentration less than $5 \times 10^{19}$ atoms/cm$^3$ (typically $1 \times 10^{18}$ atoms/cm$^3$ or less and preferably $5 \times 10^{17}$ atoms/cm$^3$ or less). The reason is that the presence of each impurity with a concentration higher than that described above can affect subsequent crystallization to reduce the quality of a crystallized film. In the context of this specification, the concentrations of the above described impurities in a film are defined in terms of minimum values measured by SIMS (secondary ion mass spectrometry).

In order to provide the above-described configuration, a low pressure thermal CVD furnace used for the invention is preferably subjected to periodic dry cleaning to keep a film forming chamber clean. The dry cleaning of the film forming chamber may be carried out by introducing a $ClF_3$ (chlorine fluoride) gas in the range from 100 to 300 sccm into the furnace heated to a temperature in the range from 200 to 400° C. and by cleaning the film forming chamber with fluorine generated as a result of thermal decomposition.

According to the findings of the applicant, any deposit having a thickness of about 2 μm (major component of which is silicon) can be completely removed in four hours when the temperature inside the furnace is 300° C. and the flow rate of the $ClF_3$ gas is 300 sccm.

Another very important parameter is the concentration of hydrogen in the amorphous silicon film 307, and it seems that a low hydrogen content results in a film having high crystallinity. Therefore, the amorphous silicon film 307 is preferably formed using a low pressure thermal CVD process. A plasma CVD process may alternatively be used by optimizing conditions for film formation.

Next, a step of crystallizing the amorphous silicon film 307 is carried out. A technique disclosed in JP-A-7-130652 is used as means for crystallization. While either of the means disclosed in the first and second embodiment in the same publication may be used, the technique disclosed in the second embodiment of the publication (which is described in more detail in JP-A-8-78329) is preferably used in the present embodiment.

According to the technique disclosed in the JP-A-8-78329, a mask insulation film 308 is formed to a thickness of 100 nm to select regions to be doped with a catalytic element. The mask insulation film 308 has a plurality of openings to allow doping with a catalytic element. The positions of crystalline regions can be determined by the positions of the openings.

Figure 11D:
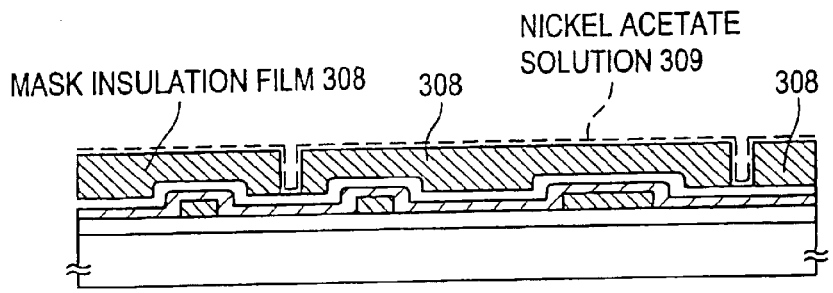

Referring to FIG. 11D, a solution including nickel (Ni) as a catalytic element for promoting the crystallization of the amorphous silicon film 307 (a nickel ethanol acetate solution) is applied using a spin coating process. Usable catalytic elements other than nickel include cobalt (Co), iron (Fe), palladium (Pd), germanium (Ge), platinum (Pt), copper (Cu) and gold (Au).

The step of doping with a catalytic element may be performed through an ion implantation process utilizing a resist mask or a plasma doping process. In this case, since it is easy to reduce the area occupied by doped regions and to control the growing distance of laterally grown regions, it is a technique effective in forming a fine circuit.

Figure 12A:
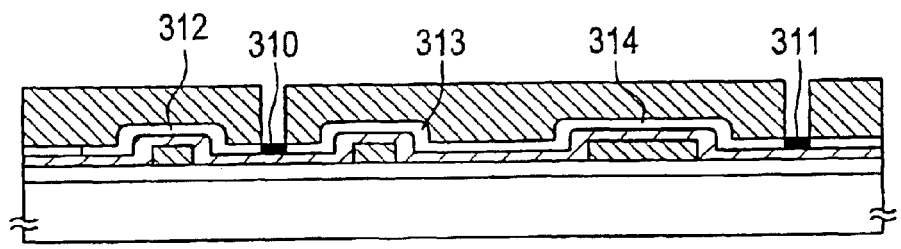
FIGS. 12A through 12D are views showing a method for fabricating a semiconductor device or semiconductor display according to the invention.

Referring to FIG. 12A, after the step of doping with a catalytic element, dehydration is carried out for about one hour at 450° C. and, the amorphous silicon film 307 is thereafter crystallized through a heating process for a duration in the range from 4 to 24 hours at a temperature in the range from 500 to 960° C. (typically in the range from 550 to 650° C.) in an inert atmosphere, hydrogen atmosphere or oxygen atmosphere. In the present embodiment, the heating process is carried out for 14 hours at 570° C. in a nitrogen atmosphere.

At this time, the crystallization of the amorphous silicon film 307 proceeds with precedence to nuclei generated in regions 310 and 311 doped with nickel to form crystalline regions 312 through 314 constituted by polycrystalline silicon films grown substantially in parallel with the surface of the substrate 301. The crystalline regions 312 through 314 are referred to as "laterally grown regions". The laterally grown regions are advantageous in that they have high crystallinity as a whole because individual crystals are aggregated in a relatively uniform state.

The use of the technique disclosed in an embodiment in the JP-A-7-130652 also forms regions which can be microscopically regarded as laterally grown regions. However, this technique has a problem with controllability of gain boundaries because nuclei are ununiformly generated in a plane.

Crystallization can be caused by applying a nickel acetate solution on the top surface of the amorphous silicon film without using the mask insulation film 308.

Figure 12B:
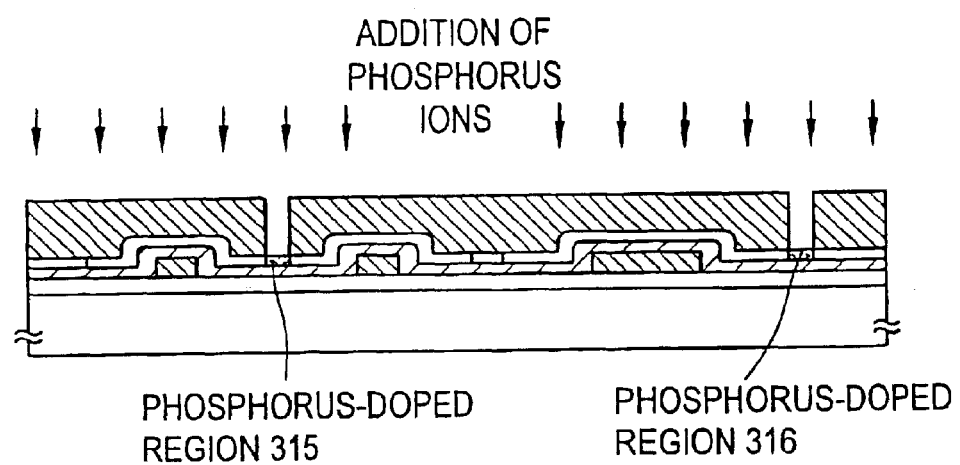

Referring to FIG. 12B, a process of gettering the catalytic element is then performed. First, selective doping with phosphorus ions is carried out. The doping with phosphorus is performed with the mask insulation film 308 formed. Then, only regions 315 and 316 of the polycrystalline silicon film uncovered with the mask insulation film 308 are doped with phosphorus (those regions are referred to as "phosphorus-doped regions 315 and 316"). At this time, a voltage to accelerate doping and the thickness of the mask constituted by an oxide film are optimized to prevent phosphorus from substantially penetrating through the mask insulation film 308. Although it is not essential that the mask insulation film 308 is an oxide film, an oxide film is preferable because it does not contaminate an active layer even if it is in direct contact therewith.

The dose of phosphorus is preferably in the range from about $1 \times 10^{14}$ to about $1 \times 10^{15}$ ions/cm$^2$. In this embodiment, $5 \times 10^{14}$ ions/cm$^2$ were dosed with an ion doping apparatus.

The acceleration voltage for the ion doping was 10 kV. An acceleration voltage of 10 kV substantially prevents phosphorus from passing through an oxide mask of 1000 Å.

Figure 12C:
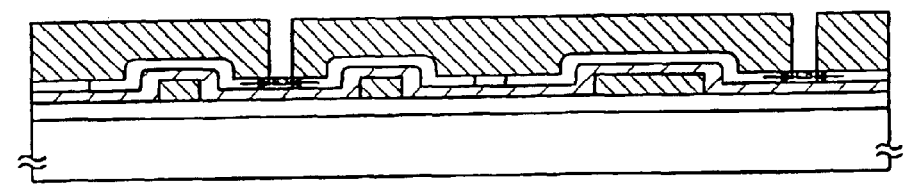

Referring to FIG. 12C, thermal annealing is then carried out for a duration in the range from one to 12 hours (12 hours in this embodiment) in a nitrogen atmosphere at 600° C. to getter nickel elements. As indicated by the arrow in FIG. 12C, this causes nickel to be attracted by phosphorus. At a temperature of 600° C., while substantially no phosphorus atom moves in the film, nickel atoms can move a distance of about 100 μm or more. This indicates that phosphorus is one of the most suitable elements for gettering nickel.

Figure 12D:
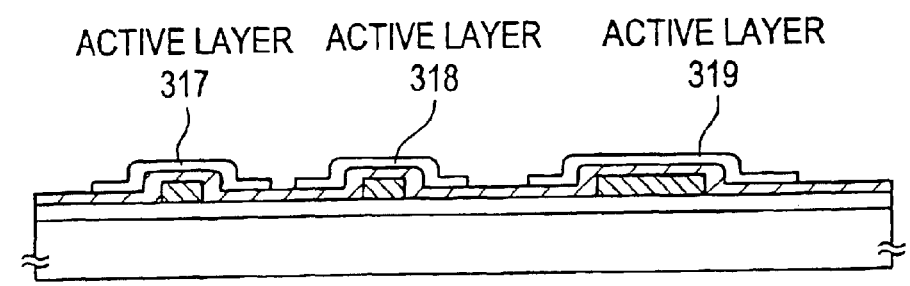

Then, the polycrystalline silicon film is patterned. This is carried out to eliminate the phosphorus-doped regions 315 and 316, i.e., the regions from which nickel has been gettered. Thus, active layers 317 through 319 constituted by polycrystalline silicon films including substantially no nickel element are provided. The active layers 317 through 319 constituted by polycrystalline silicon films thus obtained will serve as active layers of TFTs later (FIG. 12D).

When the active layers 317 through 319 are formed, a second gate insulation film constituted by an insulation film including silicon is formed on them. A heating process is then carried out at a temperature in the range from 800 to 1100° C. (preferably in the range from 950 to 1050° C.) in an oxidized atmosphere to form thermal oxide films (not shown) at the boundaries between the active layer and the first gate insulation film and between the active layer and the second gate insulation film.

The heating process to getter the catalytic element (catalytic element gettering process) may be carried out at this stage. In this case, a halogen is included in the processing atmosphere of the heating process to take advantage of the effect of the halogen to getter metal elements. In order to sufficiently utilize the gettering effect of the halogen, the heating process is performed at a temperature higher than 700° C. At a temperature lower than this, halides are difficult to decompose in the processing atmosphere, which can disable the gettering effect. Typically, one or a plural kinds of gases selected from among compounds including a halogen such as Cl, HF, NF$_3$, HBr, Cl$_2$, ClF$_3$, BCl$_2$, F$_2$ and Br$_2$ may be used as gases including a halogen in this case. For example, when HCl is used at this step, it is assumed that nickel in the active layers is gettered by the action of chlorine to become volatile nickel chloride which escapes into the atmosphere to be removed. The process of gettering the catalytic element utilizing a halogen may be performed after the removal of the mask insulation film 308 and before the patterning of the active layers. The catalytic element gettering process may be performed after the patterning of the active layers. Any combination of gettering process may be employed.

Next, a metal film mainly composed of aluminum (not shown) is formed and patterned to form an original form of gate electrodes to be described later. This embodiment uses an aluminum film including 2% of scandium by weight.

Figure 13A:
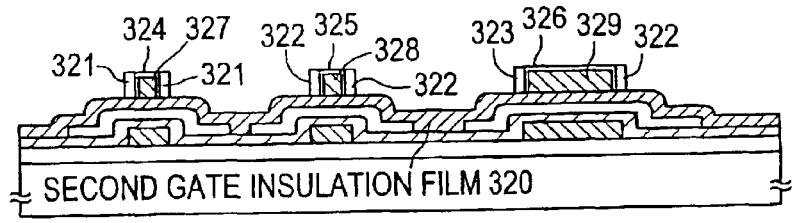
FIGS. 13A through 13D are views showing a method for fabricating a semiconductor device or semiconductor display according to the invention.
Figure 13B:
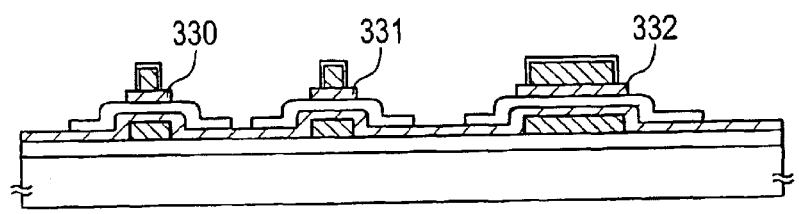

Next, the technique disclosed in JP-A-7-135318 is used to form porous anodic oxide films 321 through 323, nonporous anodic oxide films 324 through 326 and gate electrodes 327 through 329 (FIG. 13A).

When the state shown in FIG. 13A is thus achieved, a second insulation film 320 is etched using the gate electrodes 327 through 329 and the porous anodic oxide films 321 through 323 as masks. Then, the porous anodic oxide films 321 through 323 are removed to achieve the state shown in FIG. 13B. In FIG. 13B, 330 through 332 represent second gate insulation films obtained after the process.

Figure 13C:
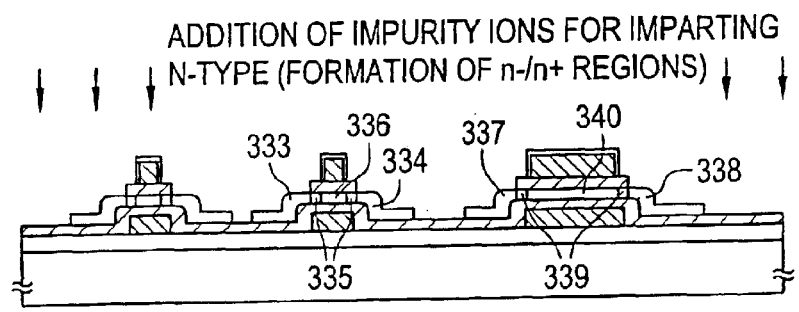

Referring to FIG. 13C, a step of carried out to add an impurity element that provides one conductivity. As the impurity element, P (phosphorus) or As (arsenic) may be used for an n-channel TFT and B (boron) or Ga (gallium) may be used for a p-channel TFT.

In this embodiment, the addition of impurities to form n-channel and p-channel TFTs is carried out at two separate steps.

First, the impurity to form n-channel TFTs is added. The first step of adding an impurity (P (phosphorus) is used in this embodiment) is performed at a high acceleration voltage of about 80 keV to form n− regions. The n− regions are adjusted such that they have a P ion concentration in the range from $1 \times 10^{18}$ atoms/cm$^3$ to $1 \times 10^{19}$ atoms/cm$^3$.

Further, the second step of adding an impurity is performed at a low acceleration voltage of about 10 keV to form n$^+$ regions. At this time, the gate insulation films serve as masks because the acceleration voltage is low. The n+ regions are adjusted such that they have a sheet resistance of 500 Ω or less (preferably 300 Ω or less).

The above steps form a source region 333, a drain region 334, a low concentration impurity region 335 and a channel formation region 336 of an n-channel TFT that forms a part of a CMOS circuit. They also define a source region 337, a drain region 338, low concentration impurity region 339 and a channel formation region 340 of an n-channel TFT that constitutes a pixel TFT (FIG. 13C).

In the state shown in FIG. 13C, the active layer of a p-channel TFT that forms a part of the CMOS circuit has the same configuration as that of the active layer of the n-channel TFT.

Figure 13D:
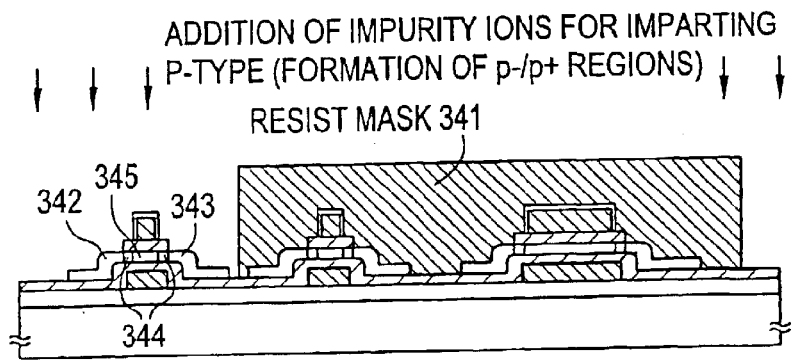

Next, as shown in FIG. 13D, a resist mask 341 is provided such that it covers the n-channel TFT to add impurity ions that provide the p-type properties (boron is used in this embodiment).

This step is also separated into two sub-steps similarly to the impurity adding step described above. Since the n-channel type must be inverted into the p-channel type, B (boron) ions are added in a concentration several times higher than the above-described doping concentration of P ions.

This forms a source region 342, a drain region 343, a low concentration impurity region 344 and a channel formation region 345 of a p-channel TFT that forms a part of the CMOS circuit (FIG. 13D).

The impurity ions are then activated through a combination of furnace annealing, laser annealing, lamp annealing and the like. At the same time, damages on the active layers caused by the doping steps are recovered.

Figure 14A:
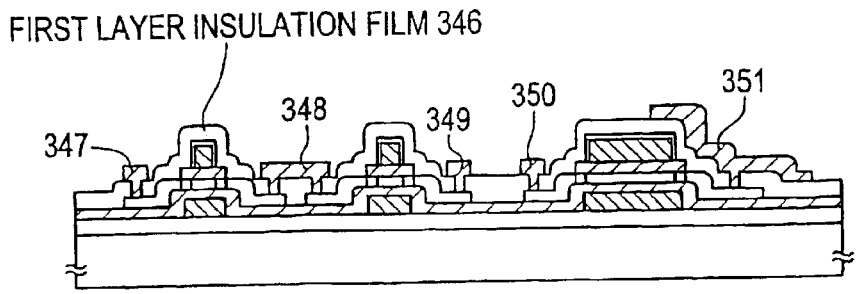
FIGS. 14A through 14C are views showing a method for fabricating a semiconductor device or semiconductor display according to the invention.

Referring to FIG. 14A, a multi-layer film comprising a silicon oxide film and a silicon nitride film is formed as a first layer insulation film 346; contact holes are formed; and source and drain electrodes 347 through 351 are formed thereafter to achieve the state shown in FIG. 14A. Organic resin may be used as the layer insulation film 346.

When the state shown in FIG. 14A is achieved, a second layer insulation film 352 constituted by an organic resin film is formed to a thickness in the range from 0.5 to 3 μm. Polyimide, acrylic, polyimideamide or the like is used as the organic resin film. Advantages of an organic resin film includes the facts that it can be easily formed; it can be easily formed with a great thickness; it allows a reduction of parasitic capacitance because of its low relative dielectric constant; and it has excellent planarity. Organic resin films of types other than that described above.

A black matrix constituted by a light-blocking film may be used as the second layer insulation film 352. A titanium film, a resin film including a black pigment or the like may be used as the black matrix.

A contact hole is then formed in the second layer insulation film 352, and a pixel electrode 353 is formed to a thickness of 120 nm. A transparent conductive film such as an ITO is used as a conductive film that constitutes the pixel electrode 353 because the present embodiment is an example of a transmission type active matrix liquid crystal display.

Next, the substrate as a whole is heated for one to two hours in a hydrogen atmosphere at 350° C. to hydrogenate the element as a whole, which compensates for dangling bonds in the films (especially in the active layers). A CMOS circuit and a pixel matrix circuit can be thus fabricated on the same substrate through the above steps.

A description will now be made on steps for fabricating an active matrix liquid crystal display based on an active matrix substrate fabricated through the above steps.

Figure 14B:
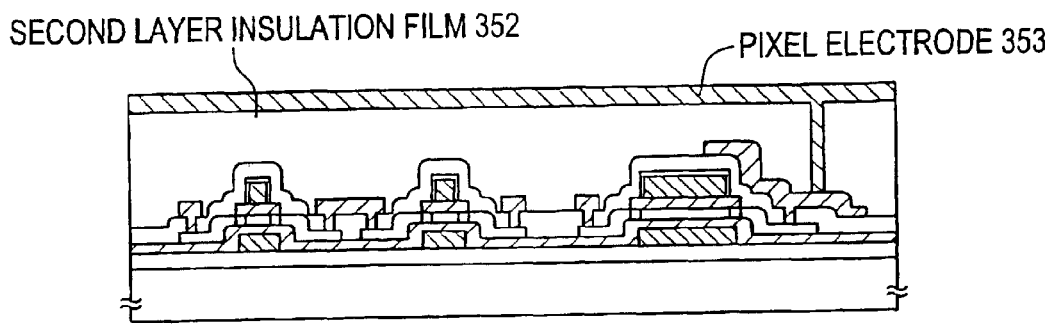

An alignment film 354 is formed on an active matrix substrate in the state shown in FIG. 14B. In this embodiment, polyimide is used for the alignment film 354. Then, a counter substrate is prepared. The counter substrate is formed by a glass substrate 355, a transparent conductive film 356 and an alignment film 357.

In this embodiment, polyimide is used for the alignment film. A rubbing process is performed after the alignment film is formed. In this embodiment, polyimide having a relatively small pretilt angle is used.

The active matrix substrate and counter substrate obtained through the above steps are put together with a sealing material and a spacer (both of which are not shown) interposed therebetween at a well-known cell assembly step. Thereafter, liquid crystal 358 is injected between those substrates and is completely sealed with a sealing agent (not shown). In this embodiment, nematic liquid crystal is used as the liquid crystal 358.

Figure 14C:
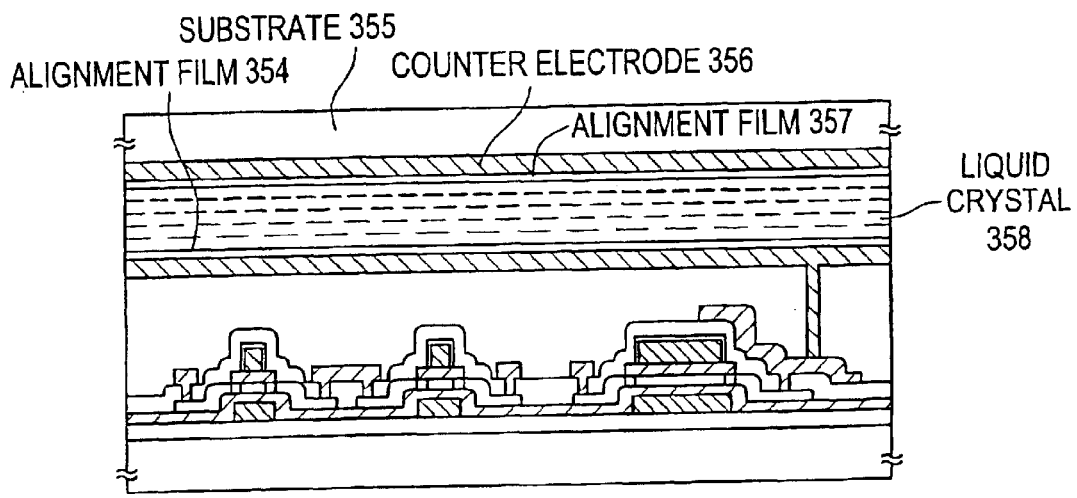

This completes a transmission type active matrix liquid crystal display as shown in FIG. 14C.

[Findings on Crystal Structure of Active Layer]

An active layer formed through the above-described fabrication steps has a crystal structure in which a plurality of bar-shaped or planar bar-shaped crystals are aligned substantially in parallel with each other with regularity in a particular direction when viewed microscopically. This can be easily confirmed through observation using TEM (transmission electron microscopy).

Figure 38A:
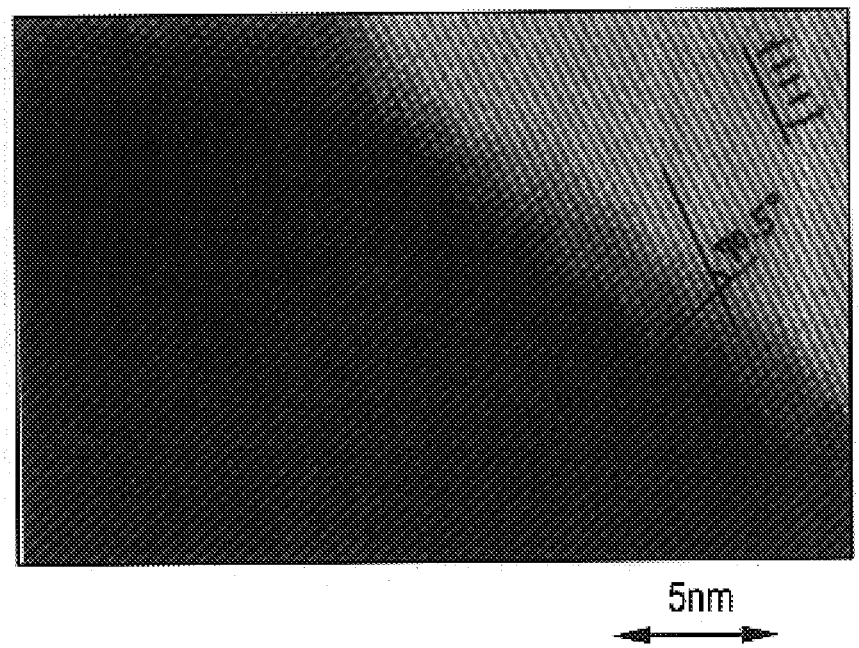
FIGS. 38A and 38B are TEM photographs showing structures of grain boundaries in semiconductor thin films.

FIG. 38A shows an HR-TEM photograph of a grain boundary between bar-shaped or planar bar-shaped crystals at a magnification of 8 millions. In the context of this specification, the term "grain boundary" is defined as a grain boundary formed at the boundary where bar-shaped or planar bar-shaped crystals are in contact with each other. Therefore, it is considered different from grain boundaries in a macroscopic sense such as those formed where laterally grown regions collide with each other.

The above-described HR-TEM (high resolution transmission electron microscopy) is a technique for evaluating atomic and molecular arrangements of a sample utilizing interference of transmitted electrons and elastically scattered electrons that occurs when an electron beams vertically impinges upon the sample.

HR-TEM allows an arrangement of crystal lattices to be observed as a lattice pattern. Therefore, the state of bonding between atoms at a grain boundary can be inferred through an observation of the grain boundary. While a lattice pattern appears as a pattern of white and black stripes, it represents a difference in contrast and does not indicate the positions of atoms.

FIG. 38A shows a typical TEM photograph taken on a crystalline silicon film (laterally grown region) obtained according to the invention in which two different crystal grains contact with each other to form a grain boundary. At this time, the two crystal grains are substantially at a {110}-orientation relative to each other, although they have a slight shift of the crystal axis.

As will be described later, as a result of an examination on a plurality of crystal grains, it was found that most of them were substantially at the {110}-orientation from X-ray diffraction or electron beam diffraction. Although it is assumed that (011)-planes and (200)-planes should be included when a multiplicity of crystal grains are observed, such equivalent planes are collectively referred to as "{110}-planes".

As shown in FIG. 38A, a lattice pattern associated with a {111}-plane is observed in the plane. A lattice pattern associated with a {111}-plane is a lattice pattern which reveals a {111}-plane in a section of the crystal grain when it is cut along the lattice pattern. The association between a lattice pattern and a plane can be simply identified from the intervals between lattice patterns, The difference in the appearance of lattice patterns in FIG. 38A is attributable to slight differences between the inclinations of the crystal grains. Specifically, their lattice patterns appear differently because when an electron beam is set to vertical impinge upon the crystal face of one of the crystal grain, the electron beam impinges upon the other crystal grain at a slight angle.

The lattice pattern associated with a {111}-plane will now be discussed. The lattice pattern associated with a {111}-plane of the crystal grain that appears in white in FIG. 38A (upper side) intersects with the lattice pattern associated with a {111}-plane of the crystal grain that appears in black (lower side) at an angle of about 70°.

Such a crystal structure (strictly, a structure of a grain boundary) indicates that the two different crystal grains are bonded with each other at the grain boundary at a very high level of matching. Specifically, the crystal lattices are continuous at the grain boundary, which scarcely results in any trap level attributable to a lattice defect or the like. In other words, the crystal lattices are continuous at the grain boundary.

Figure 38B:
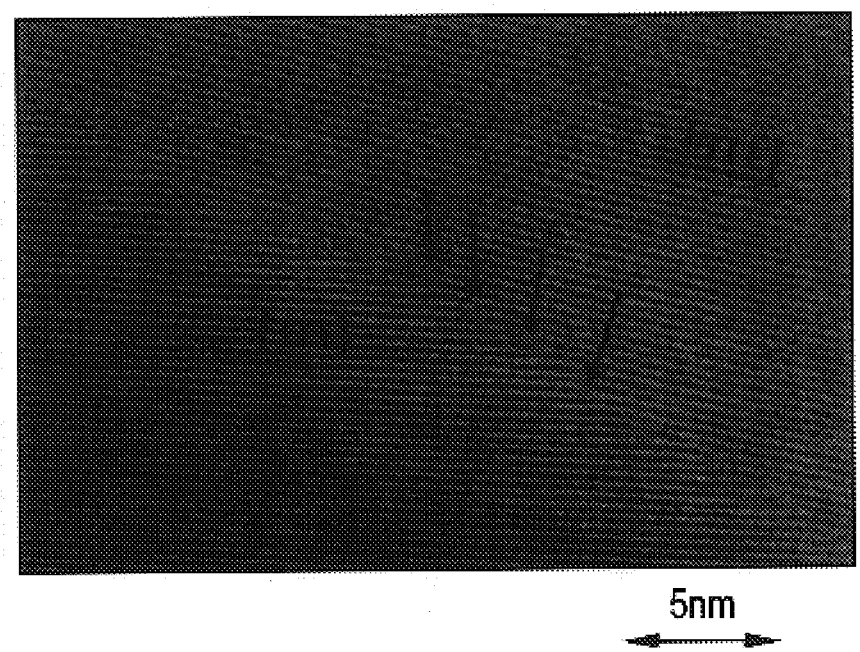

FIG. 38B shows an HR-TEM photograph of a conventional polysilicon film as a reference. In FIG. 38B, the crystal face has no regularity as described later, and the orientation is not dominated by {110}-planes. However, an observation is made here on crystal grains on which lattice patterns associated with {111}-planes appear for comparison with FIG. 38A.

A close observation of FIG. 38B reveals many locations at the grain boundary where the lattice patterns are discontinuous. In such locations, dangling bonds (which can be regarded as lattice defects) exist which are highly likely to act as trap levels to hinder the movement of carriers.

Dangling bonds as shown in FIG. 38B also certainly exist in a crystalline silicon film obtained according to the fabrication method of the present embodiment, which is unavoidable because the crystalline silicon film according to the fabrication method of this embodiment is polycrystalline. However, a close TEM observation over a wide range of the crystalline silicon film according to the fabrication method of this embodiment has revealed that substantially no dangling bond as described above exist.

As far as the applicant has studied, continuity of crystal lattices was observed 90% (typically 95%) or more of grain boundaries, and substantially no dangling bond as shown in FIG. 38B was observed. This also indicates that the crystalline silicon film according to the fabrication method of this embodiment can be regarded as a semiconductor film different from conventional high temperature polysilicon.

Figure 39A:
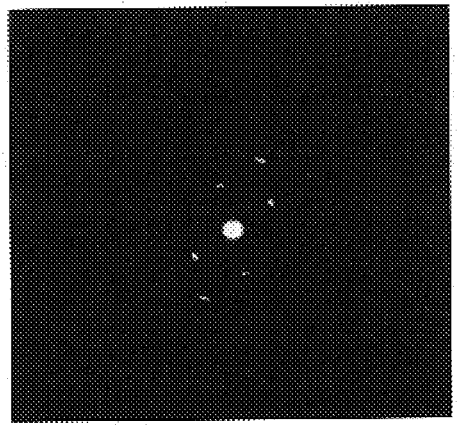
FIGS. 39A and 39B are photographs showing electron beam diffraction patterns of semiconductor thin films.
Figure 39B:

FIGS. 39A and 39B show the results of an examination utilizing electron beam diffraction on a crystalline silicon film according to the fabrication method of this embodiment. FIG. 39A shows a typical electron beam diffraction pattern on the crystalline silicon film according to the fabrication method of this embodiment, and FIG. 39B shows a typical electron beam diffraction pattern on a conventional high temperature polysilicon film as a reference.

The measurement illustrated in FIGS. 39A and 39B can be regarded as a collection of information in a macroscopic region unlike that available from the levels of lattice patterns because the spots irradiated by electron beams had a diameter of about 1.5 $\mu$m.

FIG. 39A relatively clearly shows diffraction spots associated with <110> incidence and Vindicates that the crystal axis is a <110>-axis (i.e., the crystal face is a {110}-plane).

Each of the spots slightly spreads in the form of a concentric circle, and this is assumed to be attributable to a certain degree of distribution of rotational angle around the crystal axis. The degree of the spread is estimated at 5° or less from the pattern.

The electron beam diffraction pattern shown in FIG. 39B indicates no clear regularity of the diffraction spots and indicates that the spots are at substantially random orientations. That is, it is expected that crystals at plane orientations other than {110}-planes irregularly exist.

As apparent from those results, almost all of the crystal grains of the crystalline silicon film according to the fabrication method of this embodiment are substantially oriented along {110}-planes. The electron beam diffraction pattern shown in FIG. 39A can be achieved only when 70% or more (preferably 90% or more) of crystal grains are oriented along {110}-planes.

The inventors caused X-ray diffraction according to the technique disclosed in JP-A-7-321339 to calculate the orientation ratio of the crystalline silicon film of this embodiment. According to the publication, an orientation ratio is defined based on a calculation method as expressed by Equation 1 below.

$$\{220\}\text{-orientation abundance ratio} = 1 \text{ (constant)}$$

$$\{111\}\text{-orientation abundance ratio} =$$

$$\text{strength of }\{111\}\text{ of a sample relative to }\{220\} \div$$

$$\text{strength of }\{111\}\text{ of power relative to }\{220\}$$

$$\{311\}\text{-orientation abundance ratio} =$$

$$\text{strength of }\{311\}\text{ of a sample relative to }\{220\} \div$$

$$\text{strength of }\{311\}\text{ of power relative to }\{220\}$$

$$\{220\}\text{ orientation ratio} =$$

-continued

{220}-orientation abundance ratio ÷

({220}-orientation ratio +

{111}-orientation ratio + {311}-orientation ratio)

As a result of the X-ray diffraction, peaks corresponding to {220} (which are obviously equivalent to {110}-planes) appeared with the highest intensity, which indicated that {110}-planes are obviously in the major orientation and that the orientation ratio is 0.7 or more (typically 0.9 or more).

It is apparent from the above that the crystalline silicon film according to the invention and the conventional polysilicon film have completely different crystal structures (crystal configurations). The crystalline silicon film according to the fabrication method of this embodiment can be regarded as a quite novel semiconductor film in this respect.

The applicant refers to a crystalline silicon film according to the invention having the crystal structure and features as described above as "continuous grain silicon: CGS)".

When a semiconductor thin film is formed, it is very much advantageous to perform an annealing step at a temperature equal to or higher than a crystallizing temperature as in the present embodiment in reducing defects in the crystal grains, which will be described below.

Figure 40A:
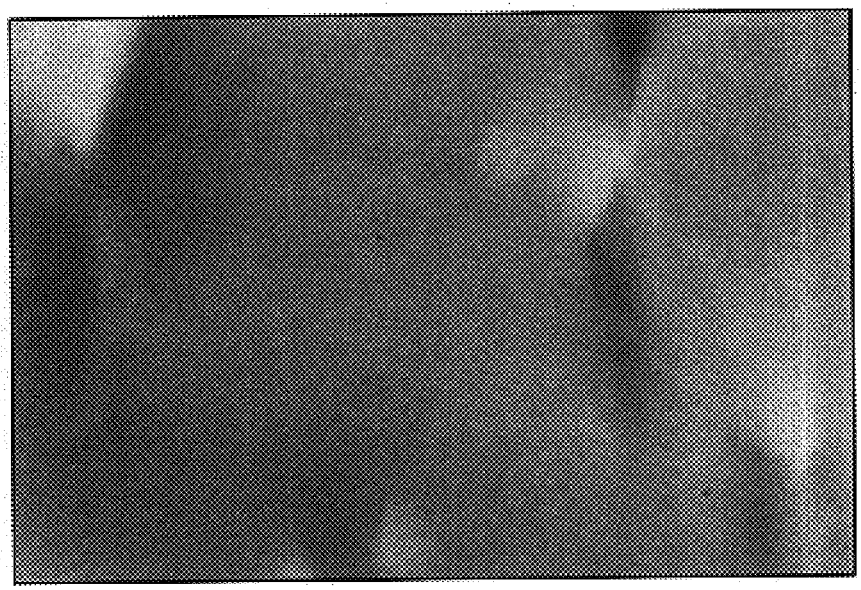
FIGS. 40A and 40B are TEM photographs showing crystal grains in semiconductor thin films.

FIG. 40A shows a TEM photograph at a magnification of one million on a crystalline silicon film fabricated according to this embodiment. Substantially no defect attributable to a stacking fault or dislocation is seen in the crystal grains, which indicates very high crystallinity. This equally applies to the entire surface of the film, and it is possible to reduce the number of defects to a degree that can be substantially regarded zero, although it is presently difficult to reduce the number of defects to zero.

Specifically, defects in the crystal grains of the crystalline silicon film shown in FIG. 40A have been reduced to a substantially negligible degree, and the film can be regarded monocrystalline or substantially monocrystalline because the grain boundaries can not act as barriers against carrier movement because of high continuity.

Figure 40B:
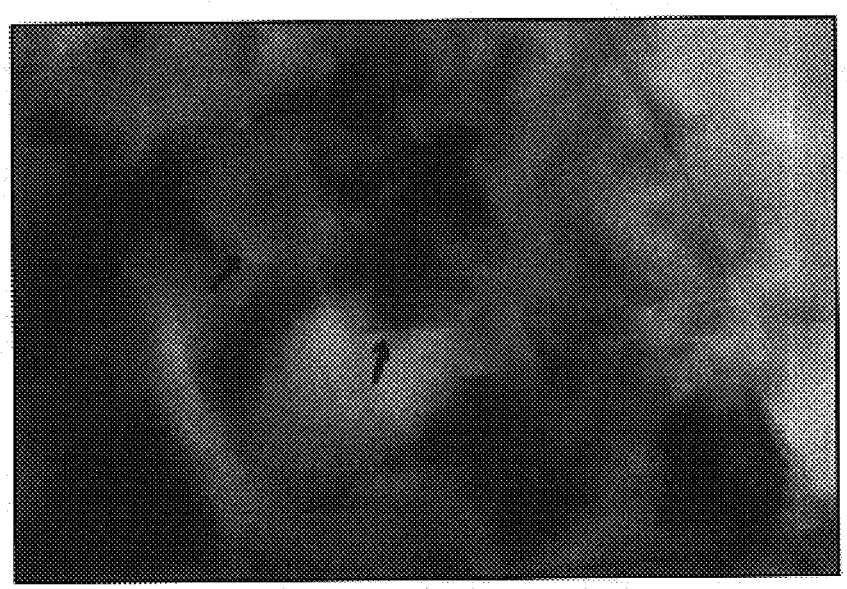

FIG. 40B shows a TEM photograph at a magnification of one million on a crystalline silicon film which has been subjected to steps up to gettering. A multiplicity of defects as indicated by the arrows can be seen in the crystal grains (the black and white regions appear because of a difference in contrast). Such defects are primarily stacking faults that are disorder of stacking of atoms at silicon crystal lattice planes, although dislocation may be included.

As described above, the crystalline silicon films shown in FIGS. 40A and 40B have substantially the same level of continuity at grain boundaries, but there is a significant difference between the numbers of defects in their crystal grains. Such a difference in the numbers of defects is a major reason for the fact that the crystalline silicon film according to the fabrication method of this embodiment has much higher electrical characteristics than those of the crystalline silicon film shown in FIG. 40B.

This phenomenon considered attributable to the fact that extra silicon atoms generated during thermal oxidation of the crystalline silicon film move to defects to contribute to generation of Si—Si bonds significantly. This concept is known as a reason for the fact that a high temperature polysilicon film has a small number of defects in its crystal grains.

The applicant also has an idea of a model in which a heating process at a temperature exceeding a crystallizing temperature (typically in the range from 700 to 1100° C.) is performed to rigidly secure a crystalline silicon film to an underlying film therefor to improve the tightness of the contact between them, thereby eliminating defects.

There is a difference by a factor of ten between the thermal expansion coefficients of a crystalline silicon film and a silicon oxide film to serve as an underlying film. Therefore, when an amorphous silicon film has metamorphosed into a crystalline silicon film, the crystalline silicon film is subjected to a very great stress when it is cooled down.

The crystalline silicon film according to the fabrication method of this embodiment (FIG. 40A) is characterized in that it has a much smaller number of defects in the crystal grains than the crystalline silicon film before a heating process at a temperature equal to or higher than that required for the crystallizing step (FIG. 40B).

The difference in the number of defects appears as a difference in spin density at electron spin resonance (ESR) analysis. Presently, it has been identified that the spin density of a crystalline silicon film fabricated according to the fabrication steps of the first embodiment is at least $5 \times 10^{17}$ spins/cm$^3$ or less (preferably $3 \times 10^{17}$ spins/cm$^3$ or less). However, this measurement is close to the detection limit of existing measuring apparatuses, and it is therefore expected that the actual spin density is lower than this.

[Findings on Electrical Characteristics of TFTs]

TFTs according to the fabrication method of this embodiment have electrical characteristics comparative to those of MOSFETs utilizing single crystal silicon. The following data were obtained from TFTs prototyped by the inventors.

(1) The sub-threshold coefficient that serves as an index of the switching performance of a TFT (quickness of switching between on/off operations) is as small as 60 to 100 mV/decade (typically 60 to 85 mV/decade) for both of an n-channel TFT and a p-channel TFT.

(2) The field effect mobility that serves as an index of the operating speed of a TFT is as high as 100 to 250 cm$^2$/Vs (typically 120 to 200 cm$^2$/Vs) for an n-channel TFT and as high as 80 to 200 cm$^2$/Vs (typically 100 to 150 cm$^2$/Vs) for a p-channel TFT.

(3) The threshold voltage ($V_{th}$) that serves as an index of the driving voltage of a TFT is as low as −0.5 to 1.5 V for an n-channel TFT and as low as −1.5 to 0.5 V for a p-channel TFT.

It has been confirmed that the embodiment makes it possible to achieve quite excellent switching characteristics and high speed operation characteristics as described above.

[Findings on Circuit Characteristics]

A description will now be made on the frequency characteristics of a ring oscillator utilizing TFTs fabricated using semiconductor thin films according the fabrication method of this embodiment. A ring oscillator is a circuit which is inverted circuits having a CMOS structure connected into a ring having an odd number of stages and which is used to obtain a delay time at each stage constituted by an inverter circuit. The configuration used in the experiment was as follows.

Number of Stages: nine

TFT Gate Insulation Film Thickness: 30 nm and 50 nm

TFT Gate Length: 0.6 µm

As a result of an examination on the oscillation frequency of this ring oscillator, a maximum oscillation frequency of 1.04 GHz was achieved. A shift register which is one of TEGs of an LSI circuit was actually fabricated, and the operating frequency of the same was checked. As a result, an output pulse having an operating frequency of 100 MHz was obtained in a shift register circuit having 50 stages in which the gate insulation film thickness was 30 nm; the gate length was 0.6 μm; and the power supply voltage was 5 V.

Such astonishing data taken on the ring oscillator and shift register indicate that a TFT according to the invention has performance comparative or superior to that of an IGFET utilizing single crystal silicon.

[Finding on Relationship between TFT Characteristics and CGS]

The excellent TFT characteristics and circuit characteristics described above are primarily attributable to the fact that a semiconductor thin film having continuity between the crystal lattices at the grain boundaries is used as the active layer of a TFT. The reason for this will be discussed below.

Continuity between crystal lattices at a grain boundary is attributable to the fact that the grain boundary is a boundary referred to as "planar boundary". The definition of the term "planar boundary" in this specification follows the definition that appears in "Characterization of High-Efficiency Cast-Si Solar Cell Wafers by MBIC Measurement" by Ryuichi Shimokawa and Yutaka Hayashi, Japanese Journal of Applied Physics vol. 27, No. 5, pp. 751-758, 1988.

According to the above-mentioned article, planar boundaries include {111} twin crystal boundaries, {111} stacking faults, {221} twin crystal boundaries and {221} twist boundaries. Such planar boundaries are characterized in that they are electrically inactive. Specifically, since they do not act as traps that hinder the movement of carriers in spite of the fact that they are grain boundaries, they can be substantially regarded absent.

Especially, a {111} twin crystal boundary is referred to as "homologous boundary of Σ3", and a {221} twin boundary is referred to as "homologous boundary of Σ9". A Σ-value is a parameter that serves as an index of the degree of matching at a homologous grain boundary, and it is known that a grain boundary has a higher degree of matching, the smaller the Σ-value.

As a result of a close observation using TEM conducted by the applicant on a semiconductor thin film according to the fabrication method of this embodiment, it was revealed that most grain boundaries (90% or more and typically 95% or more) are homologous boundaries of Σ3, i.e., {111} twin crystal boundaries.

It is known that when both of two crystal grains have a plane orientation of {110} at a grain boundary formed between them, the grain boundary is a homologous boundary of Σ3 if θ=70.5° where θ represents the angle of a lattice pattern corresponding to a {111}-plane.

Therefore, at the grain boundary shown in the TEM photograph in FIG. 38A, the lattice patterns of the adjoining crystal grains are continuous at an angle of about 70°, and it can be therefore easily inferred that this grain boundary us a {111} twin crystal boundary.

A grain boundary corresponds to Σ9 when θ=38.9°, and other grain boundaries of this kind were also present.

Such a homologous grain boundary is formed only between crystal grains having the same plane orientation. That is, such homologous grain boundaries can be formed over a wide range in a semiconductor thin film according to the invention because the plane orientations are substantially aligned at {110}. This feature can never be available in other polysilicon films having irregular plane orientations.

Figure 41A:
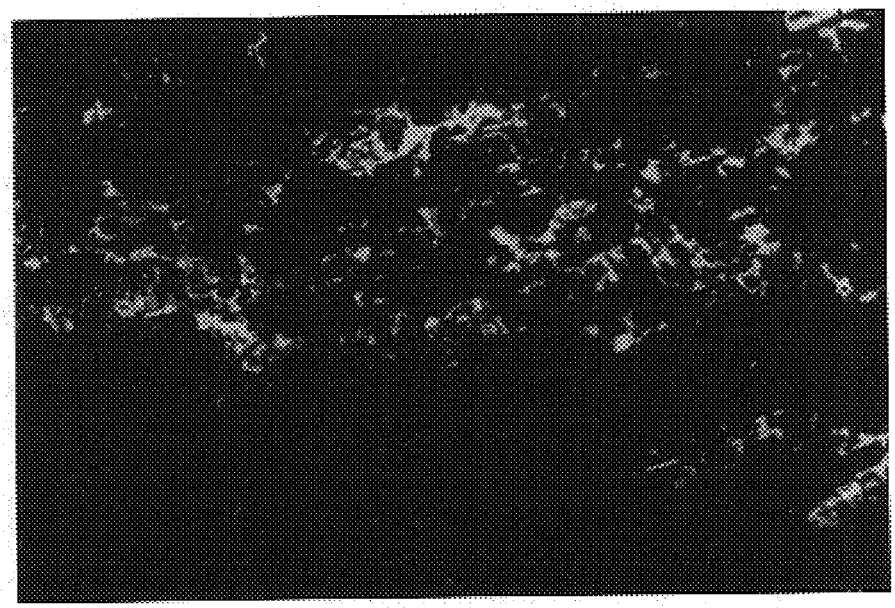
FIGS. 41A and 41B are TEM photographs showing dark field images of semiconductor thin films.

FIG. 41A shows a TEM photograph (dark field image) at a magnification of 15,000 of a semiconductor thin film according to the fabrication method of this embodiment. While there are regions which appear in white and regions which appear in black, regions which appear in the same color have the same orientation.

What is to be noted on FIG. 41 is the fact that regions which appear in white continuously gather at a considerable ratio to the dark field image having such a wide range. This means that crystal grains having the same orientation exist with a certain degree of directivity and that adjoining crystal grains have substantially the same orientation.

Figure 41B:
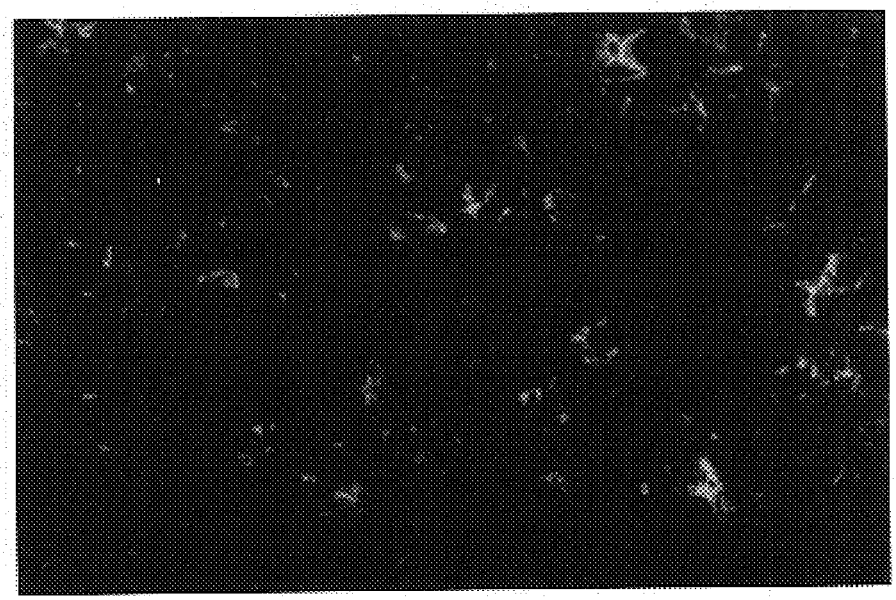

FIG. 41B shows a TEM photograph (dark field image) at a magnification of 15,000 of a conventional high temperature polysilicon film. Regions having the same plane orientation are dispersed in the conventional high temperature polysilicon film in which no aggregation having directivity is observed unlike FIG. 41A. This is considered attributable to the fact that adjoining crystal grains have completely irregular orientations.

Figure 42:
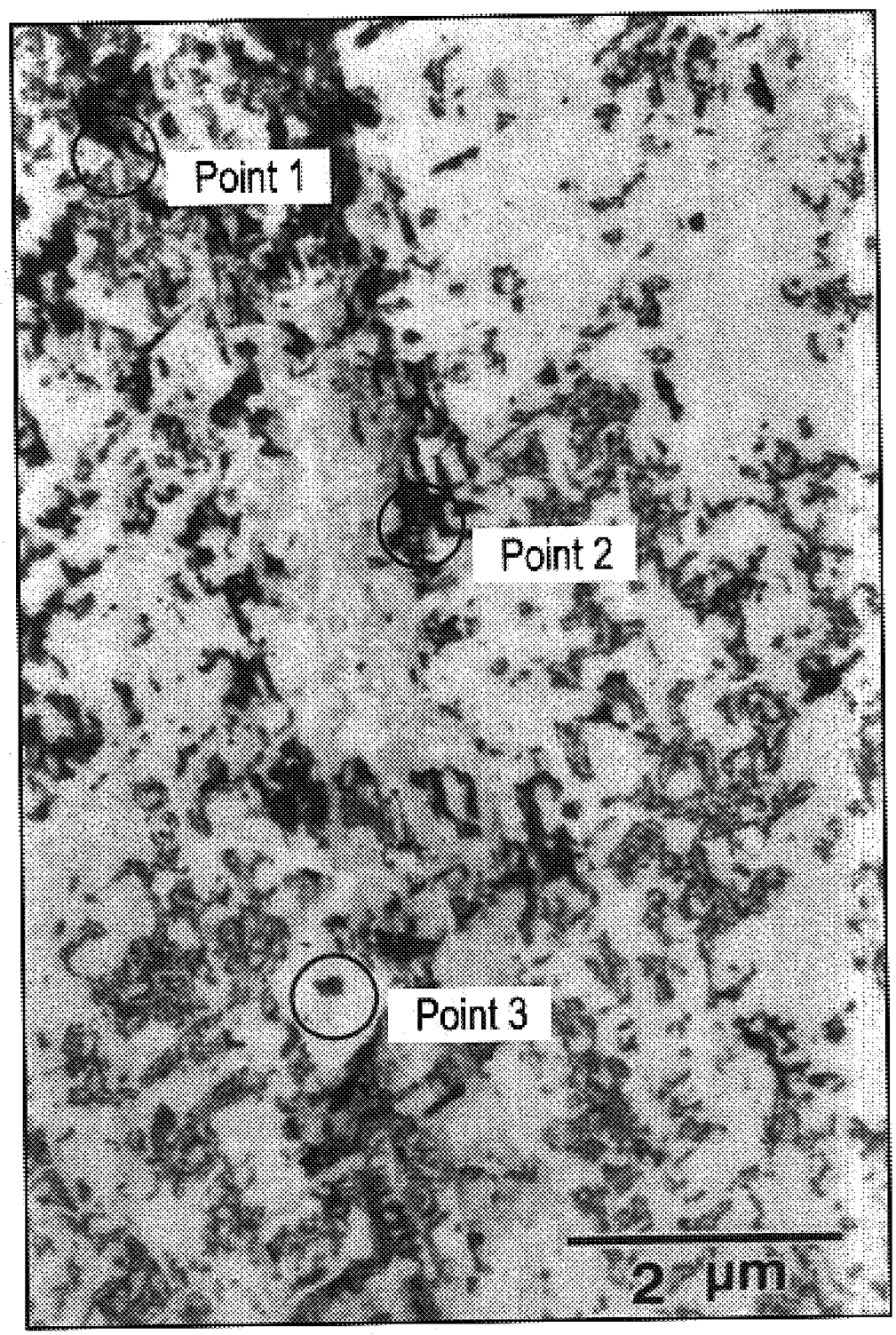
FIG. 42 is a TEM photograph showing a light field image of a semiconductor thin film.
Figure 43A:
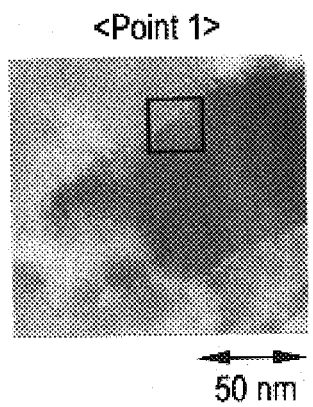
FIGS. 43A, 43B and 43C are TEM photographs showing the state of grain boundaries in a semiconductor thin films.
Figure 43B:
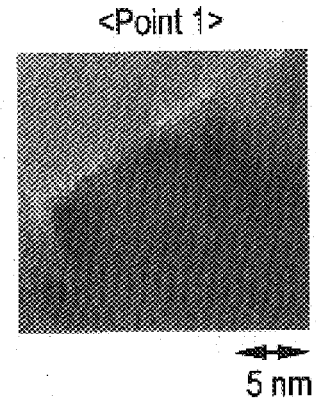
Figure 43C:
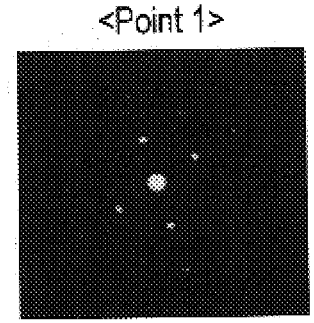

FIG. 42 shows a TEM photograph taken by observing the same location as in FIG. 41A in a light field. FIG. 43A shows a photograph at a magnification of 300,000 of the point 1 in FIG. 42, and FIG. 43B shows a photograph of the same at a magnification of two million. The region enclosed by a square in FIG. 43A corresponds to FIG. 43B. FIG. 43C shows an electron beam diffraction pattern (spot diameter: 1.7 μmφ) at the point 1.

Figure 44A:
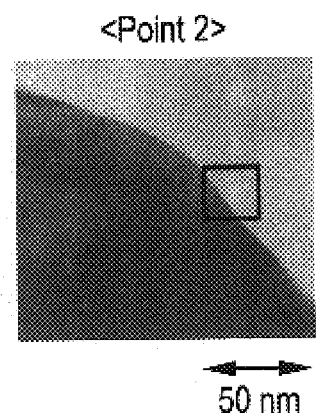
FIGS. 44A, 44B and 44C are TEM photographs showing the state of grain boundaries in a semiconductor thin films.
Figure 44B:
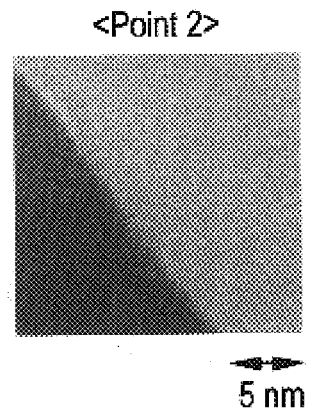
Figure 44C:
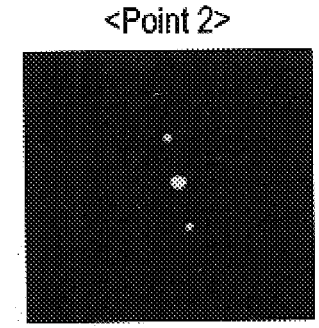
Figure 45A:
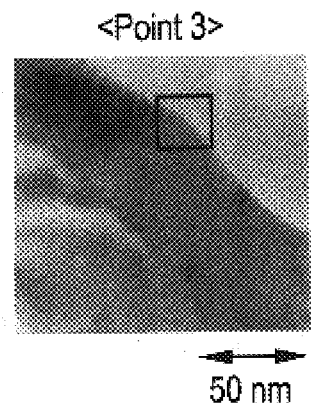
FIGS. 45A, 45B and 45C are TEM photographs showing the state of grain boundaries in a semiconductor thin films.
Figure 45B:
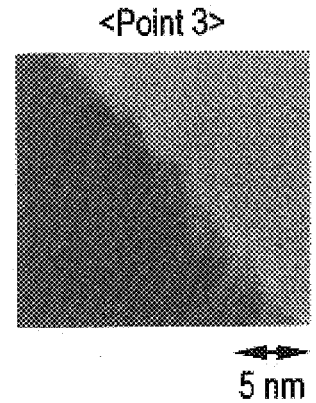
Figure 45C:
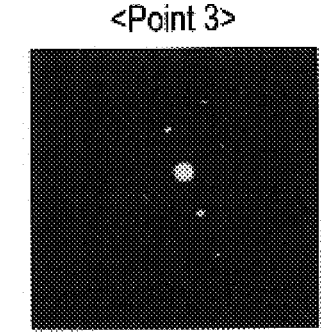

The points 2 and 3 were observed under the same conditions as for the point 1. FIGS. 44A, 44B and 44C show the result of the observation of the point 2, and FIGS. 45A, 45B and 45C show the result of the observation of the point 3.

Those results of observation indicate that continuity between crystal lattices is maintained at any grain boundary to form a planar boundary. After repeated observation and measurement conducted on many regions other than the measuring points illustrated here, the applicant confirmed that continuity between crystal lattices at grain boundaries is maintained in a region wide enough to fabricate a TFT.

A second embodiment of the invention will now be described.

Refer to FIGS. 15A and 15B. FIGS. 15A and 15B show inverter circuits as examples of semiconductor devices according to the invention. FIG. 15A shows an inverter circuit formed by two p-channel TFTs (PchTFT1 and PchTFT2) and one n-channel TFT (NchTFT), and FIG. 15B shows an inverter circuit formed by two p-channel TFTs (PchTFT1 and PchTFT2) and two n-channel TFTs (NchTFT1 and NchTFT2).

Referring to FIG. 15A, a back gate voltage $V_{BGP1}$ is applied to PchTFT1. A back gate voltage $V_{BGP2}$ is applied to PchTFT2. A back gate voltage $V_{BGN}$ is applied to NchTFT.

In the inverter circuit of the present embodiment shown in FIG. 15A, the back gate voltages are controlled such that a relationship expressed by $V_{thP1} > V_{thP2}$ exists between a threshold voltage $V_{thP1}$ of PchTFT1 and a threshold voltage $V_{thP2}$ of PchTFT2. This makes it possible to reduce the power consumption of the inverter circuit.

In the inverter circuit of the present embodiment shown in FIG. 15B, a back gate voltage $V_{BGP1}$ is applied to PchTFT1. A back gate voltage $V_{BGP2}$ is applied to PchTFT2. A back gate voltage $V_{BGN1}$ is applied to NchTFT1. A back gate voltage $V_{BGN2}$ is applied to NchTFT2.

In the inverter circuit of the present embodiment shown in FIG. 15B, the back gate voltages are controlled such that relationships expressed by $|V_{thP1} > V_{thP2}|$ and $|V_{thN1} < V_{thN2}|$ exist between the threshold voltage $V_{thP1}$, $V_{thP2}$, $V_{thN1}$ and $V_{thN2}$ of PchTFT1, PchTFT2, NchTFT1 and NchTFT2, respectively. This makes it possible to reduce the power consumption of the inverter circuit.

The first embodiment or third or fourth embodiment to be described later may be referred to for the configuration of the TFTs forming the inverter circuits of the present embodiment.

A third embodiment of the invention will now be described.

Figure 16:
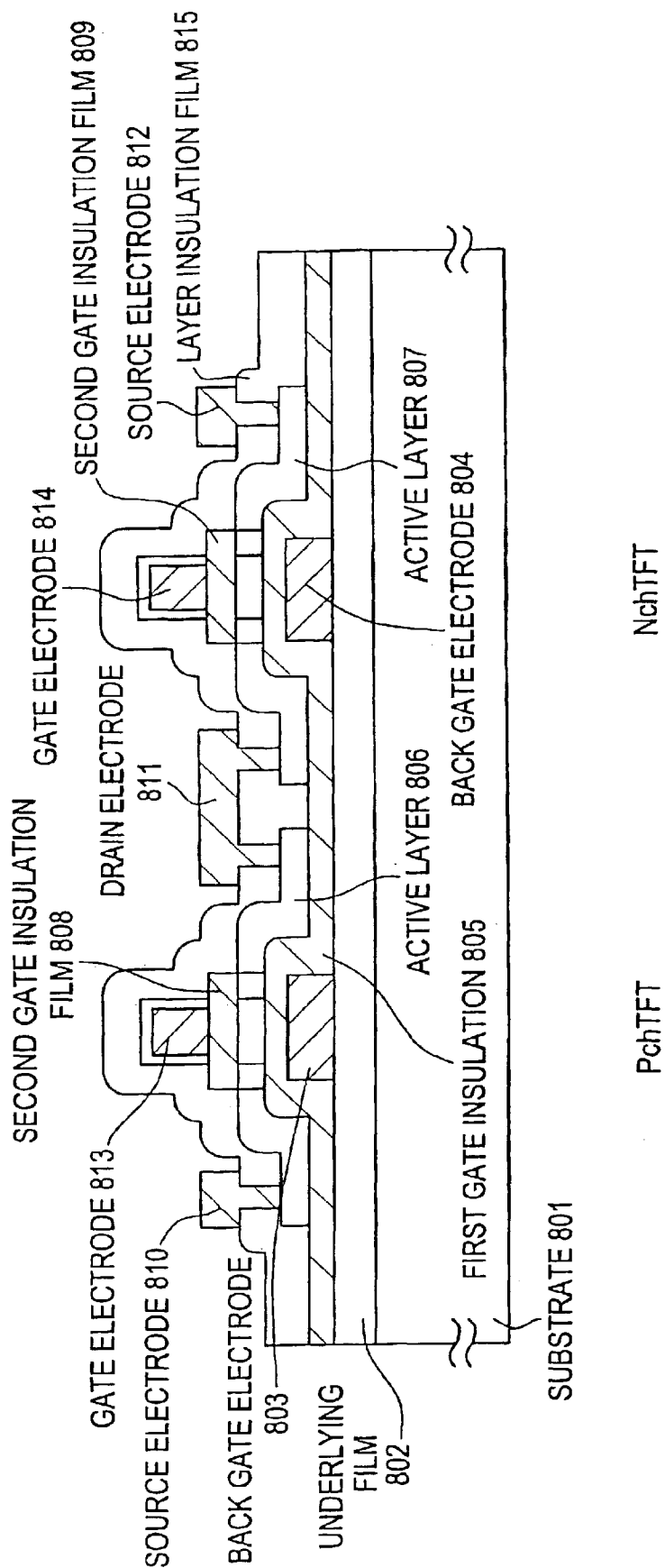
FIG. 16 illustrates an embodiment of a semiconductor device according to the invention.

Refer to FIG. 16 which shows a semiconductor device according to the present embodiment. In FIG. 16, 801 represents a substrate for which an insulated substrate such as a glass substrate or quartz substrate is used; 802 represents an underlying film; 803 and 804 represent back gate electrodes; 805 represents a first gate insulation film; 806 and 807 represent semiconductor active layers comprising a source region, a drain region, a low concentration impurity region and a channel formation region; 808 and 809 represent second gate insulation films; 810 through 812 represent source and drain electrodes; 813 and 814 represent gate electrodes; and 0.815 represents a layer insulation film.

The back gate electrodes 803 and 804 are designed such that an arbitrary voltage can be applied thereto.

In the semiconductor device of the present embodiment, the configuration of the back gate electrodes 803 and 804 is different from that in the semiconductor device described above as a mode for carrying out the invention in that the back gate electrodes 803 and 804 are formed only under the channel formation regions of the active layers. The structure is otherwise is the same as the semiconductor device described above as a mode for carrying out the invention.

The semiconductor device of this embodiment can be fabricated by the fabrication method described in the first embodiment.

A fourth embodiment of the invention will now be described.

Refer to FIG. 17. FIG. 17 shows an active matrix liquid crystal display as a semiconductor display according to the present embodiment. The semiconductor display according to this embodiment has a structure different from that of the semiconductor display of the first embodiment. Specifically, the back gate electrodes of pixel TFTs are larger than the active layers of the pixel TFTs and have a floating structure. This prevents light from impinging upon the pixel TFTs from the rear surface.

In the semiconductor display of this embodiment, the back gate electrodes have a configuration from that of the semiconductor device described above as a mode for carrying out the invention and are formed only under the channel formation regions of the active layers.

The structure is otherwise the same as that of the semiconductor display of the first embodiment.

A fifth embodiment of the invention will now be described.

According to the present embodiment, in a semiconductor device or semiconductor display as described in the first through fourth embodiments, not only the threshold voltages of TFTs are controlled to operate a circuit accurately, but also the threshold voltages of TFTs forming a circuit which is not operating are controlled to minimize the drain current when no voltage is applied to the gate electrodes.

Figure 28:
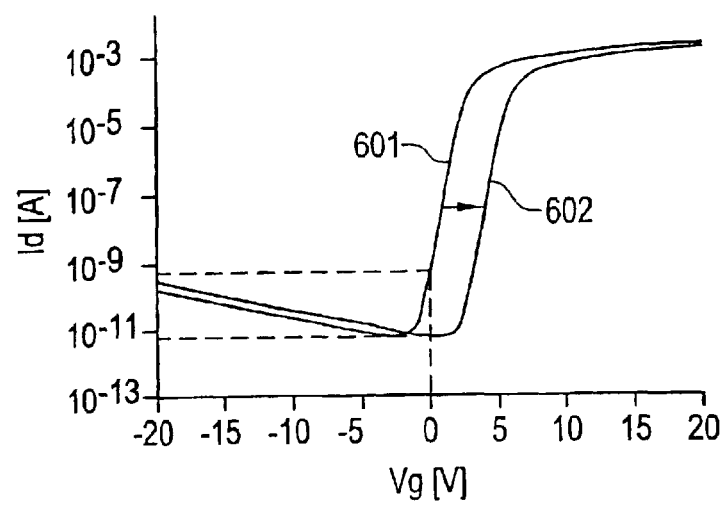
FIG. 28 is an Id-Vg curve for describing control over the threshold voltage of a TFT in a semiconductor device and a semiconductor display according to the invention.

Refer to FIG. 28. FIG. 28 shows an Id-Vg curve of an n-channel TFT. 601 represents the characteristics of the n-channel TFT with no voltage applied to the back gate electrode thereof, and 602 represents the characteristics of the n-channel TFT with a negative voltage applied to the back gate electrode. In a state in which no voltage is applied to the back gate electrode, the total drain current is large when no voltage is applied to the gate electrode. If a negative voltage is applied to the back gate electrode, the threshold voltage is shifted to the right (in the positive direction). As a result, the total drain current that flows when no voltage is applied to the gate electrode becomes smaller than that in a state in which no voltage is applied to the back gate electrode. Therefore, power consumption can be reduced by applying a back gate voltage to TFTs forming a circuit which is not in operation to change the threshold voltages thereof. The threshold voltage of a p-channel TFT can be also changed similarly to reduce the total drain current.

Figure 29:
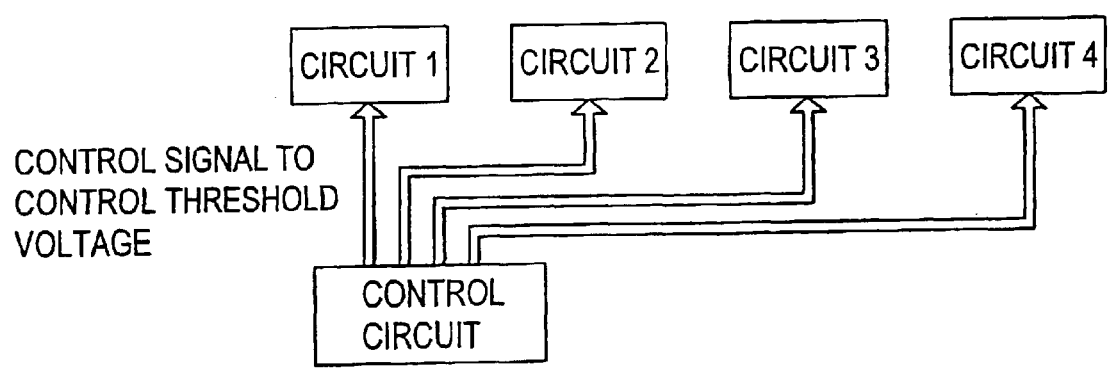
FIG. 29 is a block diagram of an embodiment of a semiconductor device according to the invention having a plurality of circuits.

FIG. 29 shows a semiconductor device having a plurality of circuits. In such a case, a control circuit transmits a control signal (back gate voltage) to control the threshold voltages of the TFTs forming circuits 1 through 4 and applies a back gate voltage to reduce the total drain current as described above to any circuit among the circuits 1 through 4 which is not in operation.

A sixth embodiment of the invention will now be described.

The present embodiment is an application of the invention to an active matrix liquid crystal display. FIGS. 18A and 18B show an example of an active matrix liquid crystal display configured by forming a plurality of thin film transistors on a substrate having an insulated surface. The present embodiment represents simultaneous fabrication of one pixel of a pixel matrix circuit and a CMOS circuit which is a basic circuit of a driving circuit (logic circuit or the like). Although each of the illustrated p-channel and n-channel thin film transistors has one gate electrode, it is possible to similarly fabricate a CMOS circuit constituted by thin film transistors having a plurality of gate electrodes such as double gate type and triple gate type transistors.

Steps for fabricating the active matrix liquid crystal display of this embodiment will now be described with reference to FIG. 18A. A film is formed on a glass substrate 1701 and patterned to form a back gate electrode 1702. While FIG. 18A shows a patterned back gate electrode, a film thus formed may be used as it is to serve as a back gate electrode without patterning in consideration to reduction of the number of steps. The back gate electrode 1702 may be made of a metal such as aluminum (Al), tantalum (Ta), tantalum nitride (TaN), titanium (Ti), titanium nitride (TiN), molybdenum (Mo) or tungsten (W) and silicon including an impurity. When a material having high resistance, the forming step preferably include patterning taking the load resistance into consideration.

FIG. 18B shows a structure which is the same as that shown in FIG. 18A except the size of the back gate electrode 1702. When the back gate electrode 1702 is larger than a gate electrode 1707 as shown in FIG. 18B, load capacitance is formed by the back gate electrode 1702, an underlying oxide film 1703 and active layer polysilicon 1704 to reduce the speed of response. The structure shown in FIG. 18B is therefore desirable where high speed response is required. The glass substrate 1701 depends on the maximum temperature of the process. Quartz glass may be used for a high temperature process, and an inexpensive glass substrate other than quartz may be used for a low temperature process.

After forming a silicon oxide film 1703 as an underlying film, an a-Si film 1704 is formed. At this time, the step preferably continuously forms the films without releasing the vacuum in order to reduce contamination of the underlying film 1703. The a-Si film 1704 thus formed is crystallized through a heating process and a laser process into polysilicon. Island-shaped regions of polysilicon are formed using photolithography.

The surface of the active layer is treated with a rare hydrofluoric acid to remove any native oxide film thereon and, thereafter, a gate oxide film (silicon oxide film) 1706 is formed. The gate oxide film 1706 may be formed using any of techniques such as LPCVD, APCVD and plasma CVD. A gate electrode film is then formed and is subjected to anodization, photolithography and etching to be formed into a gate electrode 1707. Next, the entire surface is doped with an n-type impurity (phosphorus (P), arsenic (As) or the like) to form n-type source and drain regions. No impurity enters the region directly under the gate electrode which is doped after the formation of the gate electrode.

To fabricate a p-channel thin film transistor, the region of the n-channel thin film transistor is blocked with a resist mask which is patterned to form an opening at the region for the p-channel thin film transistor, and doping is conducted with a p-type impurity (boron (B) or the like) to invert the polarity of a channel contact region. While doping with an n-type impurity is followed by doping with a p-type impurity in this case, this order may be reversed. However, the concentration of the impurity implanted later must be higher to cause the polarity inversion. Specifically, a p-type impurity must have a concentration several times higher than an n-type impurity with which the entire surface is doped, and an n-type impurity must have a concentration several times higher than a p-type impurity with which the entire surface is doped. Thus, impurity-implanted regions 1705 are formed.

The implanted impurity is activated through a heating process or laser process. At the same time, damage on the active layer 1704 caused at the implanting step is recovered. Next, first layer insulation films 1708 are formed, and contact holes are provided. A contact hole for the connection of the bottom gate is also formed simultaneously. The first layer insulation films 1708 may be formed using any technique. Further, they may be combined with a nitride film into a two-layer structure in consideration to the step coverage of a wiring metal film to be formed later. In addition, organic resin films may be used as the first layer insulation films 1708.

Next, a wiring metal film is formed and is subjected to photolithography and etching to form wiring electrodes (source-drain electrodes) 1709. A hydrogenating process is finally performed in a hydrogen atmosphere to adjust the characteristics of the thin film transistors. This hydrogenating process terminates any dangling bond in the active layer silicon films with hydrogen to improve the characteristics of the thin film transistors. It also performs sintering to provide ohmic contact between the wiring metal and silicon films. The hydrogenation may be performed after activation. Thus, thin film transistors having a bottom gate electrode for controlling the threshold is fabricated. No step is needed to be added to the above steps as long as CMOS is intended, and elements can be formed in the same steps as those in the prior art.

A second layer insulation film 1710 constituted by an organic resin film is then formed to a thickness in the range from 0.5 to 3 μm. Polyimide, acrylic, polyimideamide or the like may be used as the organic resin film.

The second layer insulation film 1710 may be constituted by a black matrix having light-blocking properties. A titanium film or resin including a black pigment or the like may be used as the black matrix.

A contact hole is then formed in the second layer insulation film 1710 to form a pixel electrode 1711 with a thickness of 120 nm. In the case of a transmission type active matrix liquid crystal display, in general, an ITO film is used as a transparent conductive film.

While the substrate as a whole is subjected to a hydrogenating process in a hydrogen atmosphere at this point, the hydrogenating process described above to follow activation may be combined with this process in order to reduce the number of steps.

Then, a polyimide alignment film 1712 is formed (polyimide having a relatively small pretilt angle is used in this embodiment); a rubbing process is performed; and a counter substrate 1716 is put together with a sealing material and a spacer interposed at a well-known cell assembly step. Thereafter, liquid crystal 1713 is injected between both substrates and is completely sealed with a sealing agent to complete an active matrix liquid crystal display having driving circuits as shown in FIG. 17. While nematic liquid crystal is injected in this embodiment, there is no limitation on the type of liquid crystal. The display mode is not limited to the TN mode, and other display modes may be used. 1714 represents an alignment film; 1715 represents a counter electrode; and 1716 represents a counter substrate.

A seventh embodiment of the invention will now be described.

Figure 20:
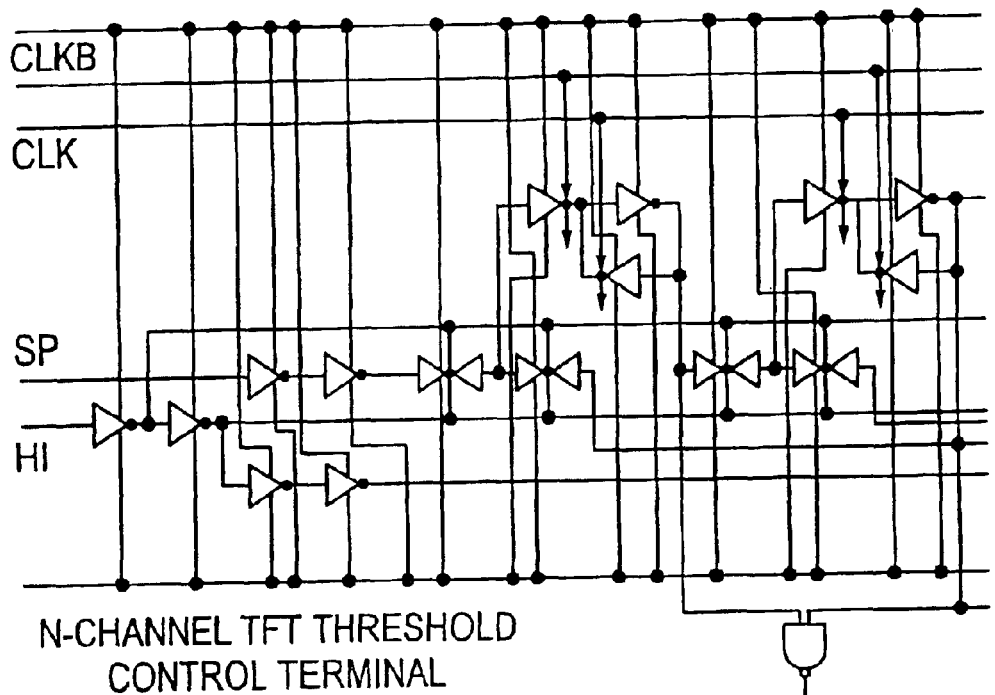
FIG. 20 shows a second embodiment of the invention which is a scan line driving circuit (gate driver) constituted by an inverter and a NAND circuit.

FIG. 19 shows a signal line driving circuit (source driver) constituted by an inverter and a NAND circuit. A threshold control terminal is connected to an inverter and an analog switch to apply a back gate voltage to change the threshold. FIG. 20 shows an example of a scan line driving circuit (gate driver) similarly to FIG. 19. In either of them, a threshold control terminal is connected to all of an inverter, an analog switch and a clocked inverter. Although not shown in FIGS. 19 and 20, a threshold control terminal may be connected to a NAND circuit, an inverter, an analog switch and clocked inverter connected to an active matrix circuit, a threshold control terminal may be connected to any logic circuit (electronic circuit) other than those shown in FIGS. 19 and 20.

An eighth embodiment of the invention will now be described.

Figure 21:
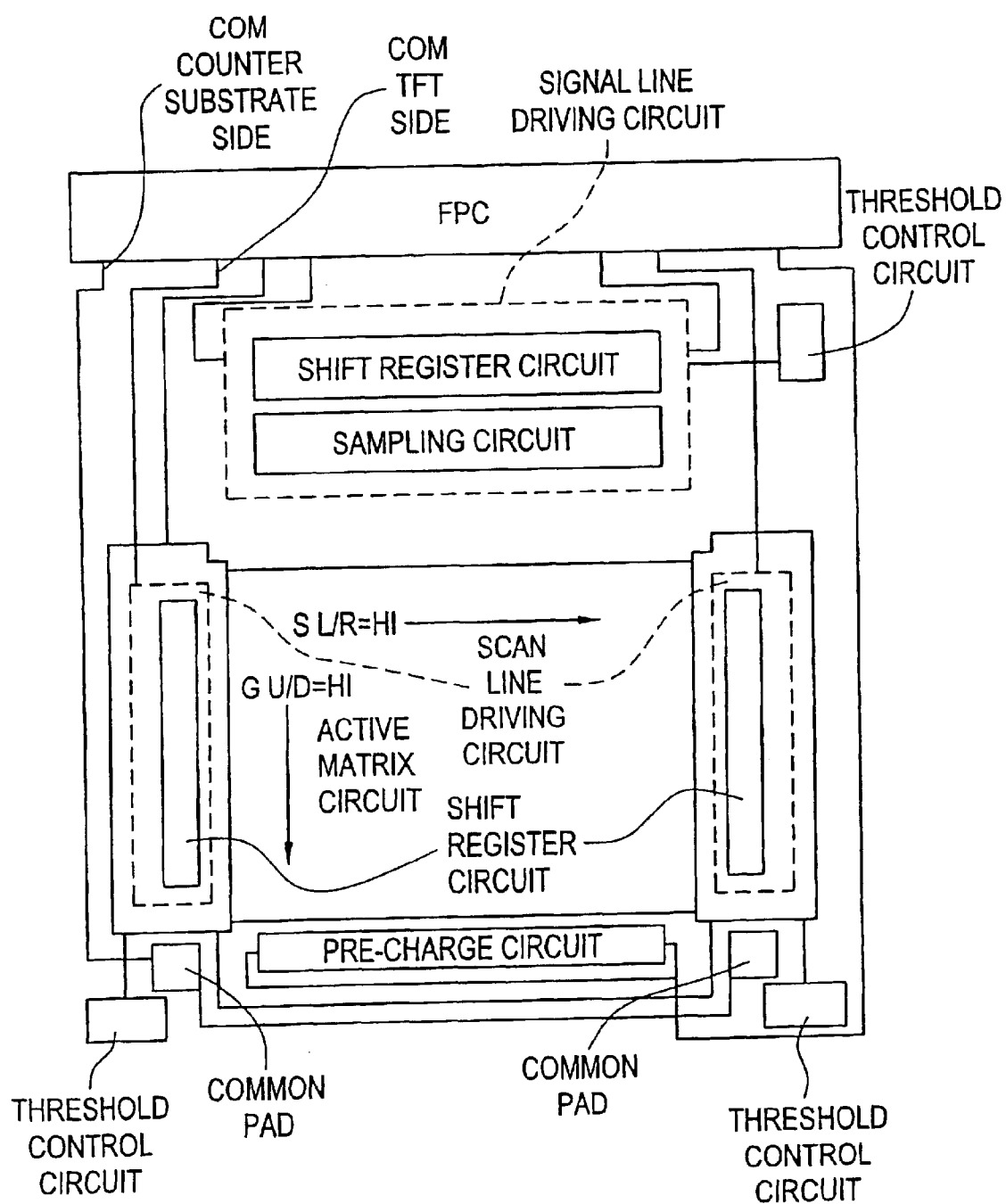
FIG. 21 shows a third embodiment of the invention which is an example of a display module of an active matrix liquid crystal display using a gate driver and a source driver.
Figure 22:
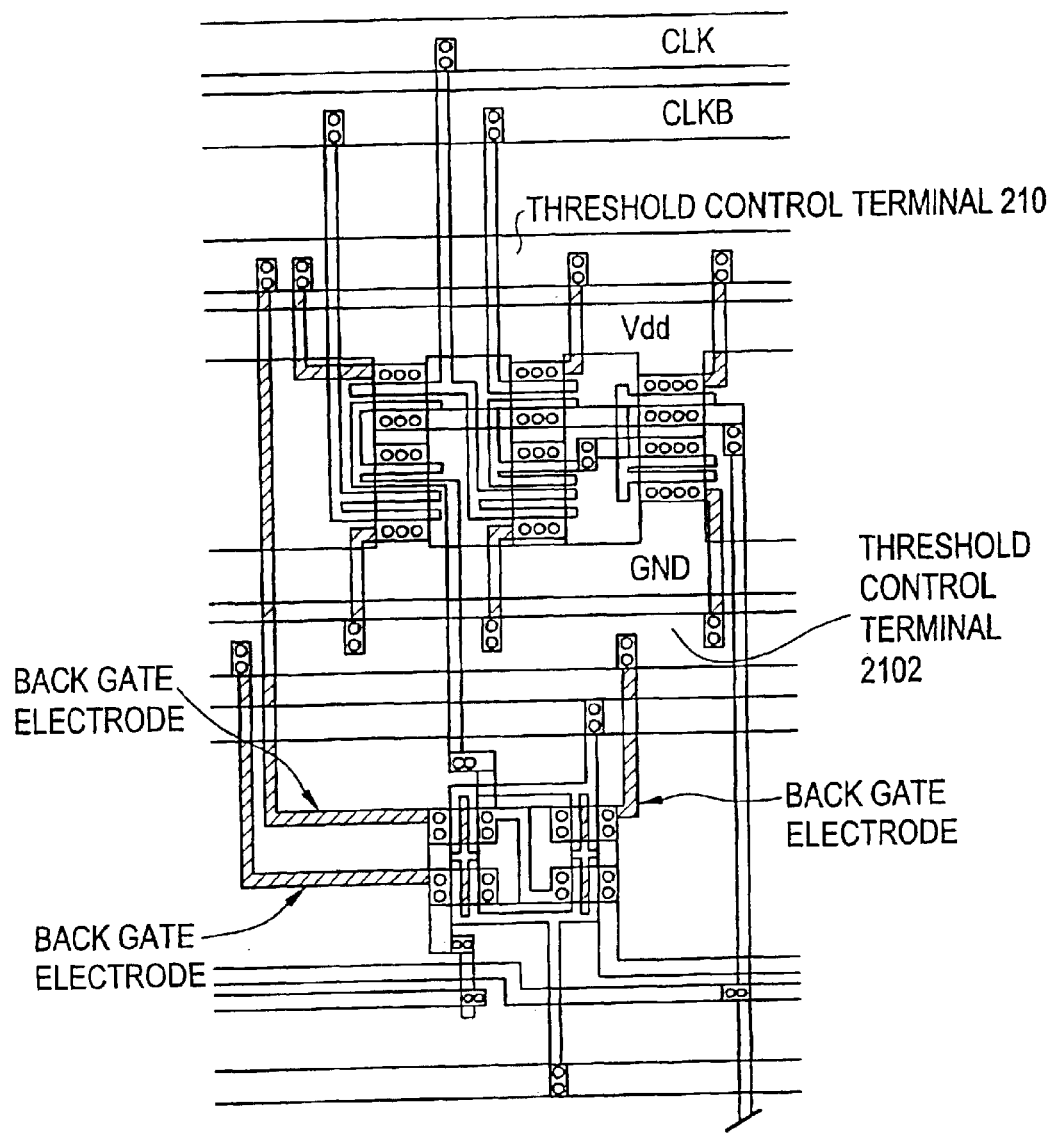
FIG. 22 is a plan view of the example of a display module of an active matrix liquid crystal display using a gate driver and a source driver according to the third embodiment.

FIG. 21 shows a display module actually configured using drivers as described in the seventh embodiment which is an advanced version of the configuration shown in FIG. 7. A threshold control circuit in FIG. 21 controls a signal line driving circuit formed by a plurality of first thin film transistors and a scan line driving circuit formed by a plurality of second thin film transistors independently. FIG. 22 shows a specific plan view of the circuit. In FIG. 22, the plurality of thin film transistors forming the driving circuits are all connected to a power supply line ($V_{DD}$) and a ground line (GND), and any desired back gate voltage can be applied to threshold control terminals formed as back gate electrodes.

A ninth embodiment of the invention will now be described.

Figure 23A:
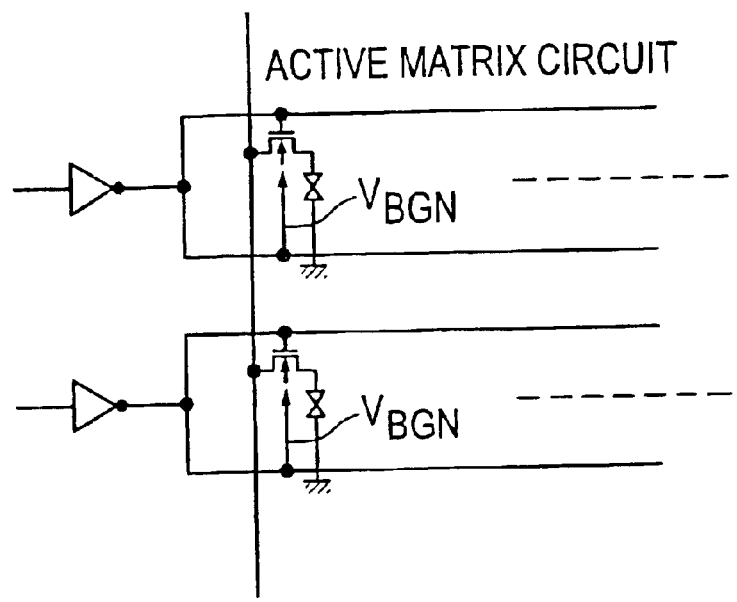
FIGS. 23A and 23B show a fourth embodiment of the invention which is an application of the invention to a thin film transistor of a pixel switch.
Figure 23B:
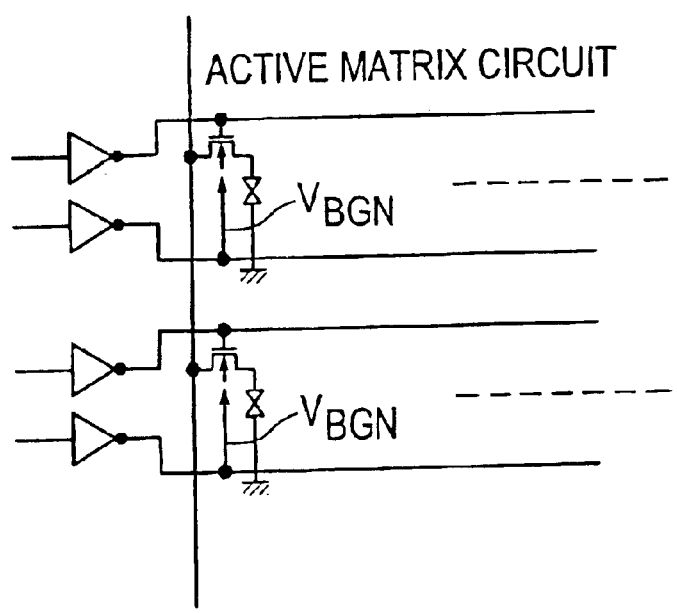

FIGS. 23A and 23B shows applications of the invention to thin film transistors formed as pixel switches. In FIG. 23A, signals having the same polarity are applied to thin film transistors formed as pixel switches. A positive voltage or negative voltage can be respectively applied to both of the gate voltage and back gate voltage of an n-channel thin film transistor or a p-channel thin film transistor to induce at both of the gate electrode and back gate electrode, thereby extracting a high current. This makes it possible to reduce the size of a TFT. As shown in FIG. 23B, separate signals having the same polarity may be input to the gate electrode and back gate electrode to extract an arbitrary current, to design a TFT in accordance therewith.

A tenth embodiment of the invention will now be described.

Figure 24A:
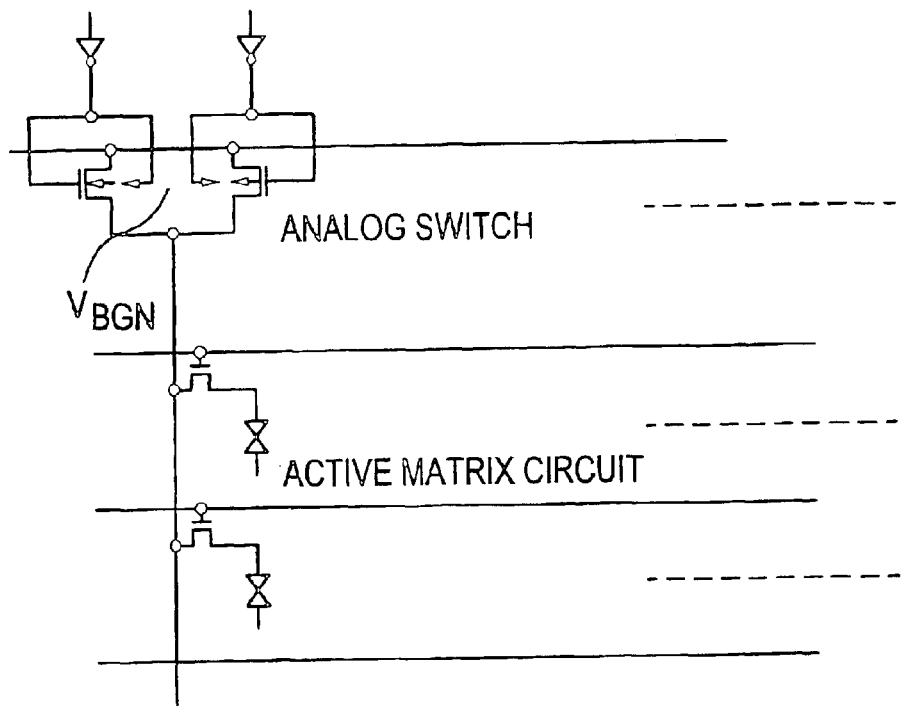
FIGS. 24A and 24B show a fifth embodiment of the invention which is an application of the invention to a thin film transistor for driving a pixel switch.
Figure 24B:
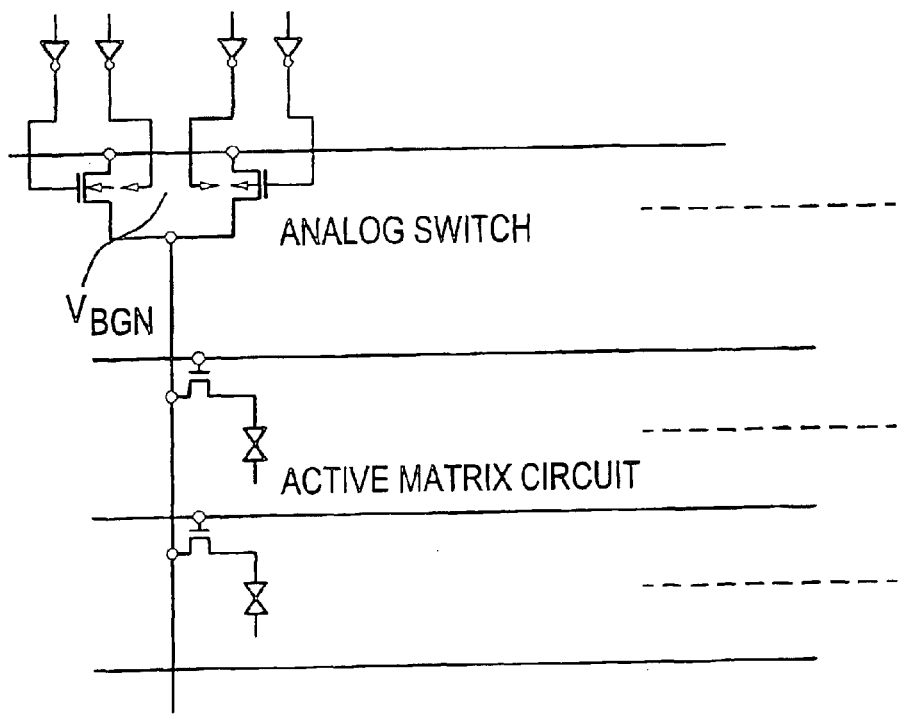

FIGS. 24A and 24B show applications of the invention to thin film transistors formed at an analog switch for operating a pixel switch. In FIG. 24A, signals having the same polarity are applied to the thin film transistors similarly to the ninth embodiment. In FIG. 24B, the signals applied in FIG. 24A are input separately, but the principle and effect are the same as those of the eighth embodiment.

The principle and effect described in the eighth and ninth embodiments are not limited to those embodiments, and they equally apply to thin film transistors in any regions other than those described above.

An eleventh embodiment of the invention will now be described.

Figure 25:
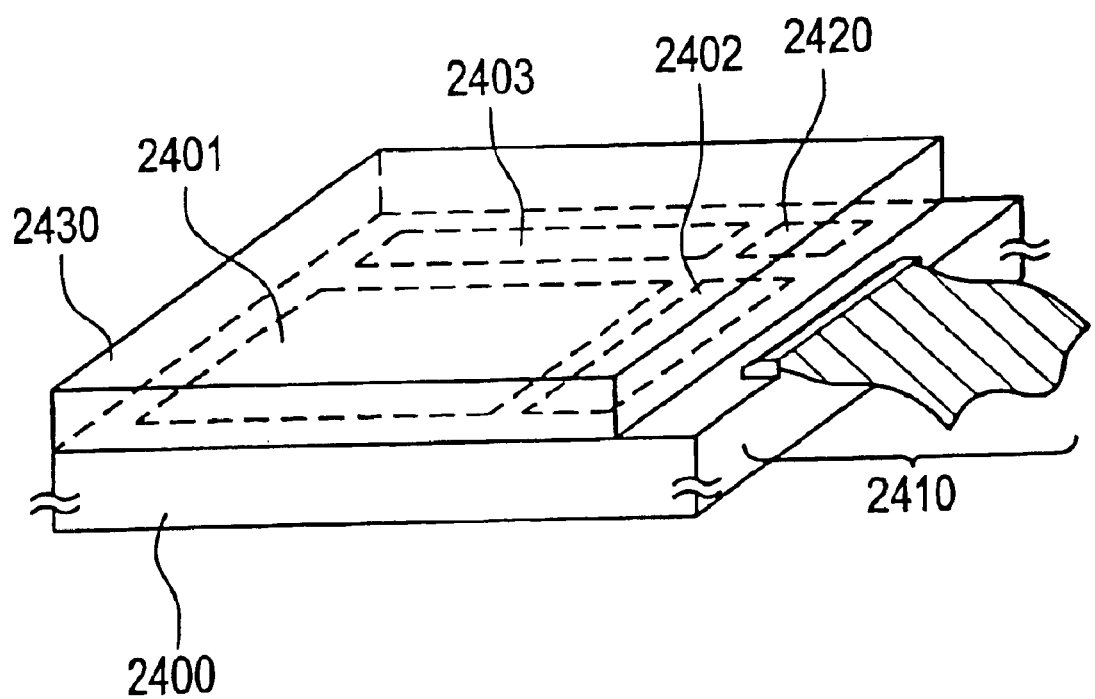
FIG. 25 shows a sixth embodiment of the invention which is a liquid crystal display fabricated according to the invention.

The present embodiment describes an example of a liquid crystal display fabricated according to the invention with reference to FIG. 25. The method for fabricating the pixel thin film transistors (pixel switching elements) and the cell assembly step will not be described here in detail because any well-known technique may be employed.

In FIG. 25, 2400 represents a substrate having an insulated surface (a plastic substrate having a silicon oxide film provided thereon); 2401 represents a pixel matrix circuit; 2402 represents a scan line driving circuit; 2403 represents a signal line driving circuit; 2430 represents a counter substrate; 2410 represents an FPC (flexible printed circuit); and 2420 represents a logic circuit. The logic circuit 2420 may be formed as a circuit to perform processes in a D-A converter, a γ correction circuit, a signal division circuit and the like which have conventionally been substituted with ICs. Obviously, an IC chip may be provided on the substrate to perform signal processing on the IC chip.

Further, although a liquid crystal display is described as an example in this embodiment, the invention may obviously applied to any other active matrix type display such as an EL (electroluminescence) display or EC (electrochromic) display.

The present invention may be used to fabricate any liquid crystal display whether it is a transmission type or reflection type. Either of them may be freely selected by the person who carries out the invention. Thus, this invention may be applied to any active matrix type electro-optical device (semiconductor device).

A twelfth embodiment of the invention will now be described.

While a threshold voltage is controlled by applying an arbitrary voltage to a back gate electrode in the sixth through eleventh embodiments, a logic signal for controlling a circuit may be applied to a back gate electrode.

A thirteenth embodiment of the invention will now be described.

While the TN mode utilizing nematic liquid crystal is used as the display mode of the semiconductor displays of the above-described embodiments, other display modes may be used.

Furthermore, an active matrix liquid crystal display may be configured using thresholdless antiferroelectric liquid crystals or ferroelectric liquid crystals having a high response speed.

For example, it is possible to use the liquid crystals disclosed "Characteristics and Driving Scheme of Polymer-Stabilized Monostable FLCD Exhibiting Fast Response Time and High Contrast Ratio with Gray-Scale Capability" by H. Furue et al., SID, 1998, "A Full-Color Thresholdless Antiferroelectric LCD Exhibiting Wide Viewing Angle with Fast Response Time" by T. Yoshida et al., SID DIGEST, p. 841, 1997, "Thresholdless antiferroelectricity in liquid crystals and its application to displays" by S. Inui et al., J. Mater. Chem. 6(4), pp. 671-673, 1996 and U.S. Pat. No. 5,594,569.

Liquid crystal that exhibits an antiferroelectric phase in a certain temperature range is referred to as "antiferroelectric liquid crystal". Mixed liquid crystals containing antiferroelectric liquid crystals include crystals referred to as "thresholdless antiferroelectric mixed liquid crystals" exhibiting electro-optical response characteristics such that the transmittance continuously changes relative to an electric field. Some of such thresholdless antiferroelectric mixed liquid crystals exhibit V-shaped electro-optical response characteristics, and it has been found that some of them are driven at a voltage on the order of ±2.5 V (cell thickness: about 1 to 2 μm).

FIG. 30 shows an example of the characteristics of the optical transmittance of thresholdless antiferroelectric mixed liquid crystals exhibiting V-shaped electro-optical response relative to an applied voltage. The vertical axis of the graph shown in FIG. 30 represents the transmittance (in an arbitrary unit), and the horizontal axis represents the applied voltage. The transmission axis of a polarizing sheet at the entrance side of an active matrix liquid crystal display is set substantially parallel with the normal direction of a smectic layer of the thresholdless antiferroelectric mixed liquid crystal that substantially coincides with the rubbing direction of the active matrix liquid crystal display. The transmission axis of a polarizing sheet at the exit side is set substantially perpendicular (crossed Nicols) to the transmission axis of the polarizing sheet at the entrance side.

As shown in FIG. 30, the use of such thresholdless antiferroelectric mixed liquid crystals allows driving at a low voltage and multi-tone display.

The use of such thresholdless antiferroelectric mixed liquid crystals driven at a low voltage in an active matrix liquid crystal display having analog drivers makes it possible to suppress the power supply voltage of an image signal sampling circuit to a value, for example, in the range from 5 to 8 V. This makes it possible to decrease the operating power supply voltage of drivers, thereby allowing reduction of power consumption of the active matrix liquid crystal display and improvement of the reliability of the same.

The use of such thresholdless antiferroelectric mixed liquid crystals driven at a low voltage in an active matrix liquid crystal display having digital drivers also makes it possible to decrease the output voltage of the D-A conversion circuit. It is therefore possible to decrease the operating power supply voltage of the D-A conversion circuit, thereby reducing the operating power supply voltage of the drivers. This makes it possible to reduce the power consumption of the active matrix liquid crystal display and to improve the reliability of the same.

Therefore, the use of such thresholdless antiferroelectric mixed liquid crystals driven at a low voltage is effective when TFTs with an LDD region (low concentration impurity region) having a relatively small width (for example, in the range from 0 to 500 nm or from 0 to 200 nm) is used.

In general, thresholdless antiferroelectric mixed liquid crystals are subjected to significant spontaneous polarization and therefore have a high dielectric constant. Therefore, the use of thresholdless antiferroelectric mixed liquid crystals in an active matrix liquid crystal display requires a relatively capacitance to be retained at the pixels. It is therefore preferable to use thresholdless antiferroelectric mixed liquid crystals having less significant spontaneous polarization.

Since the use of such thresholdless antiferroelectric mixed liquid crystals allows driving at a low voltage, the power consumption of an active matrix liquid crystal display can be reduced.

Any liquid crystal having electro-optical characteristics as shown in FIG. 30 may be used as the display medium of an active matrix liquid crystal display according to the invention.

A semiconductor display according to the invention may employ any other display medium whose optical characteristics can be modulated in response to a voltage applied thereto. For example, an electroluminescence element may be used.

A fourteenth embodiment of the invention will now be described.

The present invention may be applied to IC techniques in general. That is, it may be applied to all semiconductor circuits presently available on the market. For example, it may be applied to microprocessors such as RISC processors and ASIC processors integrated on one chip. Alternatively, it may be applied to signal processing circuits represented by liquid crystal driver circuits (D-A converters, γ-correction circuits, signal division circuits and the like) and to high frequency circuits for portable apparatuses (portable telephones, PHS, mobile computers).

Semiconductor circuits such as microprocessors are loaded on various electronic apparatuses to function as a central circuit. Typical electronic apparatuses include personal computers, personal digital assistants and all other home electronics. Further, computers for controlling vehicles (automobiles, trains and the like) may be included. The present invention may be applied to such semiconductor devices.

A fifteenth embodiment of the invention will now be described.

The semiconductor devices and semiconductor displays of the above-described embodiments have a variety of applications. The present embodiment addresses semiconductor apparatus incorporating semiconductor devices and semiconductor displays according to the invention.

Such semiconductor apparatuses include video cameras, still cameras, projectors, head mount displays, car navigation systems, personal computers and personal digital assistants (mobile computers, portable telephones and the like). FIGS. 31A through 31F, FIGS. 32A through 32E and FIG. 33 show examples of such apparatuses.

FIG. 31A shows a portable telephone comprising a main body 1101, an audio output portion 1102, an audio input portion 1103, a semiconductor display 1104, operation switches 1105 and an antenna 1106.

FIG. 31B shows a video camera comprising a main body 1107, a semiconductor display 1108, an audio input portion 1109, operation switches 1110, a battery 1111 and an image-receiving portion 1112.

FIG. 31C shows a mobile computer comprising a main body 1113, a camera portion 1114, an image-receiving portion 1115, operation switches 1116 and a semiconductor display 1117.

FIG. 31D shows a head mount display comprising a main body 1118, a semiconductor display 1119 and a band portion 1120.

FIG. 31E shows a rear projector in which 1121 represents a main body; 1122 represents a light source; 1123 represents a semiconductor display; 1124 represents a polarizing beam splitter; 1125 and 1126 represent reflectors; and 1127 represents a screen. It is preferable that the angle of the screen of the rear projector can be changed with the main body fixed depending on the viewing position of the viewer. The use of three semiconductor devices 1123 (associated with beams in red, green and blue, respectively) will provide a rear projector with higher resolution and fineness.

FIG. 31F shows a front projector comprising a main body 1128, a light source 1129, a semiconductor device 1130, an optical system 1131 and a screen 1132. The use of three semiconductor devices 1130 (associated with beams in red, green and blue, respectively) will provide a front projector with higher resolution and fineness.

Figure 32A:
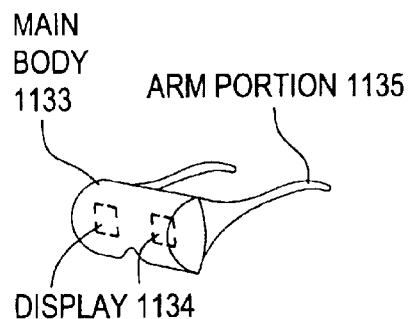
FIGS. 32A through 32E show a seventh embodiment of the invention which is examples of the application of the invention to the displays of various electronic apparatuses.

FIG. 32A shows a goggle display comprising a main body 1133, a display 1134 and arm portions 1135. The present invention may be applied to a display 2532 and other signal control circuits.

Figure 32B:
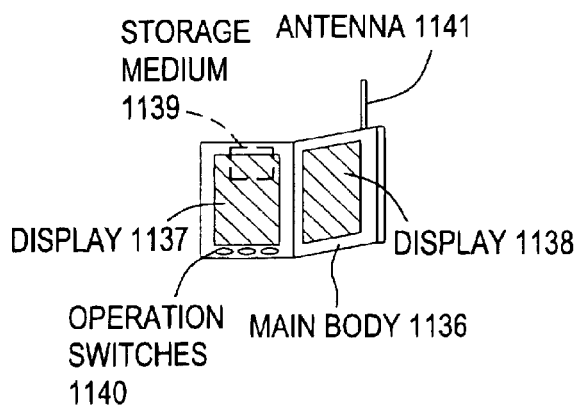

FIG. 32B shows a portable book (electronic book) comprising a main body 1136, displays 1137 and 1138, a storage medium 1139, operation switches 1140 and an antenna 1141. The present invention may be applied to the displays 1137 and 1138 and other signal control circuits.

Figure 32C:
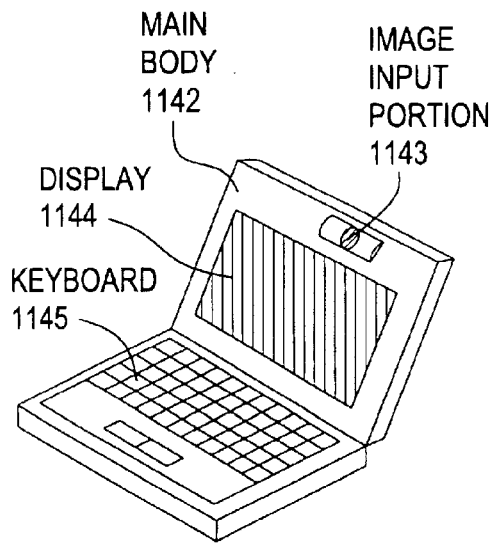

FIG. 32C shows a personal computer comprising a main body 1142, an image input portion 1143, a display 1144 and a keyboard 1145. The present invention may be applied to the image input portion 1143, display 1144 and other signal control circuits.

Figure 32D:
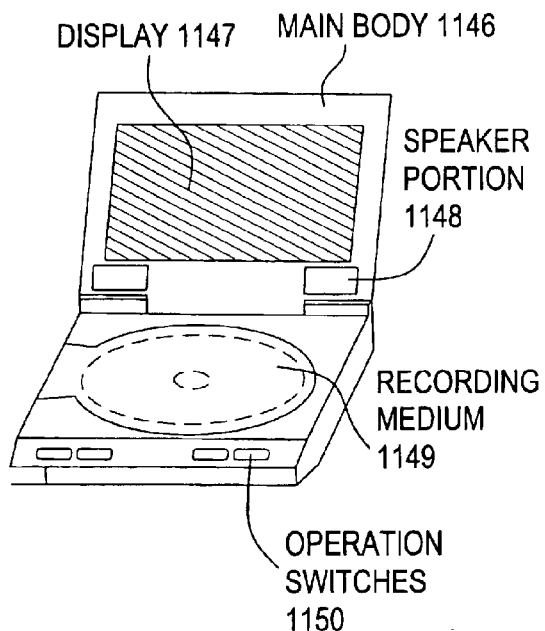

FIG. 32D shows a player utilizing a recording medium in which programs are stored (hereinafter referred to as "recording medium") which comprises a main body 1146, a display 1147, a speaker portion 1148, a recording medium 1149 and operation switches 1150. This apparatus utilizes DVDs (digital versatile discs), CDs and the like as recording media and allows a user to enjoy music, movies, games and internet. The present invention may be applied to the display 1147 and other signal control circuits.

Figure 32E:
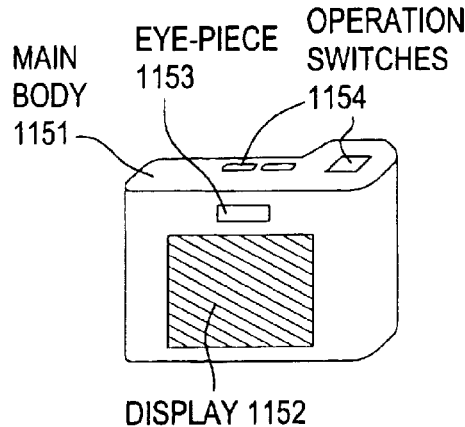
Figure 33:
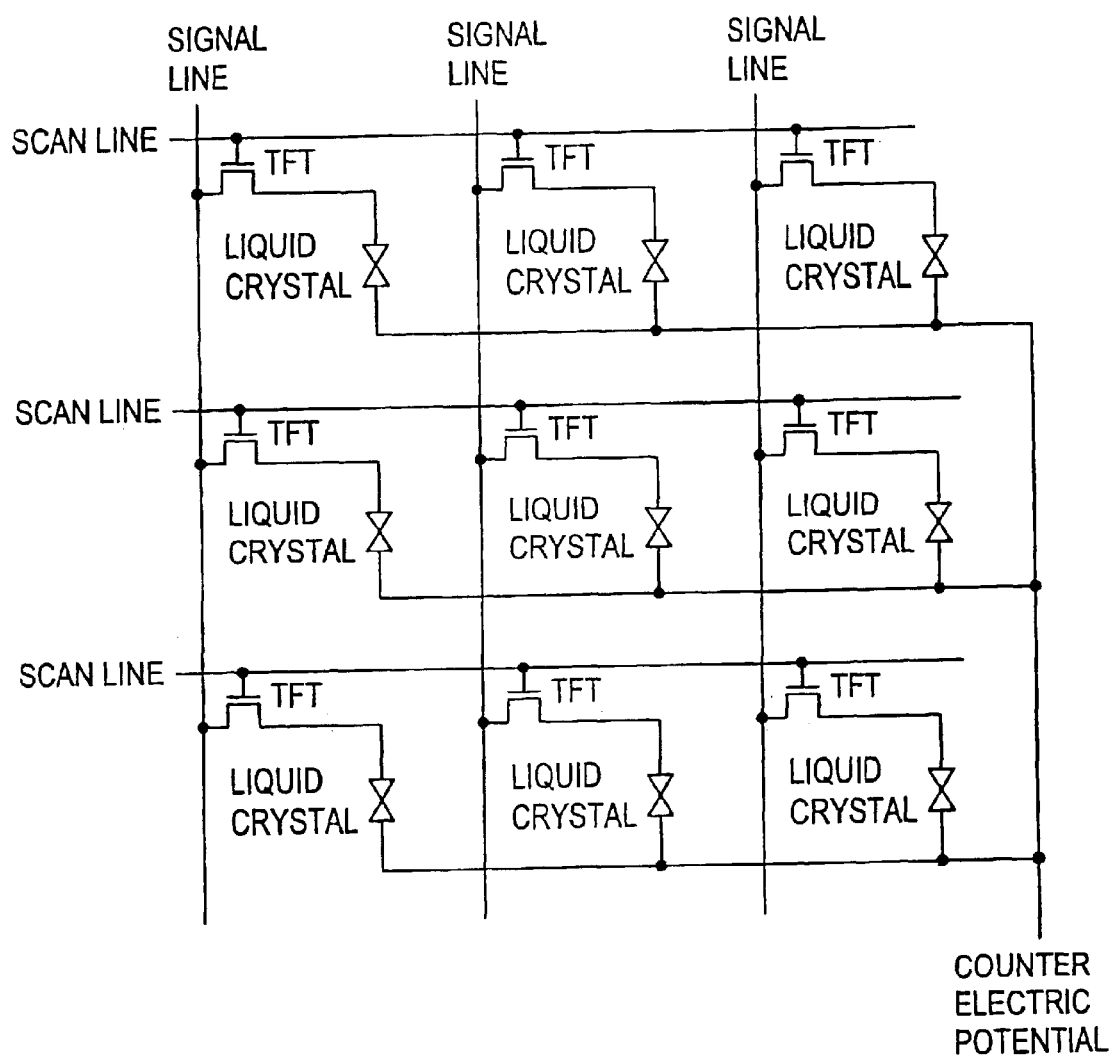
FIG. 33 shows an example of a conventional active matrix liquid crystal display.
Figure 34A:
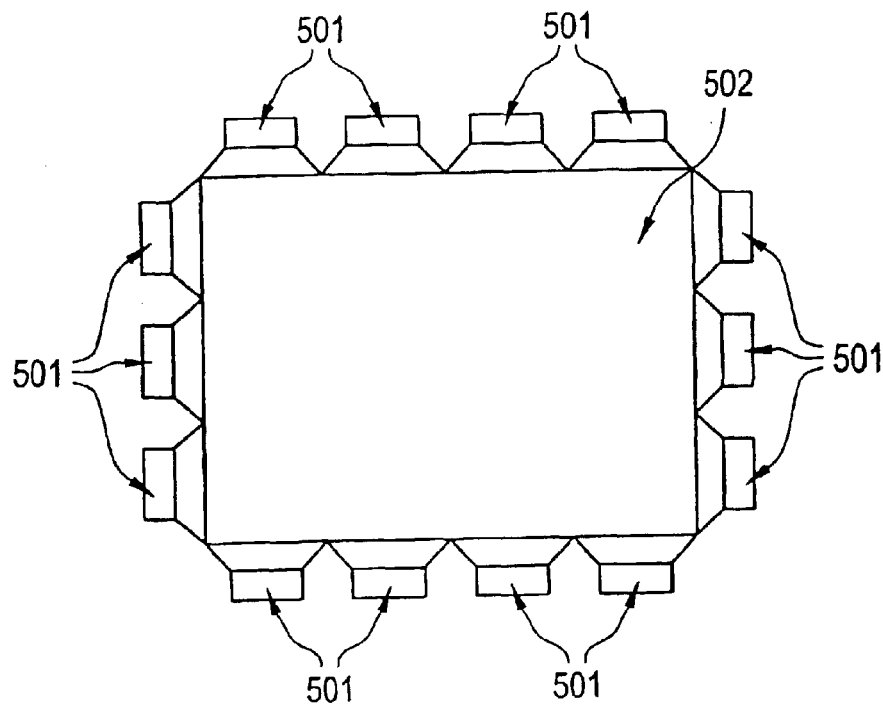
FIGS. 34A and 34B show examples of conventional active matrix liquid crystal displays.
Figure 34B:
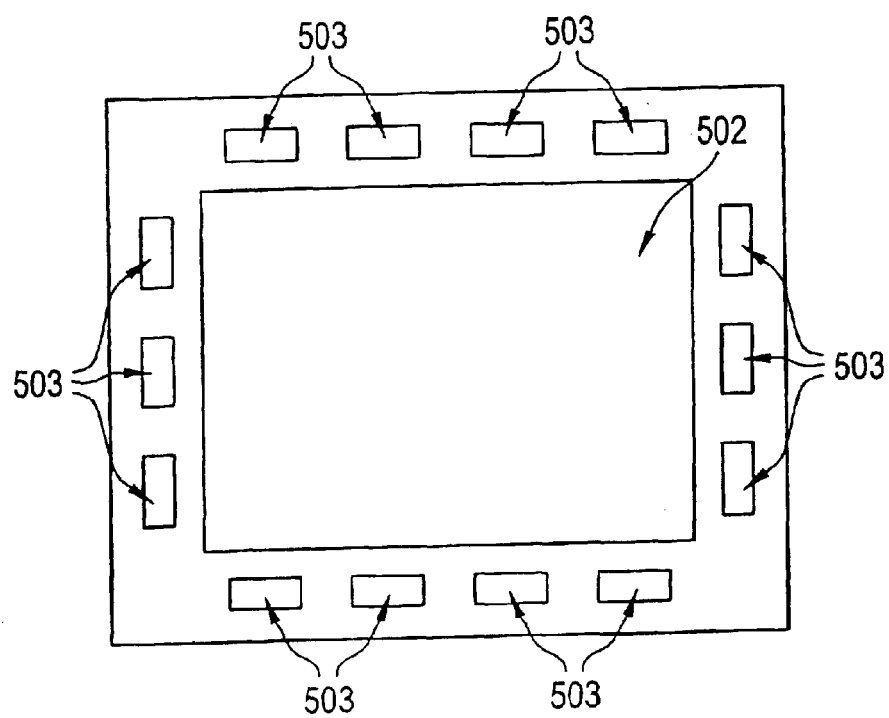
Figure 35A:
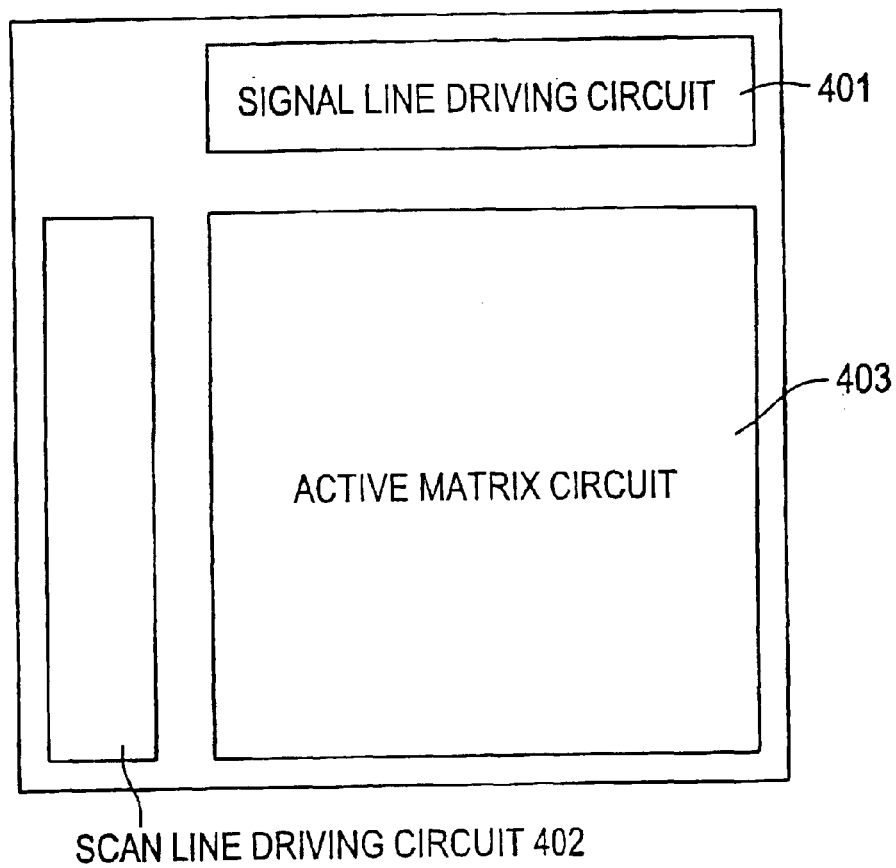
FIGS. 35A and 35B show examples of conventional configurations of a active matrix display utilizing polysilicon thin film transistors and a shift register.
Figure 35B:
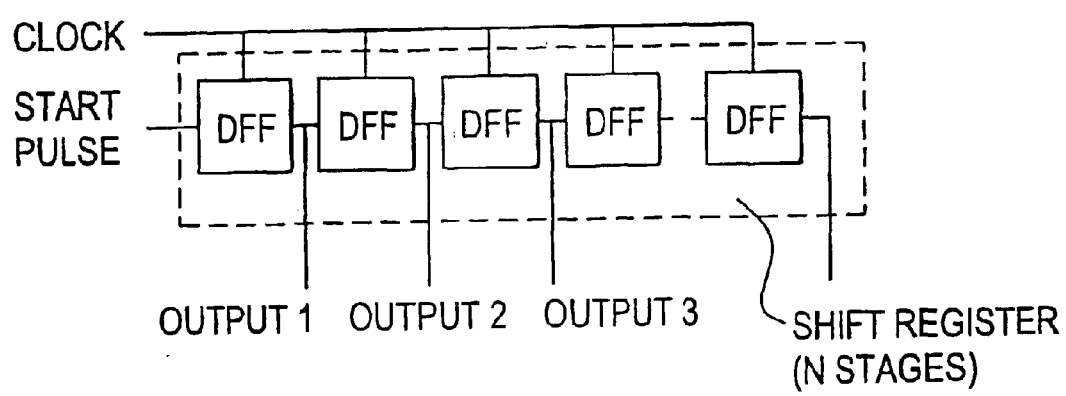
Figure 36A:
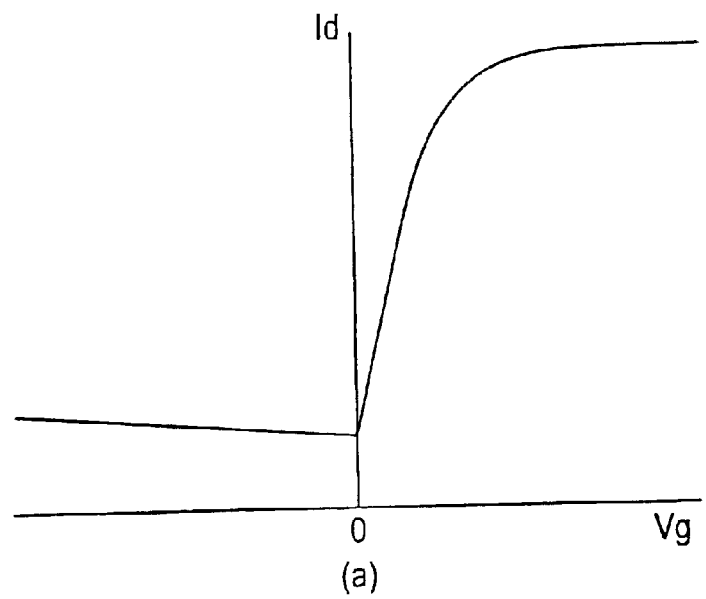
FIGS. 36A and 36B illustrate the gate voltage-drain current characteristics of an n-channel thin film transistor.
Figure 36B:
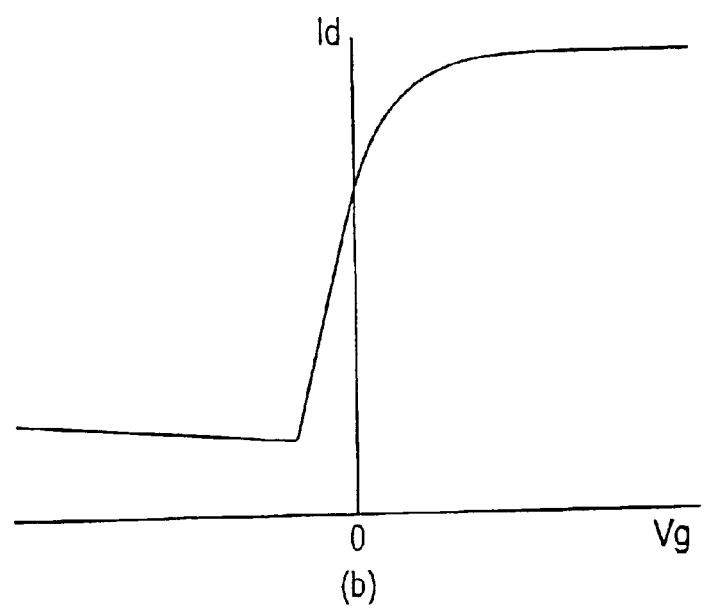
Figure 37:
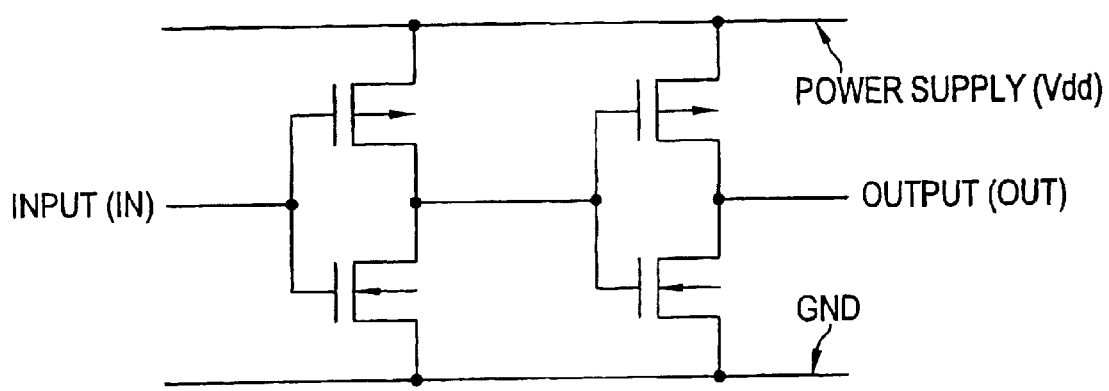
FIG. 37 shows an example of an inverter circuit.

FIG. 32E shows a digital camera comprising a main body 1151, a display 1152, an eye-piece 1153, operation switches 1154 and an image-receiving portion (not shown). The present invention may be applied to the display 1152 and other signal control circuits.

Figure 46A:
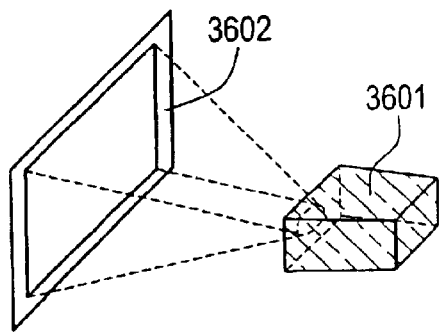
FIG. 46A shows a front type projector according to the present invention.

FIG. 46A shows a front type projector which is constituted by a light source optical system and a display device 3601, and a screen 3602. The present invention can be applied to the display device and other signal control circuits.

Figure 46B:
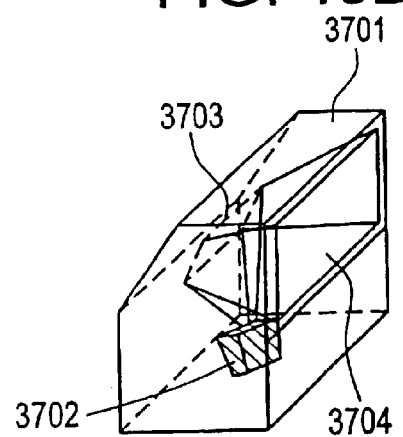
FIG. 46B shows a rear type projector according to the present invention.

FIG. 46B shows a rear type projector which is constituted by a main body 3701, a light source optical system and a display device 3702, a mirror 3703 and a screen 3704. The present invention can be applied to the display device and other signal control circuits.

Figure 46C:
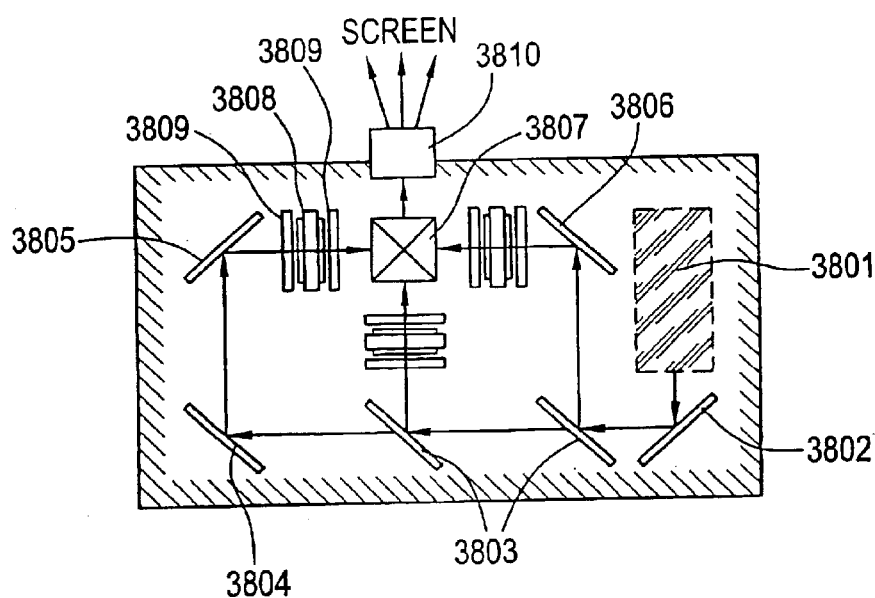
FIG. 46C shows an example structure of a light source optical system and a display device in FIG. 46A or in FIG. 46B.

FIG. 46C shows an example structure of a light source optical system and a display device 3601 in FIG. 46A, or 3702 in FIG. 46B. Each of numerals 3601 and 3702 includes a light source optical system 3801, mirrors 3802, 3804-3806, a dichroic mirror 3803, another optical system 3807, a display device 3808, a phase difference plate 3809, and a projection optical system 3810. The projection optical system 3810 is constituted by a plurality of optical lenses equipped with a projection lens. Such a projection system as shown in FIG. 46C is called a three-plate type since this structure includes three plates of display devices. Further, it is proper for a researcher to form, in an optical path indicated by an arrow in FIG. 46C, an optical lens, a film with a polarizing characteristics, a film to control a phase difference, an IR film, etc.

Figure 46D:
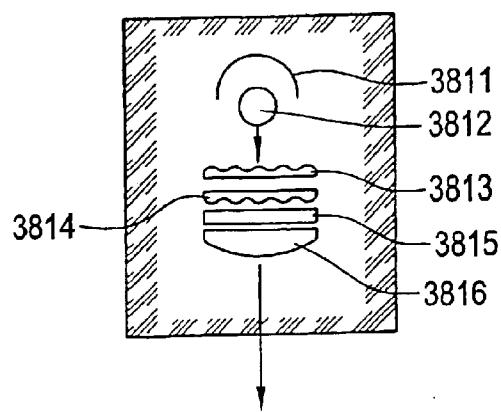
FIG. 46D shows an example structure of a light source optical system in FIG. 46C.

FIG. 46D shows an example structure of a light source optical system 3801 in FIG. 46C. In this embodiment, the light source optical system 3801 includes a reflector 3811, a light source 3812, lens arrays 3813 and 3814, a polarizing conversion element 3815 and a condenser lens 3816. However, the present invention is not specifically limited by this embodiment because it is just an example. For example, in an optical path, an optical lens, a film with a polarizing characteristics, a film to control a phase difference, an IR film, etc. can be properly formed.

Figure 47A:
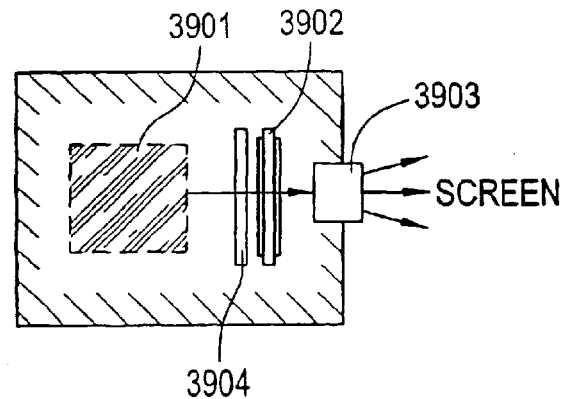
FIG. 47A shows a light source optical system and display device.

While FIG. 46C shows an example of the three-plate type, FIG. 47A shows an example of single-plate type. A light source optical system 3901, a display device 3902, a projection optical system 3903 are included in a light source optical system and a display device shown in FIG. 47A. It is possible to apply the light source optical system and display device shown in FIG. 47A to the light source optical system and display device 3601 shown in FIG. 46A, or 3702 in FIG. 46B. Further, the light source optical system 3901 can be applied by the light source optical system shown in FIG. 46D. In addition, the display device 3902 is equipped with a color filter (not shown), so that display image is colored.

Figure 47B:
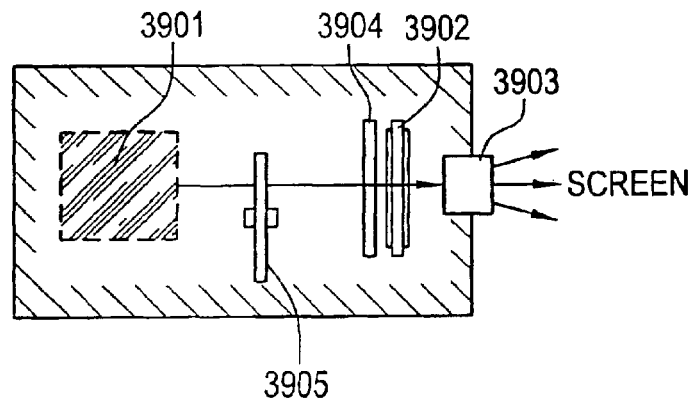
FIG. 47B shows a light source optical system and display device.

FIG. 47B shows an applied example of a light source optical system and a display device which is applied by FIG. 47A. Instead of forming a color filter, a display image is colored by RGB rotary color filter disc 3905. It is possible to apply the light source optical system and display device shown in FIG. 47B to the light source optical system and display device 3601 shown in FIG. 46A, or 3702 in FIG. 46B.

Figure 47C:
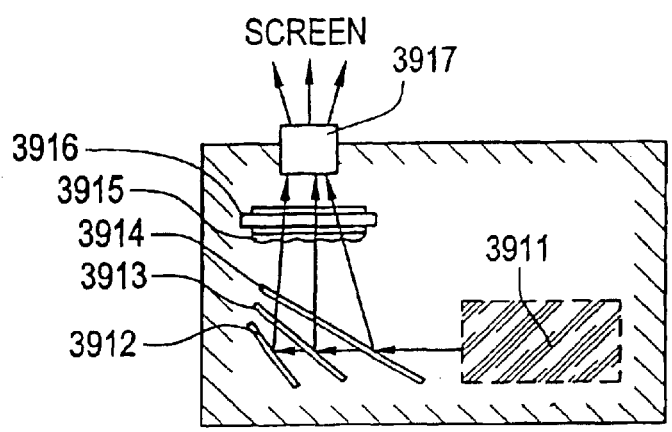
FIG. 47C shows a structure of a light source optical system and display device.

A structure of the light source optical system and display device, as shown in FIG. 47C is called as a color-filterless single-plate type. In this structure, a display device 3916 is equipped with a microlens array 3915, and a display image is colored by a dichroic mirror (Green) 3912, a dichroic mirror (Red) 3913 and a dichroic mirror (Blue). A projection optical system 3917 is constituted by a plurality of lenses including a projection lens. It is possible to apply the light source optical system and display device shown in FIG. 47C to the light source optical system and display device 3601 shown in FIG. 46A, or 3702 in FIG. 46B. Further, as the light source optical system 3911, an optical system having a coupling lens and a collimating lens other than a light source can be applied.

As described above, the present invention can be applied in a large range, so that it is possible to apply to any electric apparatus in every field. In addition, the electric apparatus in the instant invention can be realized by using any structure combined with Embodiments.

In a semiconductor device formed by TFTs having a back gate electrode according to the invention, the threshold voltages of the TFTs can be controlled to control the operation of the circuit.

In a semiconductor device formed by TFTs having a back gate electrode according to the invention, it is possible to control not only the threshold voltages of TFTs forming driver circuits and other peripheral circuits but also the threshold voltage of pixel TFTS. This makes it possible to provide images with improved quality.

According to this invention, power consumption can be reduced by controlling the threshold voltages of TFTs forming a circuit which is not in operation and by reducing the total drain current of the circuit which is not in operation.

In addition, the present invention makes it possible to extract a high current from a thin film transistor and to control the same arbitrarily. This allows the size of a TFT to be reduced.

What is claimed:

1. A semiconductor device comprising:
    a thin film transistor comprising:
        a semiconductor island having a first surface and a second surface opposed to the first surface;
        a first gate electrode adjacent to the first surface of the semiconductor island with a first gate insulating film interposed therebetween; and
        a second gate electrode adjacent to the second surface of the semiconductor island with a second gate insulating film interposed therebetween;
    a circuit connected to the second gate electrode, the circuit comprising a load, a amplifier, and a monitoring thin film transistor.

2. A semiconductor device according to claim 1, wherein the thin film transistor is an n-channel thin film transistor and a voltage higher than a ground potential is applied to the second gate electrode.

3. A semiconductor device according to claim 1, wherein the thin film transistor is an n-channel thin film transistor and a voltage lower than a ground potential is applied to the second gate electrode.

4. A semiconductor device according to claim 1, wherein the thin film transistor is an p-channel thin film transistor and a voltage higher than a ground potential is applied to the second gate electrode.

5. A semiconductor device according to claim 1, wherein the thin film transistor is an p-channel thin film transistor and a voltage lower than a ground potential is applied to the second gate electrode.

6. An electro apparatus comprising the semiconductor device according to claim 1, wherein the electro apparatus is selected from the group consisting of portable telephone, a video camera, a mobile computer, a head mount display, a rear projector, a front projector, a goggle display, a portable book, a persona computer a player, and a digital camera.

7. A semiconductor device comprising:
    a thin film transistor comprising:
        a semiconductor island having a first surface and a second surface opposed to the first surface;
        a first gate electrode adjacent to the first surface of the semiconductor island with a first gate insulating film interposed therebetween; and
        a second gate electrode adjacent to the second surface of the semiconductor island with a second gate insulating film interposed therebetween;
    a circuit connected to the second gate electrode, the circuit comprising a load, a amplifier, and a monitoring thin film transistor,
    wherein output of the amplifier is connected to the monitoring thin film transistor and the second gate electrode.

8. A semiconductor device according to claim 7, wherein the thin film transistor is an n-channel thin film transistor and a voltage higher than a ground potential is applied to the second gate electrode.

9. A semiconductor device according to claim 7, wherein the thin film transistor is an n-channel thin film transistor and a voltage lower than a ground potential is applied to the second gate electrode.

10. A semiconductor device according to claim 7, wherein the thin film transistor is an p-channel thin film transistor and a voltage higher than a ground potential is applied to the second gate electrode.

11. A semiconductor device according to claim 7, wherein the thin film transistor is an p-channel thin film transistor and a voltage lower than a ground potential is applied to the second gate electrode.

12. An electro apparatus comprising the semiconductor device according to claim 7, wherein the electro apparatus is selected from the group consisting of portable telephone, a video camera, a mobile computer, a head mount display, a rear projector, a front projector, a goggle display, a portable book, a persona computer a player, and a digital camera.

13. A active matrix display device comprising:
    an active matrix circuit formed over a substrate;
    a signal line driving circuit formed over the substrate;
    a scan line driving circuit formed over the substrate;

wherein each of the signal line driving circuit and the scan line driving circuit comprises a plurality of thin film transistor, each of the plurality of thin film transistors comprising:
- a semiconductor island having a first surface and a second surface opposed to the first surface;
- a first gate electrode adjacent to the first surface of the semiconductor island with a first gate insulating film interposed therebetween; and
- a second gate electrode adjacent to the second surface of the semiconductor island with a second gate insulating film interposed therebetween;
- a circuit connected to the second gate electrode, the circuit comprising a load, a amplifier, and a monitoring thin film transistor.

14. A semiconductor device according to claim 13, wherein the thin film transistor is an n-channel thin film transistor and a voltage higher than a ground potential is applied to the second gate electrode.

15. A semiconductor device according to claim 13, wherein the thin film transistor is an n-channel thin film transistor and a voltage lower than a ground potential is applied to the second gate electrode.

16. A semiconductor device according to claim 13, wherein the thin film transistor is an p-channel thin film transistor and a voltage higher than a ground potential is applied to the second gate electrode.

17. A semiconductor device according to claim 13, wherein the thin film transistor is an p-channel thin film transistor and a voltage lower than a ground potential is applied to the second gate electrode.

18. An electro apparatus comprising the active matrix display device according to claim 13, wherein the electro apparatus is selected from the group consisting of portable telephone, a video camera, a mobile computer, a head mount display, a rear projector, a front projector, a goggle display, a portable book, a persona computer a player, and a digital camera.

19. An active matrix display device comprising:
- an active matrix circuit formed over a substrate;
- a signal line driving circuit formed over the substrate;
- a scan line driving circuit formed over the substrate;
- wherein each of the signal line driving circuit and the scan line driving circuit comprises a plurality of thin film transistor, each of the plurality of thin film transistors comprising:
  - a first gate electrode formed over a substrate;
  - a semiconductor island adjacent to the first gate electrode with a first gate insulating film interposed therebetween; and
  - a second gate electrode adjacent to the semiconductor island with a second gate insulating film interposed therebetween;
- a circuit connected to the second gate electrode, the circuit comprising a load, a amplifier, and a monitoring thin film transistor,
- wherein output of the amplifier is connected to the monitoring thin film transistor and the second gate electrode.

20. A semiconductor device according to claim 19, wherein the thin film transistor is an n-channel thin film transistor and a voltage higher than a ground potential is applied to the second gate electrode.

21. A semiconductor device according to claim 19, wherein the thin film transistor is an n-channel thin film transistor and a voltage lower than a ground potential is applied to the second gate electrode.

22. A semiconductor device according to claim 19, wherein the thin film transistor is an p-channel thin film transistor and a voltage higher than a ground potential is applied to the second gate electrode.

23. A semiconductor device according to claim 19, wherein the thin film transistor is an p-channel thin film transistor and a voltage lower than a ground potential is applied to the second gate electrode.

24. An electro apparatus comprising the active matrix display device according to claim 19, wherein the electro apparatus is selected from the group consisting of portable telephone, a video camera, a mobile computer, a head mount display, a rear projector, a front projector, a goggle display, a portable book, a persona computer a player, and a digital camera.

25. An active matrix display device comprising:
- an active matrix circuit formed over a substrate;
- a signal line driving circuit formed over the substrate;
- a scan line driving circuit formed over the substrate;
- wherein each of the signal line driving circuit and the scan line driving circuit comprises a plurality of thin film transistor, each of the plurality of thin film transistors comprising:
  - a first gate electrode formed over a substrate;
  - a semiconductor island adjacent to the first gate electrode with a first gate insulating film interposed therebetween; and
  - a second gate electrode adjacent to the semiconductor island with a second gate insulating film interposed therebetween;
- a circuit connected to the second gate electrode, the circuit comprising a load, a amplifier, and a monitoring thin film transistor, wherein the circuit is formed over the substrate.

26. A semiconductor device according to claim 25, wherein the thin film transistor is an n-channel thin film transistor and a voltage higher than a ground potential is applied to the second gate electrode.

27. A semiconductor device according to claim 25, wherein the thin film transistor is an n-channel thin film transistor and a voltage lower than a ground potential is applied to the second gate electrode.

28. A semiconductor device according to claim 25, wherein the thin film transistor is an p-channel thin film transistor and a voltage higher than a ground potential is applied to the second gate electrode.

29. A semiconductor device according to claim 25, wherein the thin film transistor is an p-channel thin film transistor and a voltage lower than a ground potential is applied to the second gate electrode.

30. An electro apparatus comprising the active matrix display device according to claim 25, wherein the electro apparatus is selected from the group consisting of portable telephone, a video camera, a mobile computer, a head mount display, a rear projector, a front projector, a goggle display, a portable book, a persona computer a player, and a digital camera.

31. An inverter comprising:
- a first p-channel thin film transistor over a substrate:
- a second p-channel thin film transistor over the substrate;
- a first n-channel thin film transistor over the substrate;
- a second n-channel thin film transistor over the substrate,
- wherein each of the first and second p-channel thin film transistors and the first and second n-channel thin film transistors comprising:

a semiconductor island having a first surface and a second surface opposed to the first surface;

a first gate electrode adjacent to the first surface of the semiconductor island with a first gate insulating film interposed therebetween; and a second gate electrode adjacent to the second surface of the semiconductor island with a second gate insulating film interposed therebetween;

a circuit connected to the second gate electrode, the circuit comprising a load, a amplifier, and a monitoring thin film transistor.

32. A semiconductor device according to claim 31, wherein the thin film transistor is an n-channel thin film transistor and a voltage higher than a ground potential is applied to the second gate electrode.

33. A semiconductor device according to claim 31, wherein the thin film transistor is an n-channel thin film transistor and a voltage lower than a ground potential is applied to the second gate electrode.

34. A semiconductor device according to claim 31, wherein the thin film transistor is an p-channel thin film transistor and a voltage higher than a ground potential is applied to the second gate electrode.

35. A semiconductor device according to claim 31, wherein the thin film transistor is an p-channel thin film transistor and a voltage lower than a ground potential is applied to the second gate electrode.

36. An electro apparatus comprising the invertor according to claim 31, wherein the electro apparatus is selected from the group consisting of portable telephone, a video camera, a mobile computer, a head mount display, a rear projector, a front projector, a goggle display, a portable book, a persona computer a player, and a digital camera.

37. An inverter comprising:

a first p-channel thin film transistor over a substrate:

a second p-channel thin film transistor over the substrate;

a first n-channel thin film transistor over the substrate;

a second n-channel thin film transistor over the substrate, wherein each of the first and second p-channel thin film transistors and the first and second n-channel thin film transistors comprising:

a semiconductor island having a first surface and a second surface opposed to the first surface;

a first gate electrode adjacent to the first surface of the semiconductor island with a first gate insulating film interposed therebetween; and a second gate electrode adjacent to the second surface of the semiconductor island with a second gate insulating film interposed therebetween;

a circuit connected to the second gate electrode, the circuit comprising a load, a amplifier, and a monitoring thin film transistor, wherein output of the amplifier is connected to the monitoring thin film transistor and the second gate electrode.

38. A semiconductor device according to claim 37, wherein the thin film transistor is an n-channel thin film transistor and a voltage higher than a ground potential is applied to the second gate electrode.

39. A semiconductor device according to claim 37, wherein the thin film transistor is an n-channel thin film transistor and a voltage lower than a ground potential is applied to the second gate electrode.

40. A semiconductor device according to claim 37, wherein the thin film transistor is an p-channel thin film transistor and a voltage higher than a ground potential is applied to the second gate electrode.

41. A semiconductor device according to claim 37, wherein the thin film transistor is an p-channel thin film transistor and a voltage lower than a ground potential is applied to the second gate electrode.

42. An electro apparatus comprising the invertor according to claim 37, wherein the electro apparatus is selected from the group consisting of portable telephone, a video camera, a mobile computer, a head mount display, a rear projector, a front projector, a goggle display, a portable book, a persona computer a player, and a digital camera.

* * * * *